(12) United States Patent
Lu et al.

(10) Patent No.: US 12,167,607 B2
(45) Date of Patent: Dec. 10, 2024

(54) FERROELECTRIC MEMORY DEVICE AND METHOD OF FORMING THE SAME

(71) Applicant: Taiwan Semiconductor Manufacturing Company, Ltd., Hsinchu (TW)

(72) Inventors: Chun-Chieh Lu, Taipei (TW); Georgios Vellianitis, Heverlee (BE); Marcus Johannes Henricus Van Dal, Linden (BE); Sai-Hooi Yeong, Hsinchu County (TW); Yu-Ming Lin, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 182 days.

(21) Appl. No.: 17/874,314

(22) Filed: Jul. 27, 2022

(65) Prior Publication Data

US 2022/0367515 A1    Nov. 17, 2022

Related U.S. Application Data

(62) Division of application No. 17/113,106, filed on Dec. 7, 2020, now Pat. No. 11,647,635.

(60) Provisional application No. 63/031,579, filed on May 29, 2020.

(51) Int. Cl.
| | | |
|---|---|---|
| *H10B 51/20* | (2023.01) | |
| *H01L 21/28* | (2006.01) | |
| *H01L 29/51* | (2006.01) | |
| *H10B 51/30* | (2023.01) | |

(52) U.S. Cl.
CPC ........ *H10B 51/20* (2023.02); *H01L 29/40111* (2019.08); *H01L 29/516* (2013.01); *H10B 51/30* (2023.02)

(58) Field of Classification Search
CPC ........ H10B 51/10; H10B 51/20; H10B 51/30; H01L 29/40111; H01L 29/516; H01L 29/517; H01L 29/518
See application file for complete search history.

(56) References Cited

U.S. PATENT DOCUMENTS

| | | | | |
|---|---|---|---|---|
| 9,831,118 | B1 * | 11/2017 | Pang | H01L 23/5329 |
| 2017/0148517 | A1 * | 5/2017 | Harari | H10B 43/10 |
| 2018/0151588 | A1 * | 5/2018 | Tsutsumi | H01L 21/0228 |
| 2018/0350837 | A1 * | 12/2018 | Yoo | H01L 29/6684 |
| 2020/0365615 | A1 * | 11/2020 | Shin | H01L 29/40117 |

(Continued)

FOREIGN PATENT DOCUMENTS

EP    3499580 A1 *  6/2019

*Primary Examiner* — Matthew E Warren
(74) *Attorney, Agent, or Firm* — JCIPRNET

(57) ABSTRACT

A device includes a multi-layer stack, a channel layer, a ferroelectric layer and buffer layers. The multi-layer stack is disposed on a substrate and includes a plurality of conductive layers and a plurality of dielectric layers stacked alternately. The channel layer penetrates through the plurality of conductive layers and the plurality of dielectric layers. The ferroelectric layer is disposed between the channel layer and each of the plurality of conductive layers and the plurality of dielectric layers. The buffer layers include a metal oxide, and one of the buffer layers is disposed between the ferroelectric layer and each of the plurality of dielectric layers.

20 Claims, 51 Drawing Sheets

(56) References Cited

U.S. PATENT DOCUMENTS

2021/0358931 A1\* 11/2021 Makala ............. H01L 29/78391
2023/0354608 A1\* 11/2023 Nagahata ........... G11C 16/0483

\* cited by examiner

FERROELECTRIC MEMORY DEVICE AND METHOD OF FORMING THE SAME

CROSS-REFERENCE TO RELATED APPLICATION

This application is a divisional application of and claims the priority benefit of a prior application Ser. No. 17/113,106, filed on Dec. 7, 2020, which claims the priority benefit of U.S. provisional application Ser. No. 63/031,579, filed on May 29, 2020. The entirety of the above-mentioned patent application is hereby incorporated by reference herein and made a part of this specification.

BACKGROUND

Semiconductor devices are used in a variety of electronic applications, such as personal computers, cell phones, digital cameras, and other electronic equipment. Semiconductor devices are typically fabricated by sequentially depositing insulating or dielectric layers, conductive layers, and semiconductor layers over a semiconductor substrate, and patterning the various material layers using lithography and etching techniques to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area. However, as the minimum features sizes are reduced, additional problems arise that should be addressed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
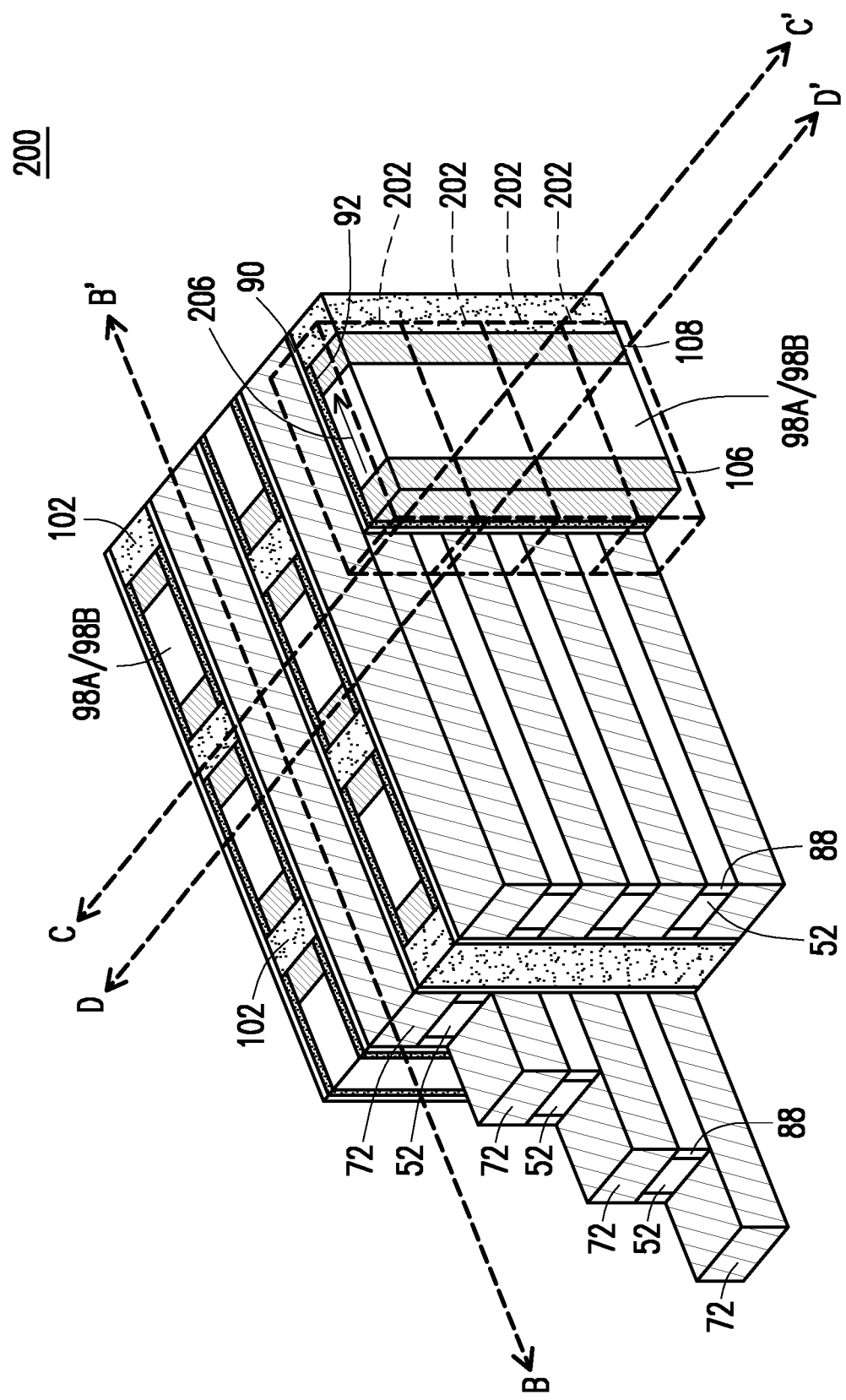
FIGS. 1A, 1B, and 1C illustrate a simplified perspective view, a circuit diagram, and a top down view of a ferroelectric memory device in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Various embodiments provide a memory device such as a 3D memory array. In some embodiments, the 3D memory array is a ferroelectric field effect transistor (FeFET) memory circuit including a plurality of vertically stacked memory cells. In some embodiments, each memory cell is regarded as a FeFET that includes a word line region acting as a gate electrode, a bit line region acting as a first source/drain electrode, and a source line region acting as a second source/drain electrode, a ferroelectric material as a gate dielectric, and an oxide semiconductor (OS) as a channel region. In some embodiments, each memory cell is regarded as a thin film transistor (TFT).

Figure 1B:
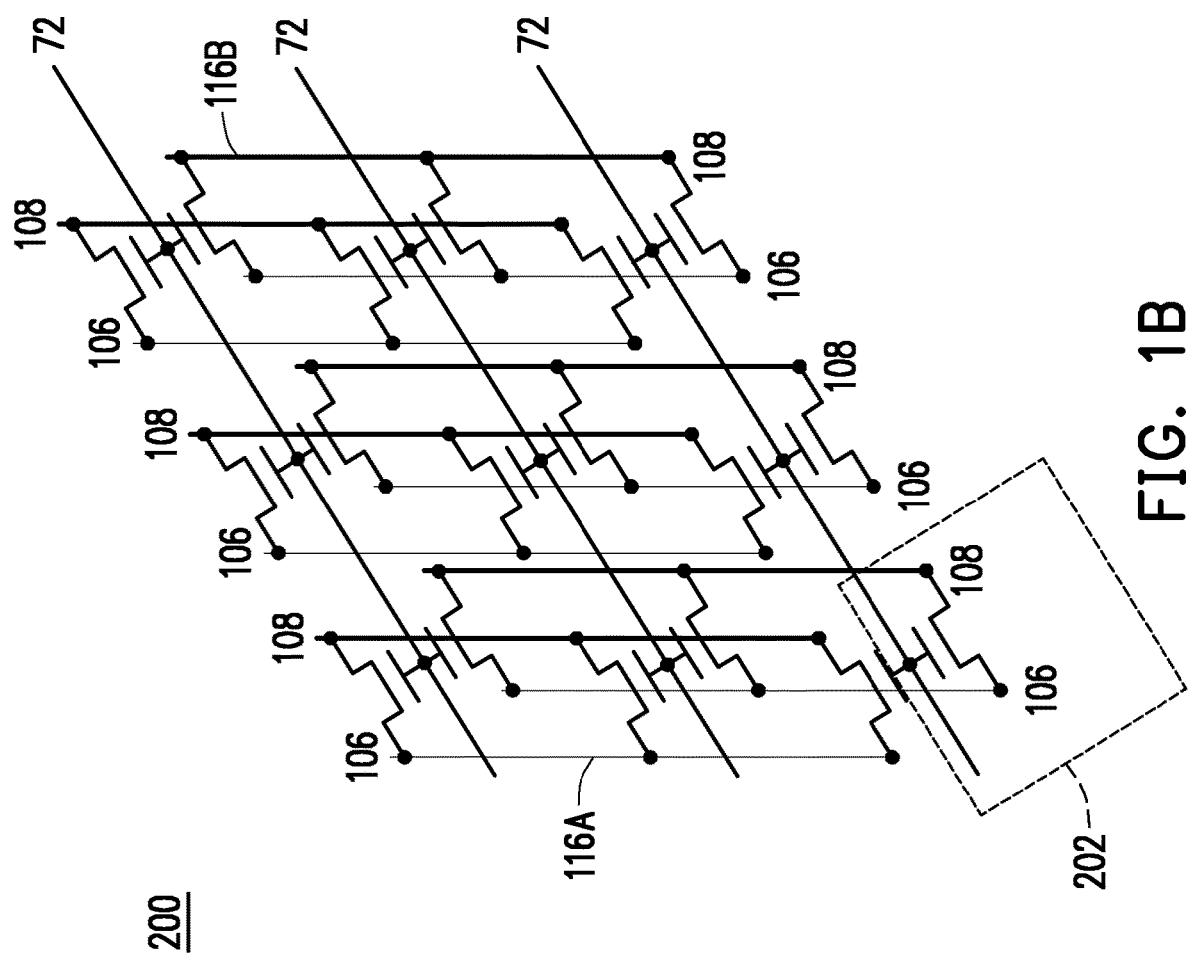
Figure 1C:
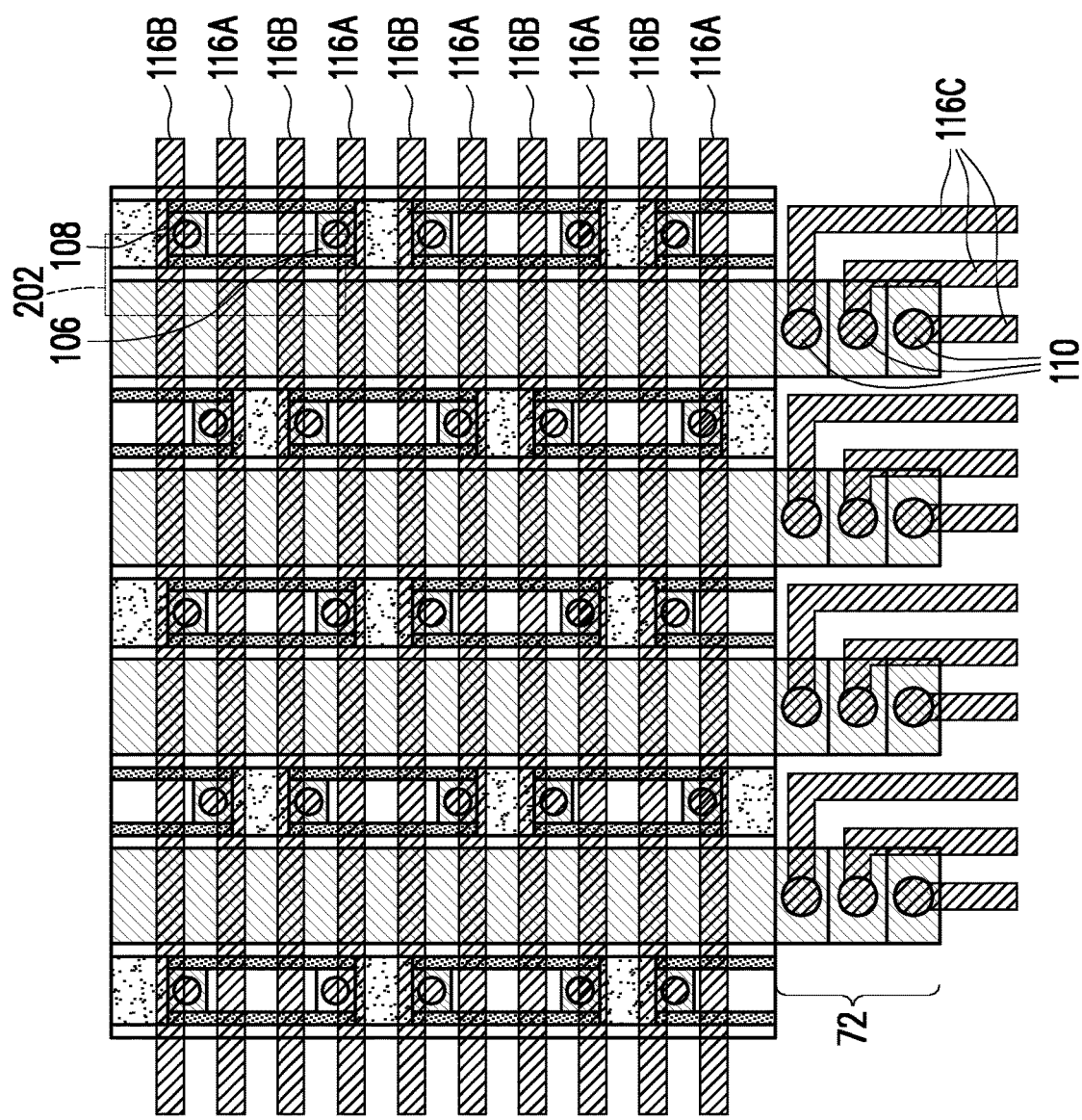

FIGS. 1A, 1B, and 1C illustrate examples of a memory array according to some embodiments. FIG. 1A illustrates an example of a portion of a simplified ferroelectric memory device 200 in a partial three-dimensional view; FIG. 1B illustrates a circuit diagram of the ferroelectric memory device 200; and FIG. 1C illustrates a top down view of the ferroelectric memory device 200 in accordance with some embodiments. The ferroelectric memory device 200 includes a plurality of memory cells 202, which may be arranged in a grid of rows and columns. The memory cells 202 may further stacked vertically to provide a three dimensional memory array, thereby increasing device density. The ferroelectric memory device 200 may be disposed in the back end of line (BEOL) of a semiconductor die. For example, the memory array may be disposed in the interconnect layers of the semiconductor die, such as, above one or more active devices (e.g., transistors) formed on a semiconductor substrate.

In some embodiments, the ferroelectric memory device 200 is a flash memory array, such as a NOR flash memory array, or the like. In some embodiments, a gate of each memory cell 202 is electrically coupled to a respective word line (e.g., conductive line 72), a first source/drain region of each memory cell 202 is electrically coupled to a respective bit line (e.g., conductive line 116B), and a second source/drain region of each memory cell 202 is electrically coupled to a respective source line (e.g., conductive line 116A), which electrically couples the second source/drain region to ground. The memory cells 202 in a same horizontal row of the ferroelectric memory device 200 may share a common word line while the memory cells 202 in a same vertical column of the ferroelectric memory device 200 may share a common source line and a common bit line.

The ferroelectric memory device 200 includes a plurality of vertically stacked conductive lines 72 (e.g., word lines) with dielectric layers 52 disposed between adjacent ones of the conductive lines 72. The conductive lines 72 extend in a direction parallel to a major surface of an underlying substrate (not explicitly illustrated in FIGS. 1A and 1B). The conductive lines 72 may have a staircase configuration such that lower conductive lines 72 are longer than and extend laterally past endpoints of upper conductive lines 72. For example, in FIG. 1A, multiple, stacked layers of conductive lines 72 are illustrated with topmost conductive lines 72 being the shortest and bottommost conductive lines 72 being the longest. Respective lengths of the conductive lines 72 may increase in a direction towards the underlying substrate. In this manner, a portion of each of the conductive lines 72 may be accessible from above the ferroelectric memory device 200, and conductive contacts may be made to exposed portions of the conductive lines 72, respectively.

The ferroelectric memory device 200 further includes conductive pillars 106 (e.g., electrically connected to bit lines) and conductive pillars 108 (e.g., electrically connected to source lines) arranged alternately. The conductive pillars 106 and 108 may each extend in a direction perpendicular to the conductive lines 72. A dielectric material 98A/98B is disposed between and isolates adjacent ones of the conductive pillars 106 and the conductive pillars 108.

Pairs of the conductive pillars 106 and 108 along with an intersecting conductive line 72 define boundaries of each memory cell 202, and an isolation pillar 102 is disposed between and isolates adjacent pairs of the conductive pillars 106 and 108. In some embodiments, the conductive pillars 108 are electrically coupled to ground. Although FIG. 1A illustrates a particular placement of the conductive pillars 106 relative the conductive pillars 108, it should be appreciated that the placement of the conductive pillars 106 and 108 may be exchanged in other embodiments.

In some embodiments, the ferroelectric memory device 200 may also include an oxide semiconductor (OS) material as a channel layer 92. The channel layer 92 may provide channel regions for the memory cells 202. For example, when an appropriate voltage (e.g., higher than a respective threshold voltage ($V_{th}$) of a corresponding memory cell 202) is applied through a corresponding conductive line 72, a region of the channel layer 92 that intersects the conductive line 72 may allow current to flow from the conductive pillars 106 to the conductive pillars 108 (e.g., in the direction indicated by arrow 206).

In some embodiments, a ferroelectric layer 90 is disposed between the channel layer 92 and each of the conductive lines 72 and the dielectric layers 52, and the ferroelectric layer 90 may serve as a gate dielectric for each memory cell 202. In some embodiments, the ferroelectric layer 90 includes a ferroelectric material, such as a hafnium oxide, hafnium zirconium oxide, silicon-doped hafnium oxide, or the like.

The ferroelectric layer 90 may be polarized in one of two different directions, and the polarization direction may be changed by applying an appropriate voltage differential across the ferroelectric layer 90 and generating an appropriate electric field. The polarization may be relatively localized (e.g., generally contained within each boundaries of the memory cells 202), and a continuous region of the ferroelectric layer 90 may extend across a plurality of memory cells 202. Depending on a polarization direction of a particular region of the ferroelectric layer 90, a threshold voltage of a corresponding memory cell 202 varies, and a digital value (e.g., 0 or 1) can be stored. For example, when a region of the ferroelectric layer 90 has a first electrical polarization direction, the corresponding memory cell 202 may have a relatively low threshold voltage, and when the region of the ferroelectric layer 90 has a second electrical polarization direction, the corresponding memory cell 202 may have a relatively high threshold voltage. The difference between the two threshold voltages may be referred to as the threshold voltage shift. A larger threshold voltage shift makes it easier (e.g., less error prone) to read the digital value stored in the corresponding memory cell 202.

In some embodiments, a buffer layer 88 (e.g., metal oxide layer) is disposed between the ferroelectric layer 90 (e.g., metal oxide layer) and each of the dielectric layers 52 (e.g., silicon oxide layer). The buffer layer partially replaces the dielectric layer and mimics a metal surface, so the ferroelectric layer 90 is grown more uniformly, and the device performance is accordingly improved.

To perform a write operation on a memory cell 202 in such embodiments, a write voltage is applied across a portion of the ferroelectric layer 90 corresponding to the memory cell 202. In some embodiments, the write voltage is applied, for example, by applying appropriate voltages to a corresponding conductive line 72 (e.g., the word line) and the corresponding conductive pillars 106/108 (e.g., the bit line/source line). By applying the write voltage across the portion of the ferroelectric layer 90, a polarization direction of the region of the ferroelectric layer 90 can be changed. As a result, the corresponding threshold voltage of the corresponding memory cell 202 can also be switched from a low threshold voltage to a high threshold voltage or vice versa, and a digital value can be stored in the memory cell 202. Because the conductive lines 72 intersect the conductive pillars 106 and 108, individual memory cells 202 may be selected for the write operation.

To perform a read operation on the memory cell 202 in such embodiments, a read voltage (a voltage between the low and high threshold voltages) is applied to the corresponding conductive line 72 (e.g., the world line). Depending on the polarization direction of the corresponding region of the ferroelectric layer 90, the memory cell 202 may or may not be turned on. As a result, the conductive pillar 106 may or may not be discharged through the conductive pillar 108 (e.g., a source line that is coupled to ground), and the digital value stored in the memory cell 202 can be determined. Because the conductive lines 72 intersect the conductive pillars 106 and 108, individual memory cells 202 may be selected for the read operation.

FIG. 1A further illustrates reference cross-sections of the ferroelectric memory device 200 that are used in later figures. Cross-section B-B' is along a longitudinal axis of conductive lines 72 and in a direction, for example, parallel to the direction of current flow of the memory cells 202. Cross-section C-C' is perpendicular to cross-section B-B' and extends through the dielectric materials 98A/98B and the isolation pillars 102. Cross-section D-D' is perpendicular to cross-section B-B' and extends through the dielectric materials 98A/98B and the conductive pillars 106. Subsequent figures refer to these reference cross-sections for clarity.

Figure 2:
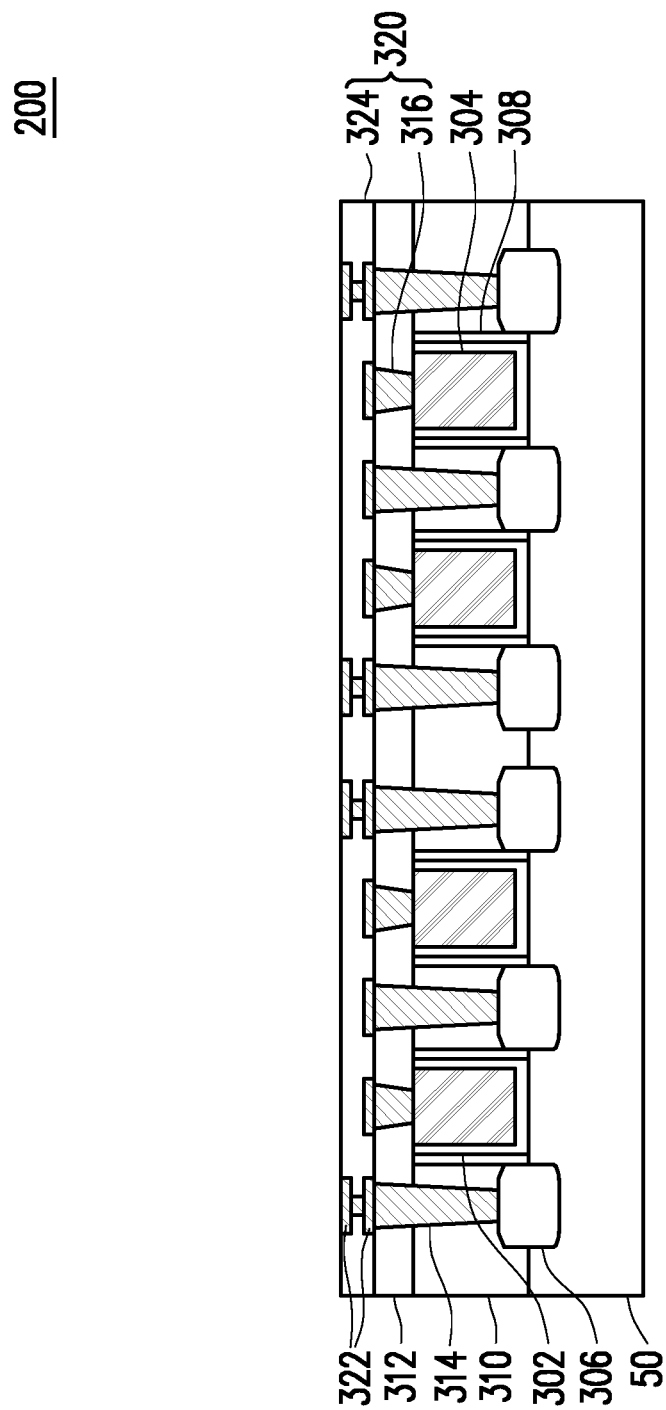
FIGS. 2, 3, 4, 5, 6, 7, 8, 9, 10, 11, 12, 13, 14, 15A, 15B, 16A, 16B, 17A, 17B, 18A, 18B, 19A, 19B, 20A, 20B, 21A, 21B, 22, 23, 24, 25A, 25B, 26A, 26B, 27A, 27B, 28A, 28B, 29A, 29B, 30A, 30B, 30C, 30D and 30E illustrate varying views of manufacturing a ferroelectric memory device in accordance with some embodiments.

In FIG. 2, a substrate 50 is provided. The substrate 50 may be a semiconductor substrate, such as a bulk semiconductor, a semiconductor-on-insulator (SOI) substrate, or the like, which may be doped (e.g., with a p-type or an n-type dopant) or undoped. The substrate 50 may be an integrated circuit die, such as a logic die, a memory die, an ASIC die, or the like. The substrate 50 may be a complementary metal oxide semiconductor (CMOS) die and may be referred to as a CMOS under array (CUA). The substrate 50 may be a wafer, such as a silicon wafer. Generally, an SOI substrate is a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the substrate 50 may include silicon; germanium; a compound semiconductor including silicon carbide, gallium arsenide, gallium phosphide, indium phosphide, indium arsenide, and/or indium antimonide; an alloy semiconductor including silicon-germanium, gallium arsenide phosphide, aluminum indium arsenide, aluminum gallium arsenide, gallium indium arsenide, gallium indium phosphide, and/or gallium indium arsenide phosphide; or combinations thereof.

FIG. 2 further illustrates circuits that may be formed over the substrate 50. The circuits include transistors at a top surface of the substrate 50. The transistors may include gate dielectric layers 302 over top surfaces of the substrate 50 and gate electrodes 304 over the gate dielectric layers 302. Source/drain regions 306 are disposed in the substrate 50 on opposite sides of the gate dielectric layers 302 and the gate electrodes 304. Gate spacers 308 are formed along sidewalls of the gate dielectric layers 302 and separate the source/drain regions 306 from the gate electrodes 304 by appropriate lateral distances. The transistors may include fin field effect transistors (FinFETs), nanostructure (e.g., nanosheet, nanowire, gate-all-around, or the like) FETS (nano-FETs), planar FETs, the like, or combinations thereof, and may be formed by gate-first processes or gate-last processes.

A first inter-layer dielectric (ILD) 310 surrounds and isolates the source/drain regions 306, the gate dielectric layers 302, and the gate electrodes 304 and a second ILD 312 is over the first ILD 310. Source/drain contacts 314 extend through the second ILD 312 and the first ILD 310 and are electrically coupled to the source/drain regions 306 and gate contacts 316 extend through the second ILD 312 and are electrically coupled to the gate electrodes 304. An interconnect structure 320 is over the second ILD 312, the source/drain contacts 314, and the gate contacts 316. The interconnect structure 320 includes one or more stacked dielectric layers 324 and conductive features 322 formed in the one or more dielectric layers 324, for example. The interconnect structure 320 may be electrically connected to the gate contacts 316 and the source/drain contacts 314 to form functional circuits. In some embodiments, the functional circuits formed by the interconnect structure 320 may include logic circuits, memory circuits, sense amplifiers, controllers, input/output circuits, image sensor circuits, the like, or combinations thereof. Although FIG. 2 discusses transistors formed over the substrate 50, other active devices (e.g., diodes or the like) and/or passive devices (e.g., capacitors, resistors, or the like) may also be formed as part of the functional circuits.

Figure 3:
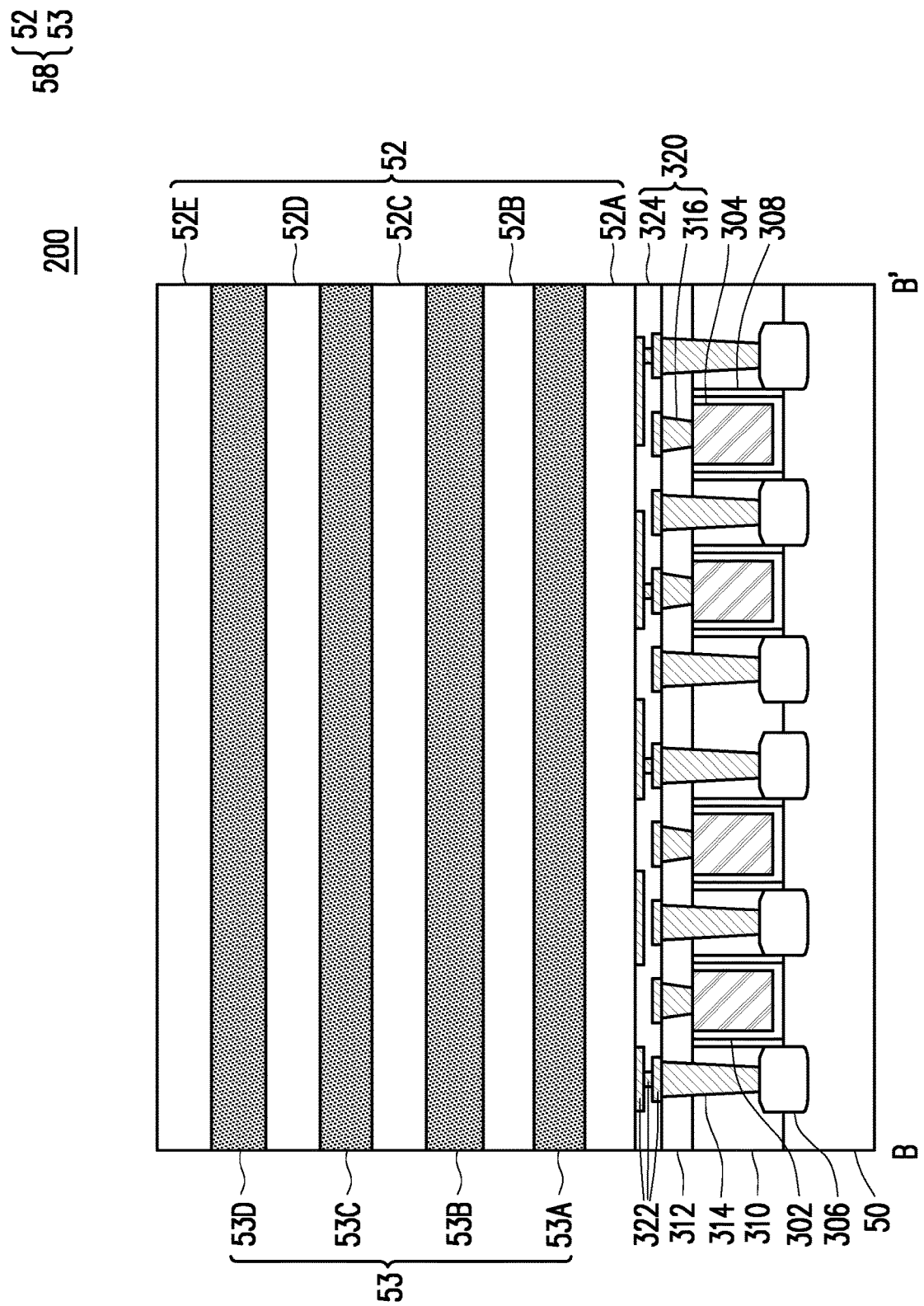

In FIG. 3, a multi-layer stack 58 is formed over the structure of FIG. 2. The substrate 50, the transistors, the ILDs, and the interconnect structure 320 may be omitted from subsequent drawings for the purposes of simplicity and clarity. Although the multi-layer stack 58 is illustrated as contacting the dielectric layers 324 of the interconnect structure 320, any number of intermediate layers may be disposed between the substrate 50 and the multi-layer stack 58. For example, one or more interconnect layers including conductive features in insulting layers (e.g., low-k dielectric layers) may be disposed between the substrate 50 and the multi-layer stack 58. In some embodiments, the conductive features may be patterned to provide power, ground, and/or signal lines for the active devices on the substrate 50 and/or the ferroelectric memory device 200 (see FIGS. 1A and 1B). In some embodiments, one or more interconnect layers including conductive features in insulting layers (e.g., low-k dielectric layers) may be disposed over the multi-layer stack 58.

In FIG. 3, the multi-layer stack 58 includes alternating layers of sacrificial layers 53A-53D (collectively referred to as sacrificial layers 53) and dielectric layers 52A-52E (collectively referred to as dielectric layers 52). The sacrificial layers 53 may be patterned and replaced in subsequent steps to define conductive lines 72 (e.g., the word lines). The sacrificial layers 53 may include dielectric materials, such as silicon oxide, silicon nitride, silicon oxynitride, combinations thereof, or the like. The dielectric layers 52 may include insulating materials, such as silicon oxide, silicon nitride, silicon oxynitride, combinations thereof, or the like. The sacrificial layers 53 and the dielectric layers 52 include different materials with different etching selectivities. In some embodiments, the sacrificial layers 53 include silicon nitride, and the dielectric layers 52 include silicon oxide. Each of the sacrificial layers 53 and the dielectric layers 52 may be formed using, for example, chemical vapor deposition (CVD), atomic layer deposition (ALD), physical vapor deposition (PVD), plasma enhanced CVD (PECVD), or the like.

Although FIG. 3 illustrates a particular number of the sacrificial layers 53 and the dielectric layers 52, other embodiments may include different numbers of the sacrificial layers 53 and the dielectric layers 52. Besides, although the multi-layer stack 58 is illustrated as having dielectric layers as topmost and bottommost layers, the disclosure is not limited thereto. In some embodiments, at least one of the topmost and bottommost layers of the multi-layer stack 58 is a sacrificial layer.

FIGS. 4 through 12 are views of intermediate stages in the manufacturing a staircase structure of the ferroelectric memory device 200, in accordance with some embodiments. FIGS. 4 through 12 are illustrated along reference cross-section B-B' illustrated in FIG. 1A.

Figure 4:
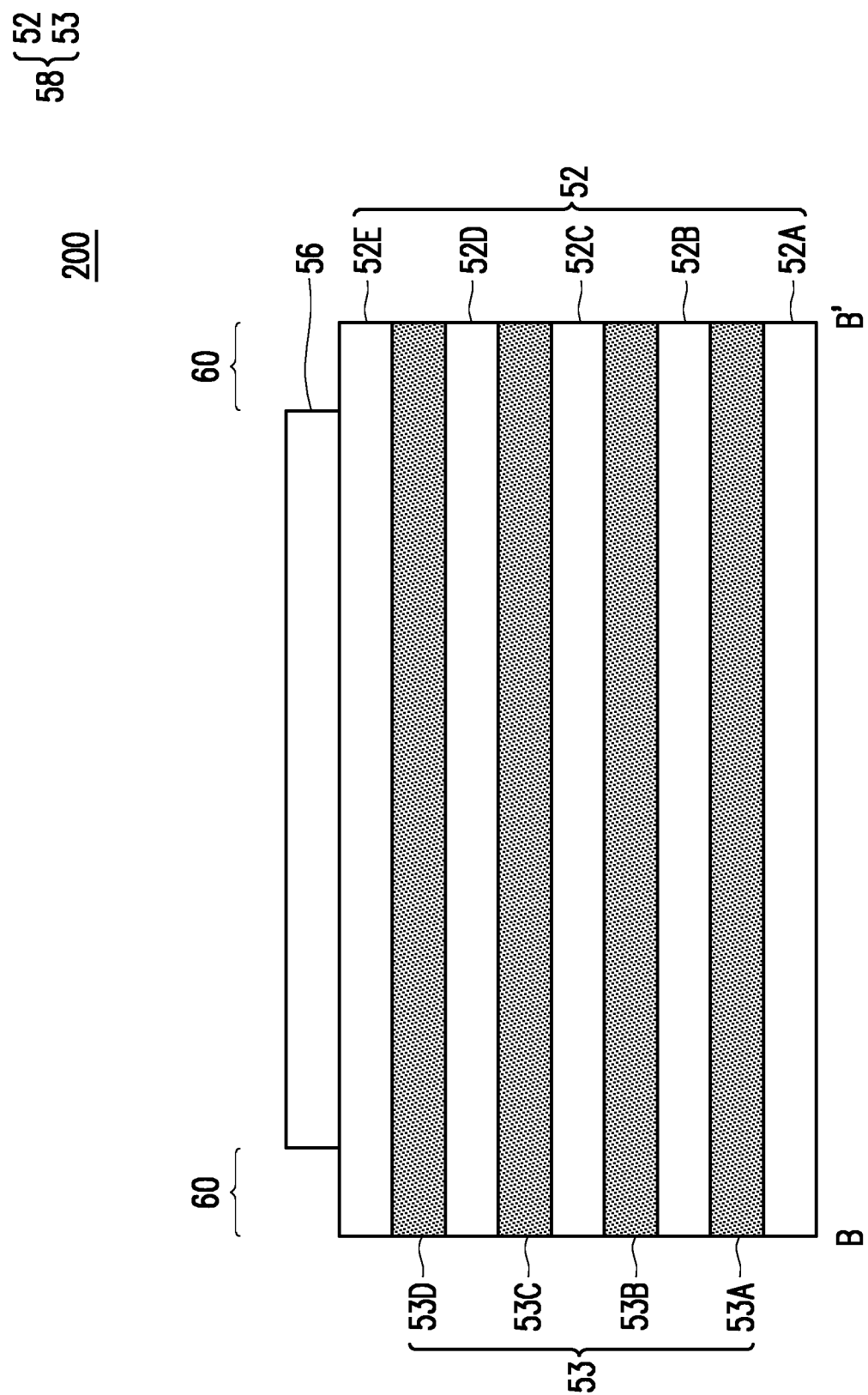

In FIG. 4, a photoresist 56 is formed over the multi-layer stack 58. In some embodiments, the photoresist 56 is formed by a spin-on technique and patterned by an acceptable photolithography technique. Patterning the photoresist 56 may expose the multi-layer stack 58 in regions 60, while masking remaining portions of the multi-layer stack 58. For example, a topmost layer of the multi-layer stack 58 (e.g., the dielectric layer 52E) may be exposed in the regions 60.

Figure 5:
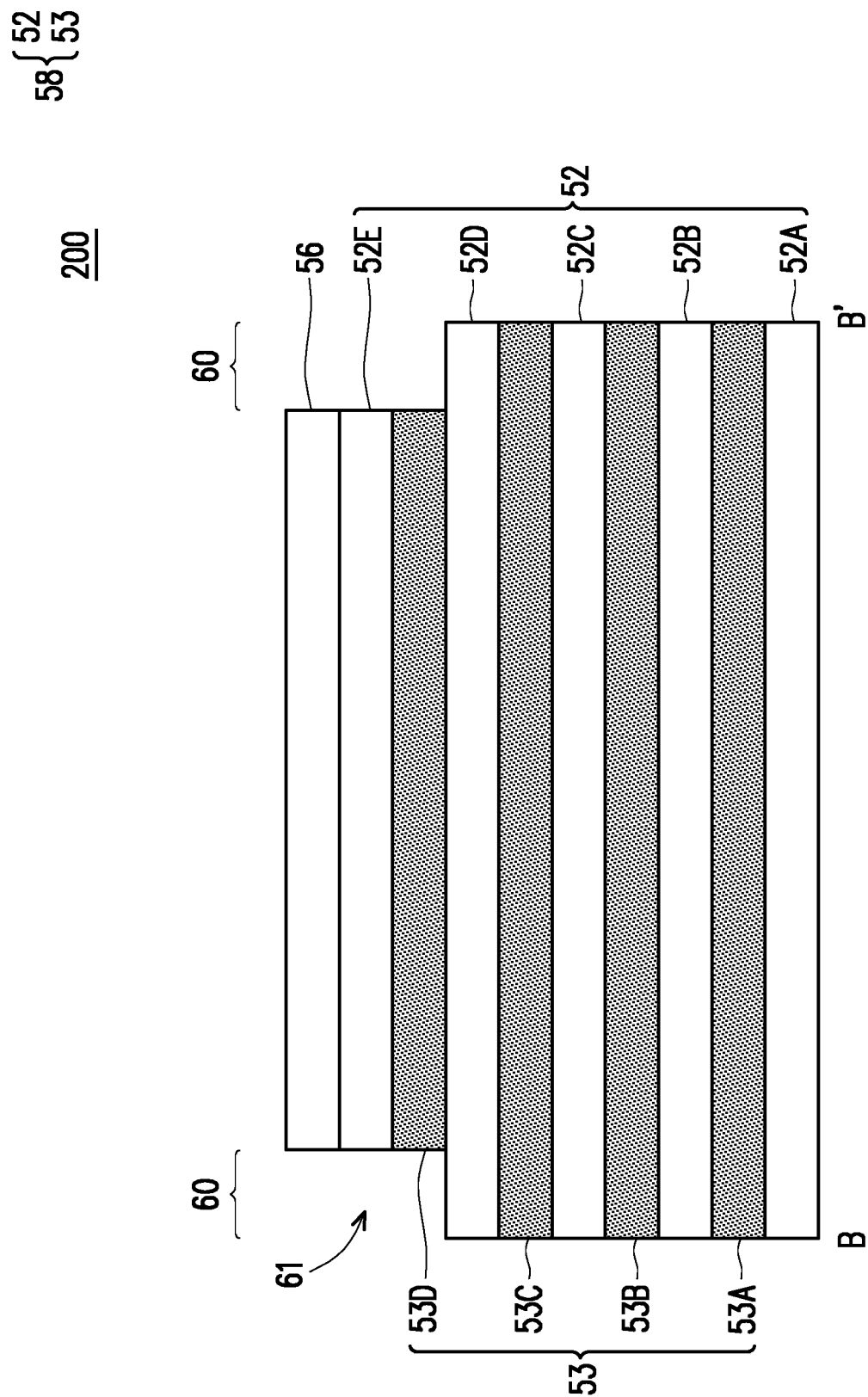

In FIG. 5, the exposed portions of the multi-layer stack 58 in the regions 60 are etched using the photoresist 56 as a mask. The etching may be any acceptable etching process, such as a dry etch (e.g., a reactive ion etch (RIE), a neutral beam etch (NBE), the like), a wet etch, the like, or a combination thereof. The etching may be anisotropic. The etching may remove portions of the dielectric layer 52E and the sacrificial layer 53D in the regions 60 and define openings 61. Because the dielectric layer 52E and the sacrificial layer 53D have different material compositions, etchants used to remove exposed portions of these layers may be different. In some embodiments, the sacrificial layer 53D acts as an etch stop layer while etching the dielectric layer 52E, and the dielectric layer 52D acts as an etch stop layer while etching sacrificial layer 53D. As a result, the portions of the dielectric layer 52E and the sacrificial layer 53D may be selectively removed without removing remaining layers of the multi-layer stack 58, and the openings 61 may be extended to a desired depth. Alternatively, a time-mode etching process may be used to stop the etching of the openings 61 after the openings 61 reach a desired depth. In the resulting structure, the dielectric layer 52D is exposed in the regions 60.

Figure 6:
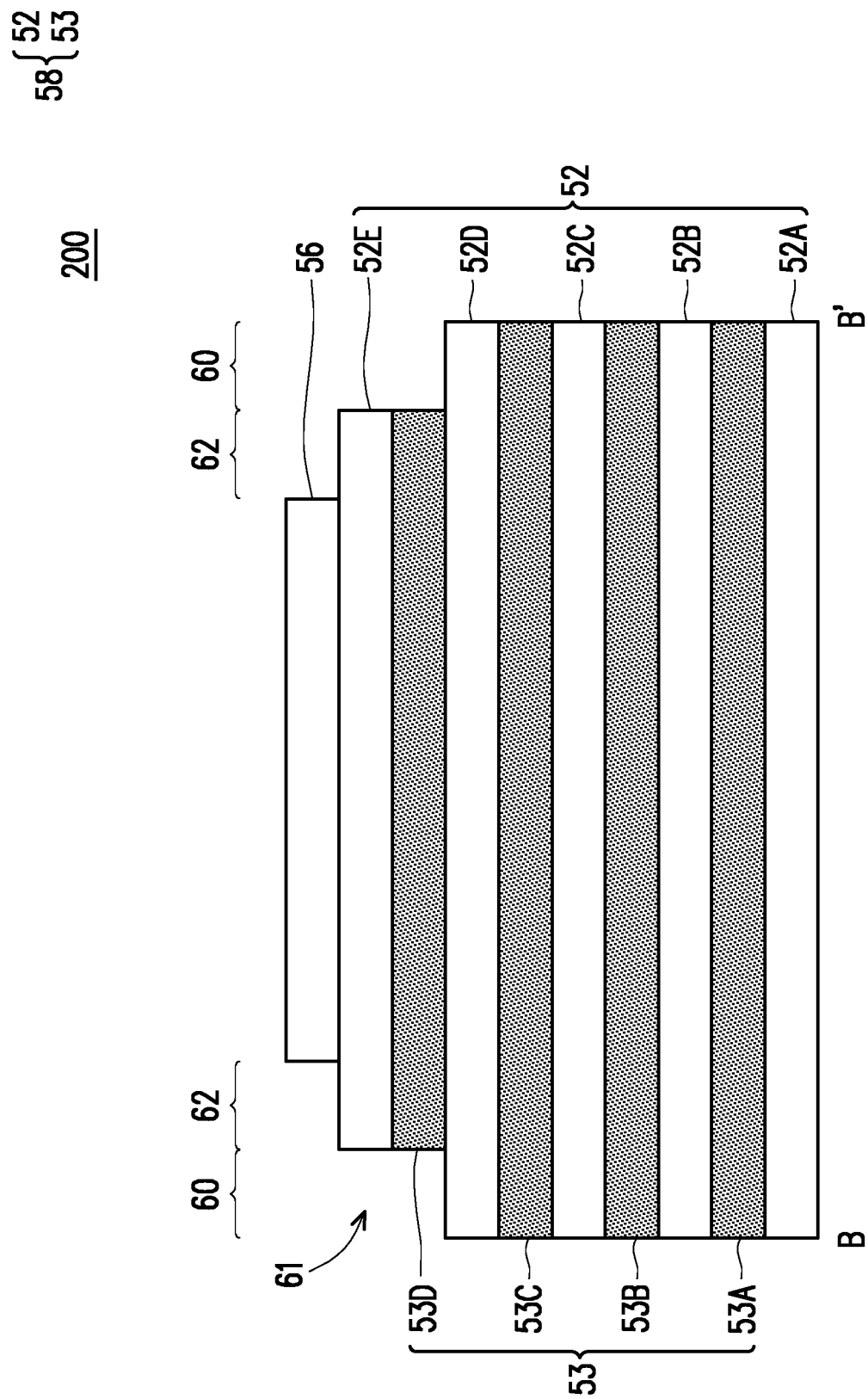

In FIG. 6, the photoresist 56 is trimmed to expose additional portions of the multi-layer stack 58. In some embodiments, the photoresist 56 is trimmed by using an acceptable removing technique such as a lateral etching. As a result of the trimming, a width of the photoresist 56 is reduced and portions the multi-layer stack 58 in the regions 60 and regions 62 may be exposed. For example, top surfaces of the dielectric layer 52D may be exposed in the regions 60, and top surfaces of the dielectric layer 52E may be exposed in the regions 62.

Figure 7:
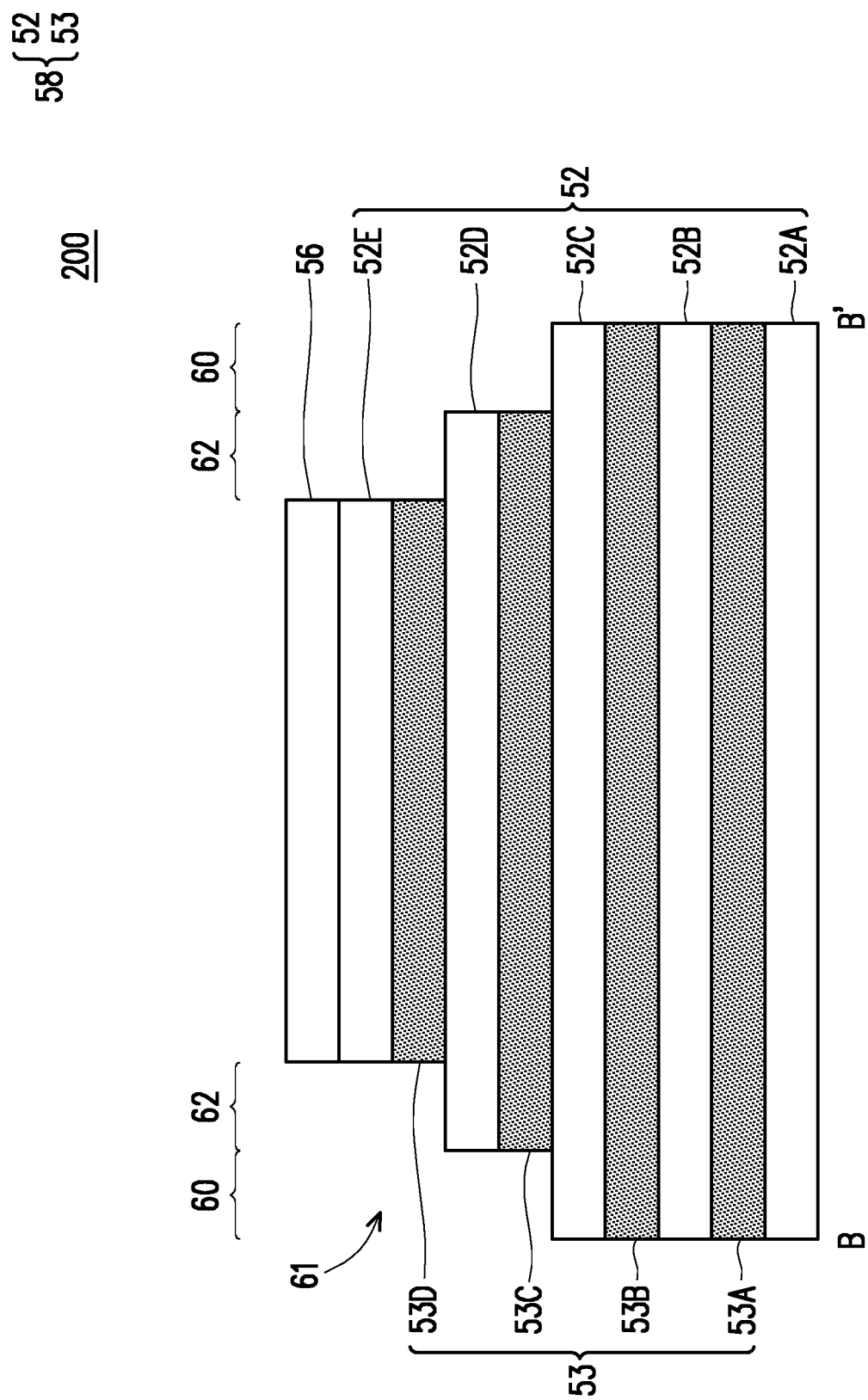

In FIG. 7, portions of the dielectric layer 52E, the sacrificial layer 53D, the dielectric layer 52D, and the sacrificial layer 53C in the regions 60 and the regions 62 are removed by acceptable etching processes using the photoresist 56 as a mask. The etching may be any acceptable etching process, such as a dry etch (e.g., RIE, NBE, the like), a wet etch, the like, or a combination thereof. The etching may be anisotropic. The etching may extend the openings 61 further into the multi-layer stack 58. Because the sacrificial layers 53D and 53C and the dielectric layers 52E and 52D have different material compositions, etchants used to remove exposed portions of these layers may be different. In some embodiments, portions of the dielectric layers 52E and 52D in the regions 62 and 60 are removed by using the photoresist 56 as a mask and using the underlying sacrificial layers 53D and 53C as etch stop layers. Thereafter, the exposed portions of the sacrificial layers 53D and 53C in the regions 62 and 60 are removed by using the photoresist 56 as a mask and using the underlying dielectric layers 52D and 52C as etching stop layers. In the resulting structure, the dielectric layer 52C is exposed in the regions 60, and the dielectric layer 52D is exposed in the regions 62.

Figure 8:
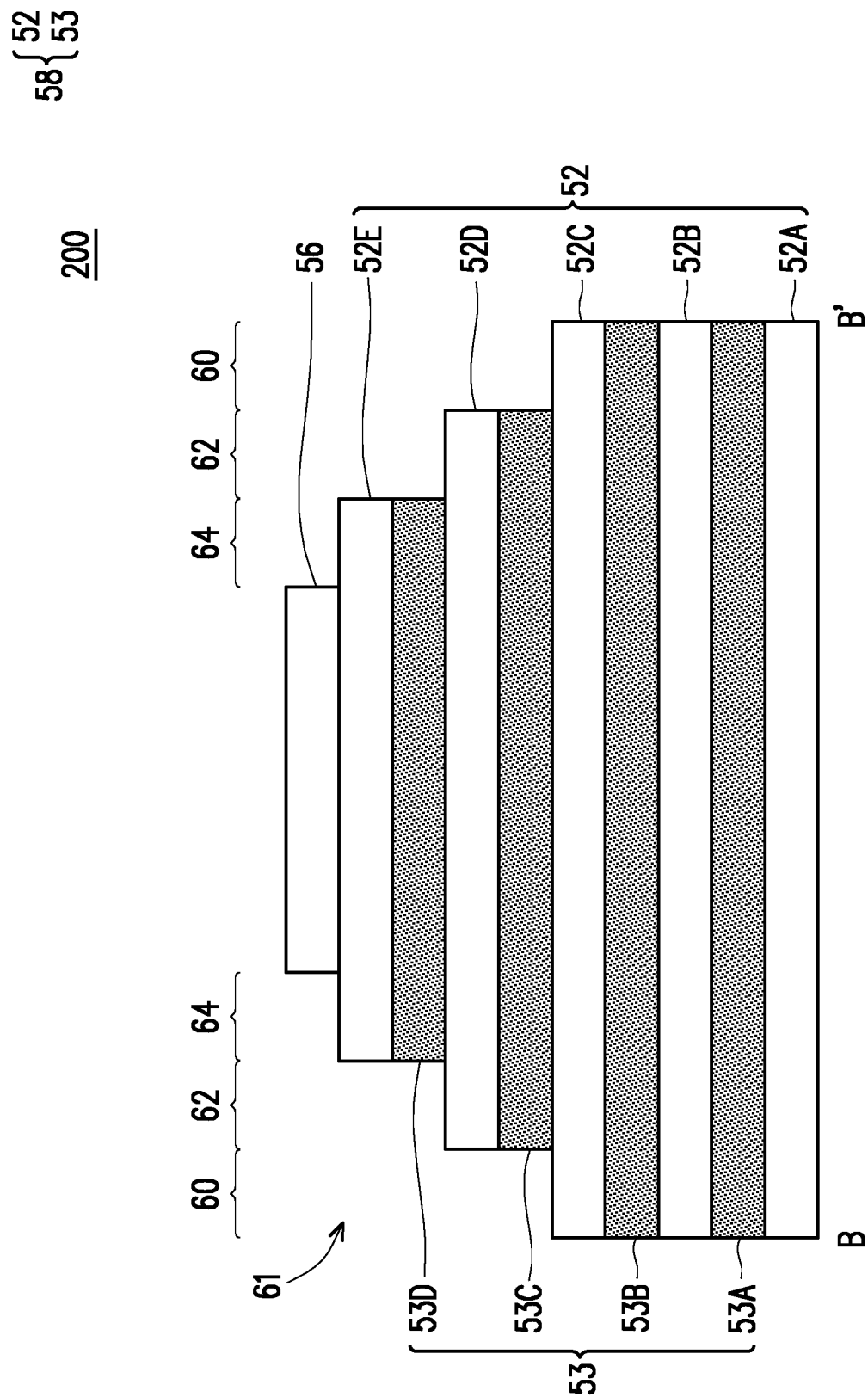

In FIG. 8, the photoresist 56 is trimmed to expose additional portions of the multi-layer stack 58. In some embodiments, the photoresist 56 is trimmed by using an acceptable removing technique such as a lateral etching. As a result of the trimming, a width of the photoresist 56 is reduced, and portions the multi-layer stack 58 in the regions 60, the regions 62, and regions 64 may be exposed. For example, top surfaces of the dielectric layer 52C may be exposed in the regions 60; top surfaces of the dielectric layer 52D may be exposed in the regions 62; and top surfaces of the dielectric layer 52E may be exposed in the regions 64.

Figure 9:
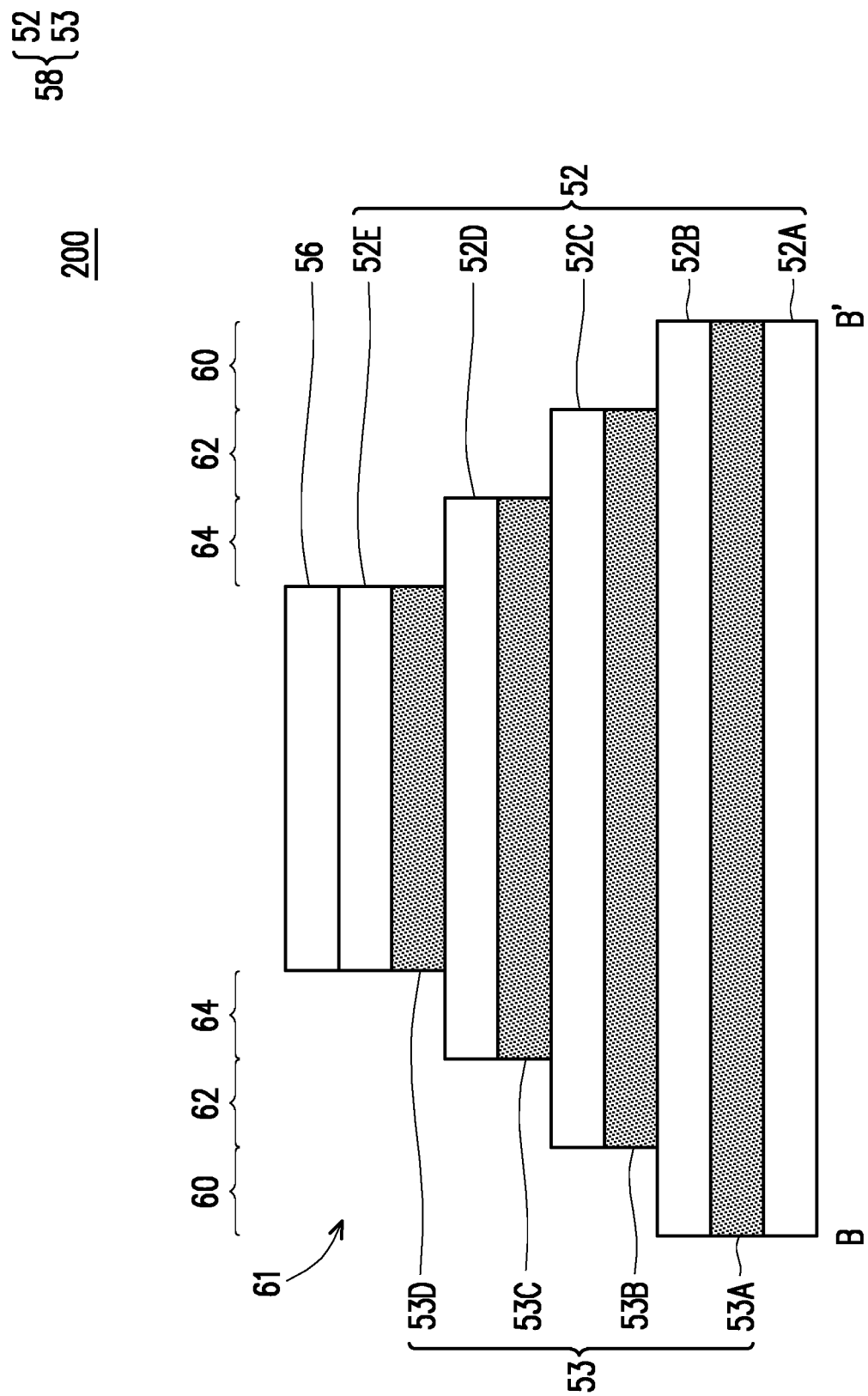

In FIG. 9, portions of the dielectric layers 52E, 52D, and 52C and the sacrificial layers 53D, 53C, and 53B in the regions 60, the regions 62, and the regions 64 are removed by acceptable etching processes using the photoresist 56 as a mask. The etching may be any acceptable etching process, such as a dry etch (e.g., RIE, NBE, the like), a wet etch, the like, or a combination thereof. The etching may be anisotropic. The etching may extend the openings 61 further into the multi-layer stack 58. Because the dielectric layers 52C-52E and the sacrificial layers 53B-53D have different material compositions, etchants used to remove exposed portions of these layers may be different. In some embodiments, portions of the dielectric layers 52E, 52D and 52C in the regions 64, 62 and 60 are removed by using the photoresist 56 as a mask and using the underlying sacrificial layers 53D, 53C and 53B as etch stop layers. Thereafter, the exposed portions of the sacrificial layers 53D, 53C and 53B in the regions 64, 62 and 60 are removed by using the photoresist 56 as a mask and using the underlying dielectric layers 52D, 52C and 52B as etching stop layers. In the resulting structure, the dielectric layer 52B is exposed in the regions 60; the dielectric layer 52C is exposed in the regions 62; and the dielectric layer 52D is exposed in the regions 64.

Figure 10:
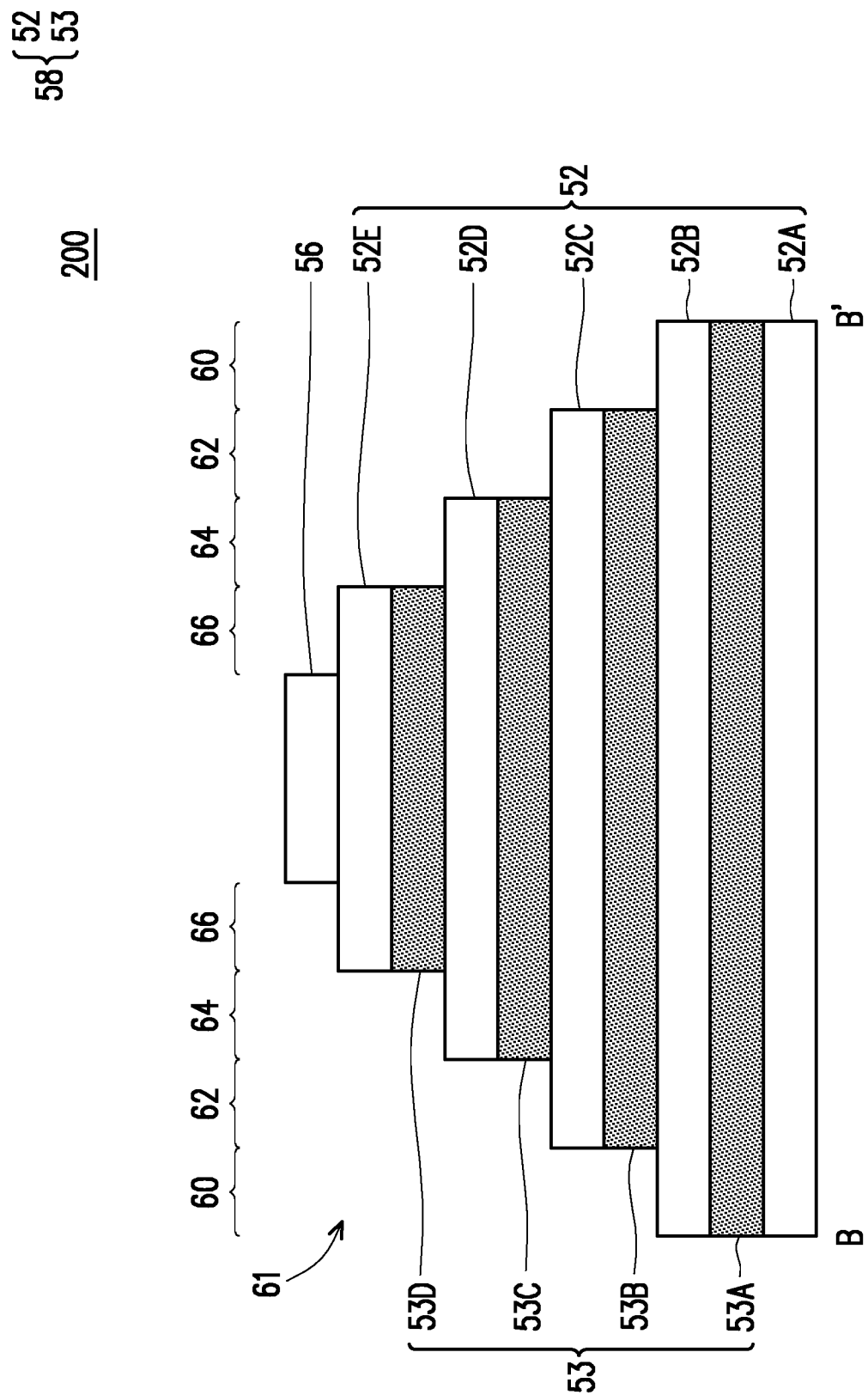

In FIG. 10, the photoresist 56 is trimmed to expose additional portions of the multi-layer stack 58. In some embodiments, the photoresist 56 is trimmed by using an acceptable removing technique such as a lateral etching. As a result of the trimming, a width of the photoresist 56 is reduced, and portions the multi-layer stack 58 in the regions 60, the regions 62, the regions 64, and regions 66 may be exposed. For example, top surfaces of the dielectric layer 52B may be exposed in the regions 60; top surfaces of the dielectric layer 52C may be exposed in the regions 62; and top surfaces of the dielectric layer 52D may be exposed in the regions 64; and top surfaces of the dielectric layer 52E may be exposed in the regions 66.

Figure 11:
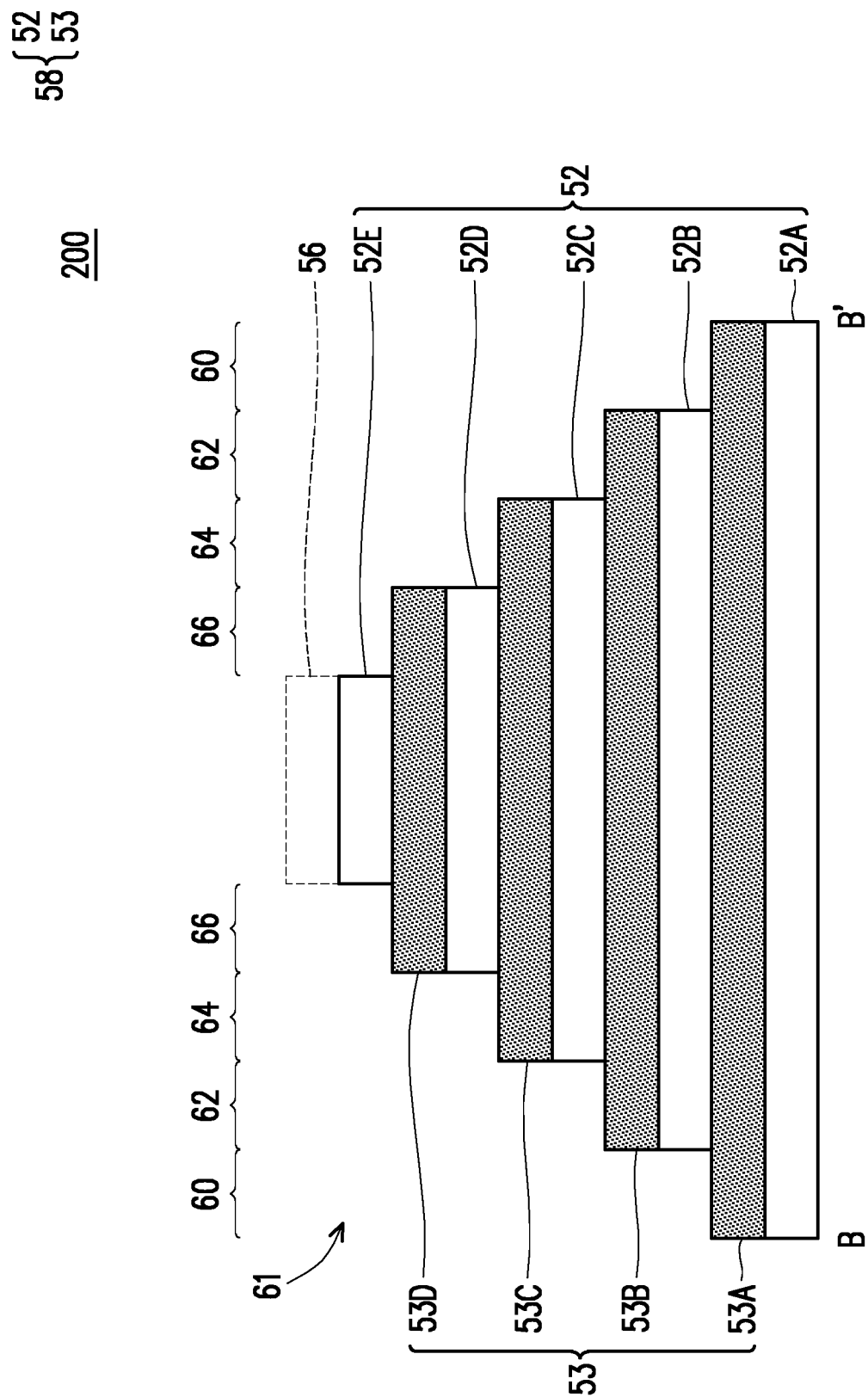

In FIG. 11, portions of the dielectric layers 52E, 52D, 52C, and 52B in the regions 60, the regions 62, the regions 64, and the regions 66 are removed by acceptable etching processes using the photoresist 56 as a mask. The etching may be any acceptable etching process, such as a dry etch (e.g., RIE, NBE, the like), a wet etch, the like, or a combination thereof. The etching may be anisotropic. The etching may extend the openings 61 further into the multi-layer stack 58. In some embodiments, portions of the dielectric layers 52E, 52D, 52C and 52B in the regions 66, 64, 62 and 60 are removed by using the photoresist 56 as a mask and using the underlying sacrificial layers 53D, 53C, 53B and 53A as etch stop layers. In the resulting structure, the sacrificial layer 53A is exposed in the regions 60; the sacrificial layer 53B is exposed in the regions 62; the sacrificial layer 53C is exposed in the regions 64; and the sacrificial layer 53D is exposed in the regions 66. Thereafter, the photoresist 56 may be removed by an acceptable ashing or wet strip process.

Figure 12:
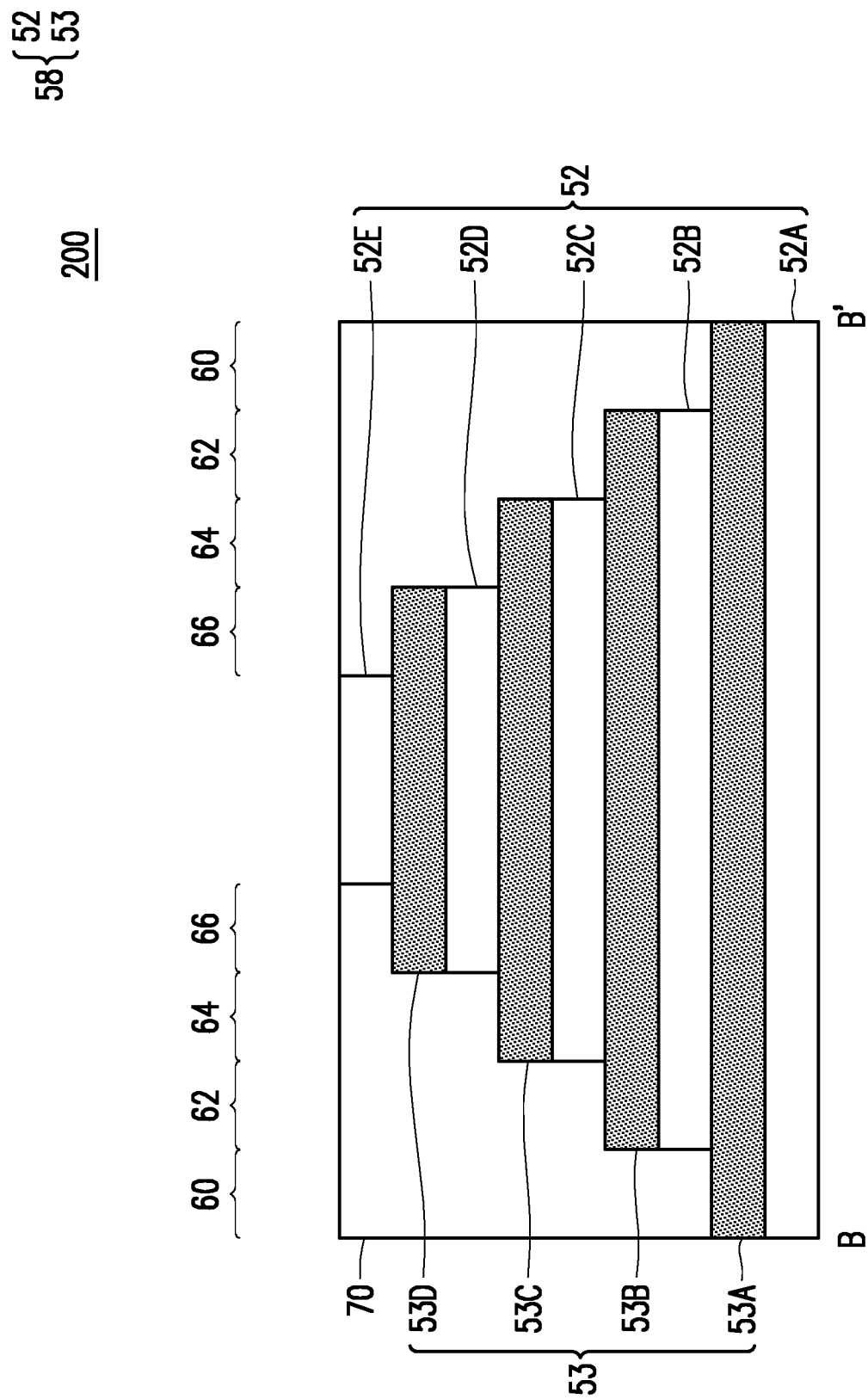

In FIG. 12, an inter-metal dielectric (IMD) 70 is deposited over the multi-layer stack 58. The IMD 70 may be formed of a dielectric material, and may be deposited by any suitable method, such as CVD, PECVD, flowable CVD (FCVD), or the like. The dielectric materials may include phospho-silicate glass (PSG), boro-silicate glass (BSG), boron-doped phospho-silicate glass (BPSG), undoped silicate glass (USG), or the like. In some embodiments, the IMD 70 may include an oxide (e.g., silicon oxide or the like), a nitride (e.g., silicon nitride or the like), a combination thereof or the like. Other dielectric materials formed by any acceptable process may be used. The IMD 70 extends along sidewalls of the sacrificial layers 53B-53D and sidewalls of the dielectric layers 52B-52E. Further, the IMD 70 may contact top surfaces of the sacrificial layers 53A-53D and the dielectric layer 52E.

Thereafter, a removal process is applied to the IMD 70 to remove excess dielectric material over the multi-layer stack 58. In some embodiments, the removal process may be a planarization process, such as a chemical mechanical polish (CMP), an etch-back process, combinations thereof, or the like. The planarization process exposes the multi-layer stack 58 such that top surfaces of the multi-layer stack 58 and IMD 70 are level after the planarization process is completed.

Figure 16A:
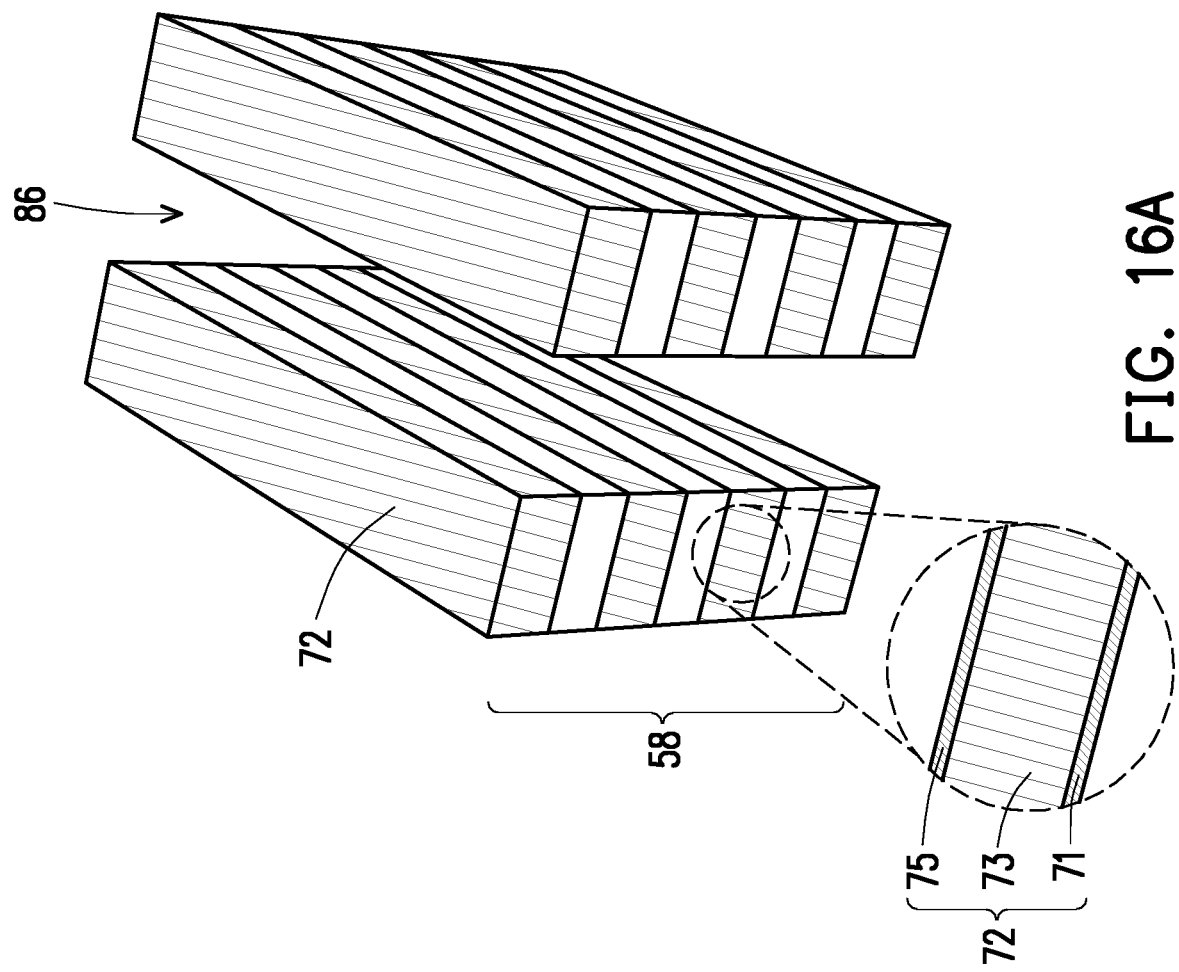

As shown in FIG. 12, an intermediate and bulk staircase structure is thus formed. The intermediate staircase structure includes alternating layers of sacrificial layers 53 and dielectric layers 52. The sacrificial layers 53 are subsequently replaced with conductive lines 72, which will be described in details in FIGS. 16A and 16B. Lower conductive lines 72 are longer and extend laterally past upper conductive lines 72, and a width of each of the conductive lines 72 increases in a direction towards the substrate 50 (see FIG. 1A).

FIGS. 13 through 16B are views of intermediate stages in the manufacturing of a memory region of the ferroelectric memory device 200, in accordance with some embodiments. In FIGS. 13 through 16B, the bulk multi-layer stack 58 is patterned to form trenches 86 therethrough, and sacrificial layers 53 are replaced with conductive materials to define the conductive lines 72. The conductive lines 72 may correspond to word lines in the ferroelectric memory device 200, and the conductive lines 72 may further provide gate electrodes for the resulting memory cells of the ferroelectric memory device 200. FIGS. 13, 14, 15B and 16B are illustrated along reference cross-section C-C' illustrated in FIG. 1A. FIGS. 15A and 16A are illustrated in a partial three-dimensional view.

Figure 13:
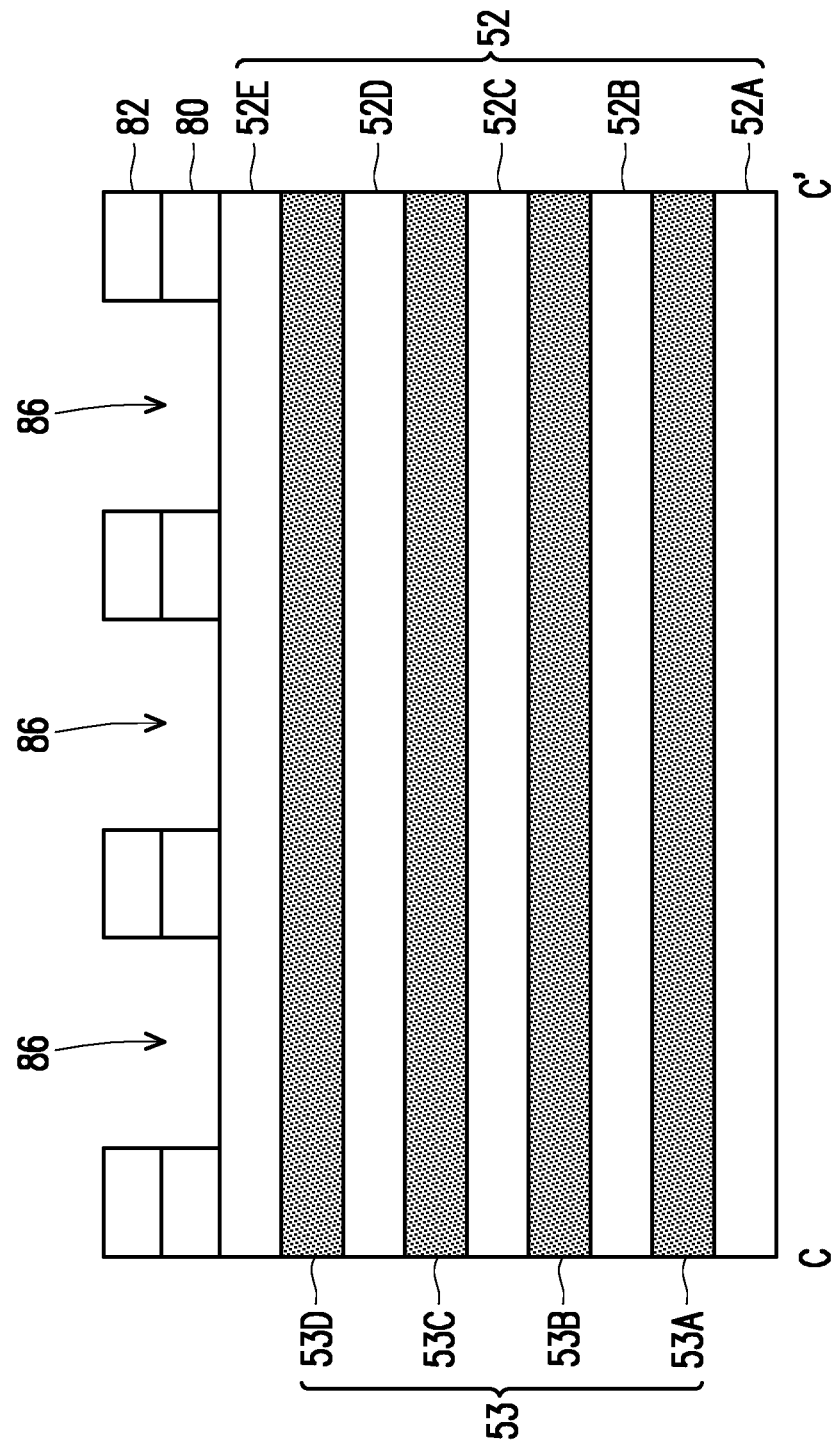

In FIG. 13, photoresist patterns 82 and underlying hard mask patterns 80 are formed over the multi-layer stack 58. In some embodiments, a hard mask layer and a photoresist layer are sequentially formed over the multi-layer stack 58. The hard mask layer may include, for example, silicon nitride, silicon oxynitride, or the like, which may be deposited by CVD, PVD, ALD, PECVD, or the like. The photoresist layer is formed by a spin-on technique, for example.

Thereafter, the photoresist layer is patterned to form photoresist patterns 82 and trenches 86 between the photoresist patterns 82. The photoresists is patterned by an acceptable photolithography technique, for example. The patterns of the photoresist patterns 82 are then transferred to the hard mask layer to form hard mask patterns 80 by using an acceptable etching process, such as by a dry etch (e.g., RIE, NBE, the like), a wet etch, the like, or a combination thereof. The etching may be anisotropic. Thus, trenches 86 are formed extending through the hard mask layer. Thereafter, the photoresist 82 may be optionally removed by an ashing process, for example.

Figure 14:
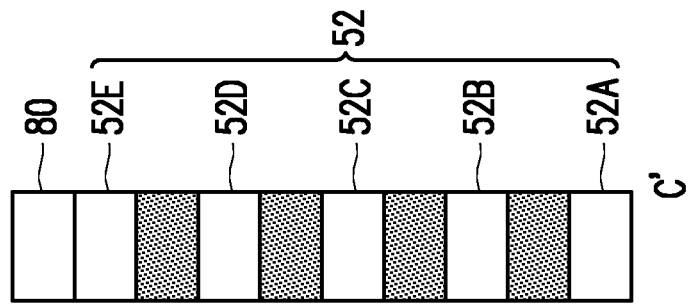
Figure 14:
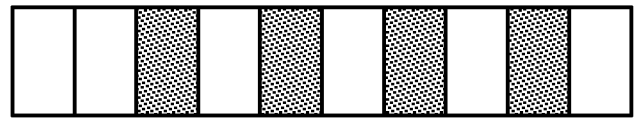
Figure 14:
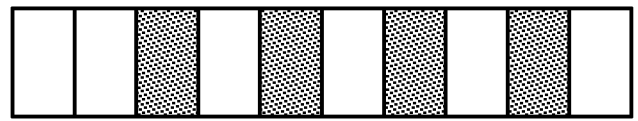
Figure 14:
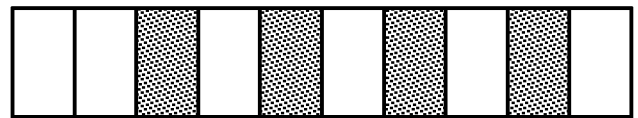
Figure 15A:
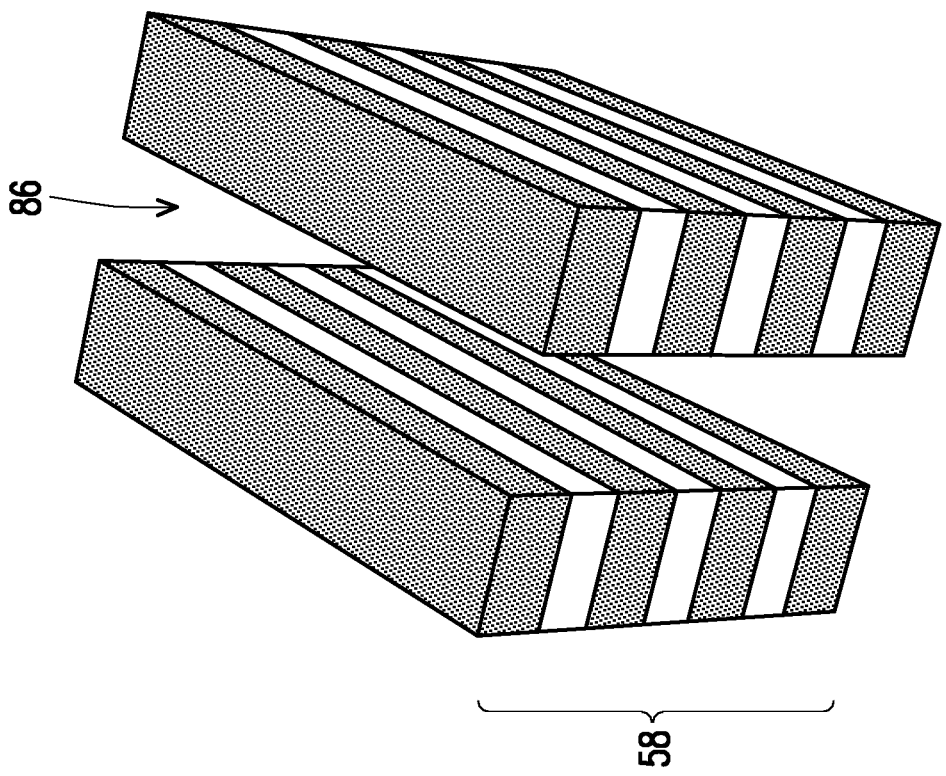
Figure 15B:
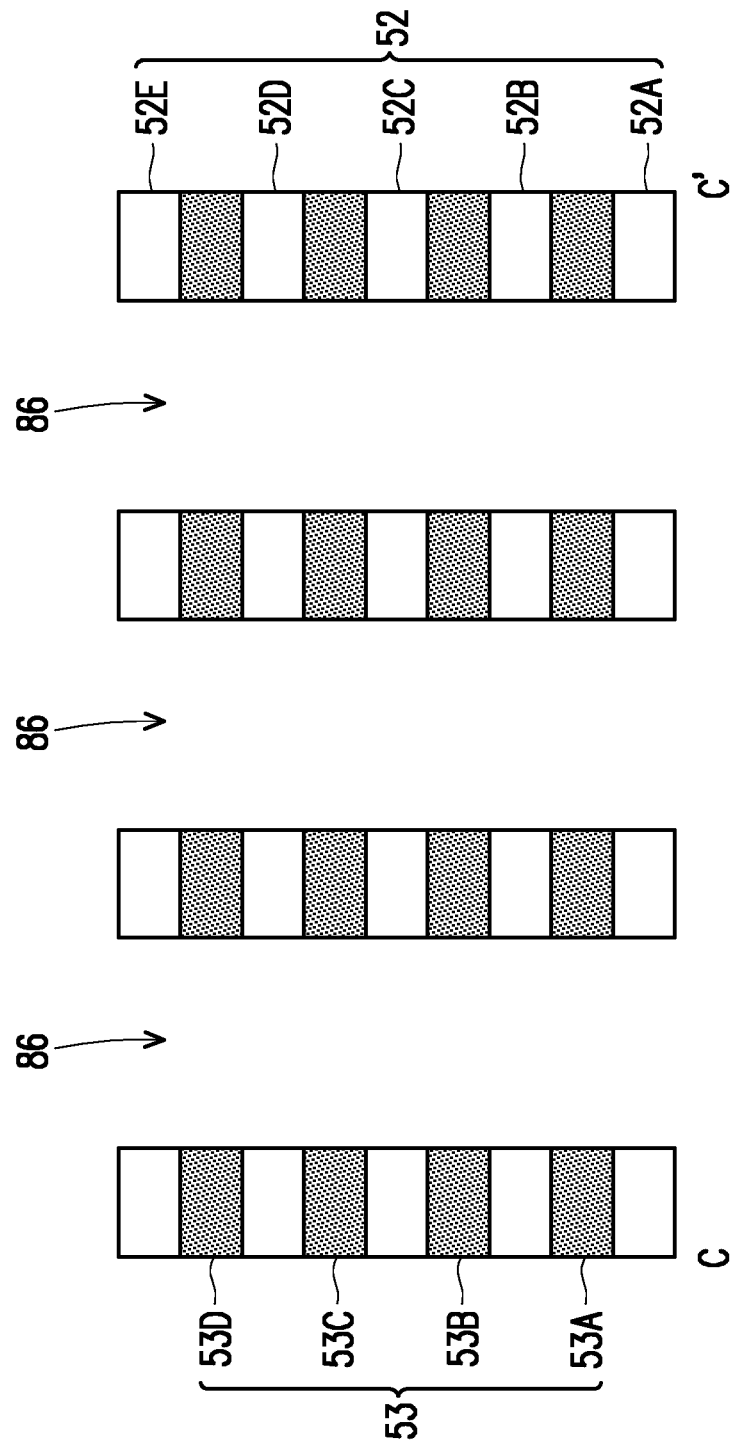

In FIGS. 14 to 15B, the patterns of the hard mask patterns 80 are transferred to the multi-layer stack 58 using one or more acceptable etching processes, such as by a dry etch (e.g., RIE, NBE, the like), a wet etch, the like, or a combination thereof. The etching processes may be anisotropic. Thus, the trenches 86 extend through the bulk multi-layer stack 58, and strip-shaped sacrificial layers 53 and strip-shaped dielectric layers 52 are accordingly defined. In some embodiments, the trenches 86 extend through the bulk staircase structure, and strip-shaped staircase structures are accordingly defined. The hard mask patterns 80 may be then removed by an acceptable process, such as a wet etching process, a dry etching process, a planarization process, combinations thereof, or the like.

Figure 16B:
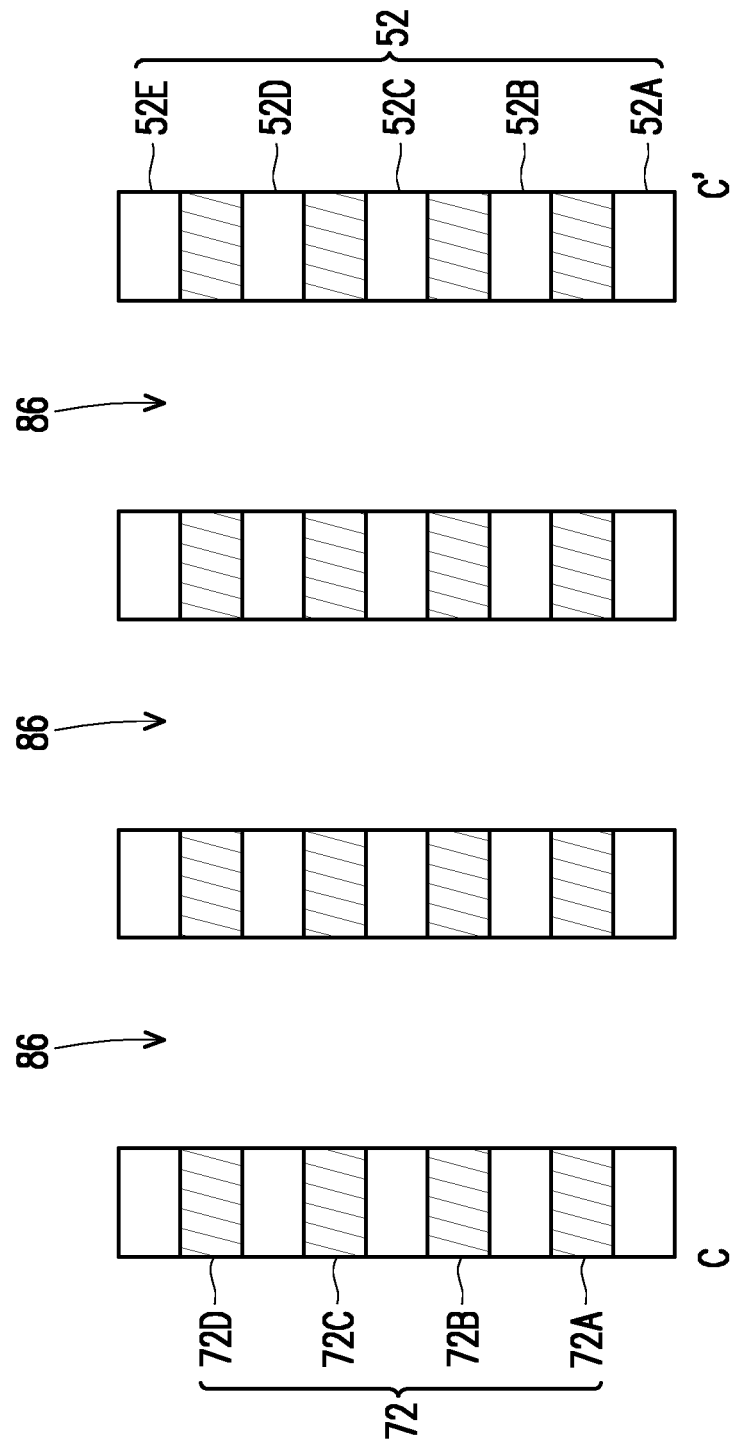

In FIGS. 15 to 16B, the sacrificial layers 53A-53D (collectively referred to as sacrificial layers 53) are replaced with conductive lines 72A-72D (collectively referred to as conductive lines 72). In some embodiments, the sacrificial layers 53 are removed by an acceptable process, such as a wet etching process, a dry etching process or both. Thereafter, conductive lines 72 are filled into the space between two adjacent dielectric layers 52. In some embodiments, each conductive line 72 includes TiN, TaN, W, Ru, Al, the like or a combination thereof. In some embodiments, each conductive line 72 is made by a single material such as TiN. In some embodiments, each conductive line 72 is a multi-layer structure. For example, as shown in the local enlarged view, each conductive line 72 includes two barrier layers 71 and 75 and a metal layer 73 between the barrier layers 71 and 75. Specifically, a barrier layer is disposed between the metal layer 73 and the adjacent dielectric layer 52. The barrier layers may prevent the metal layer from diffusion to the adjacent dielectric layers 52. The barrier layers may also provide the function of increasing the adhesion between the metal layer and the adjacent dielectric layers, and may be referred to as glue layers in some examples. In some embodiments, both barrier layers and glue layers with different materials are provided as needed. The barrier layers 71 and 75 are formed of a first conductive material, such as a metal nitride, such as titanium nitride, tantalum nitride, molybdenum nitride, zirconium nitride, hafnium nitride, or the like. The metal layer 73 may are formed of a second conductive material, such as a metal, such as tungsten, ruthenium, molybdenum, cobalt, aluminum, nickel, copper, silver, gold, alloys thereof, or the like. The barrier layers 71, 75 and metal layer 73 may each be formed by an acceptable deposition process such as CVD, PVD, ALD, PECVD, or the like. The barrier layers 71, 75 and the metal layer 73 are further deposited on the sidewalls of the multi-layer stack 58 and fill in the trenches 86. Thereafter, the barrier layers 71, 75 and the metal layer 73 in the trenches 86 are removed by an etching back process. An acceptable etch back process may be performed to remove excess materials from the sidewalls of the dielectric layers 52 and the bottom surfaces of the trenches 86. The acceptable etch back process includes a dry etch (e.g., RIE, NBE, the like), a wet etch, the like, or a combination thereof. The acceptable etch back process may be anisotropic.

In some embodiments, upon the replacement process, the sacrificial layers 53 of the strip-shaped staircase structures are subsequently replaced with conductive lines 72 (see FIG. 1A).

Figure 17A:
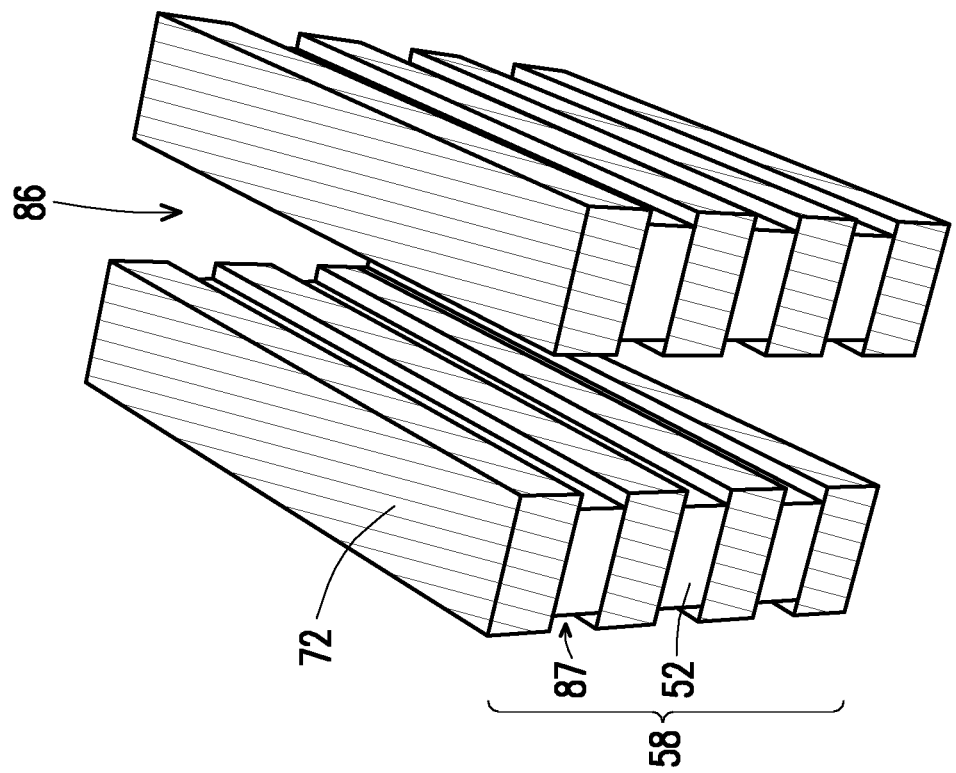
Figure 17B:
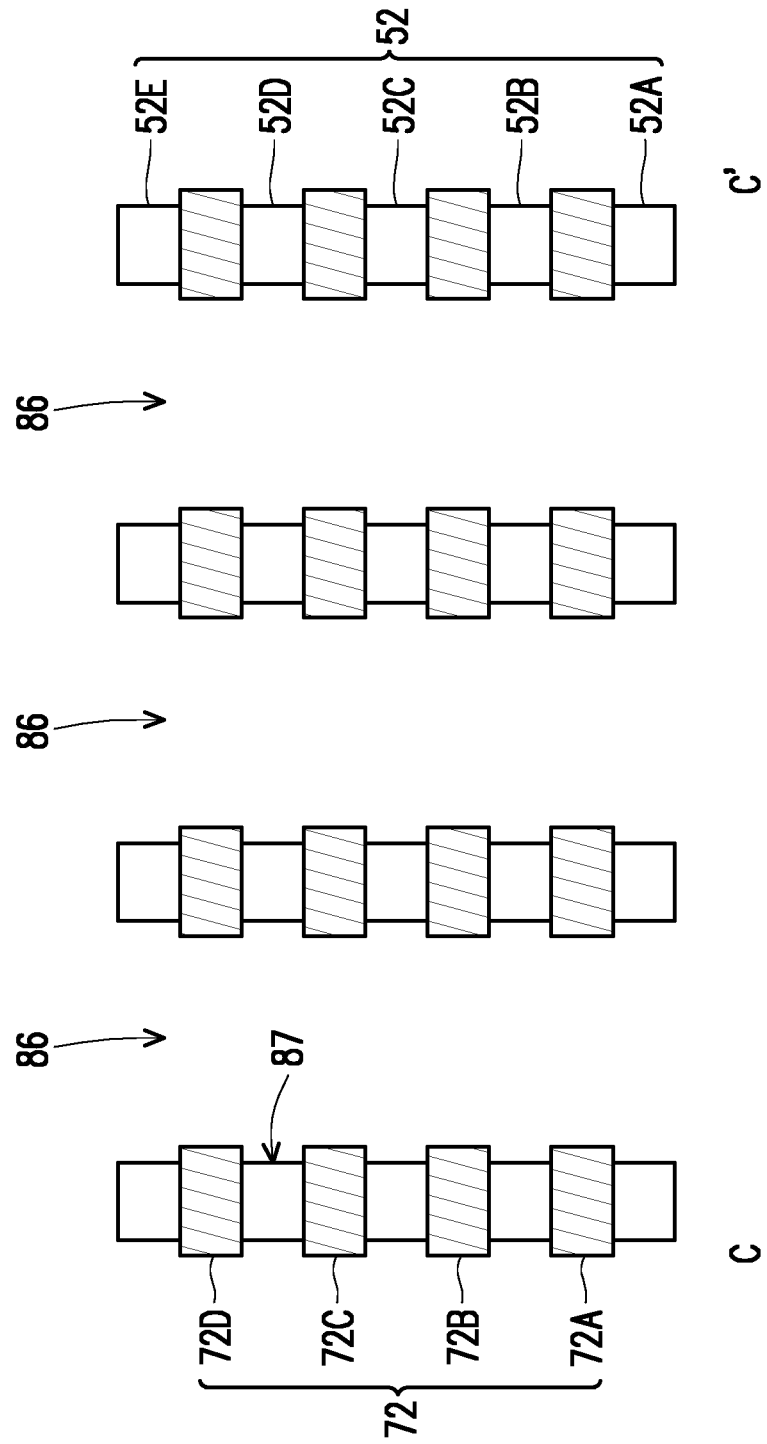
Figure 18A:
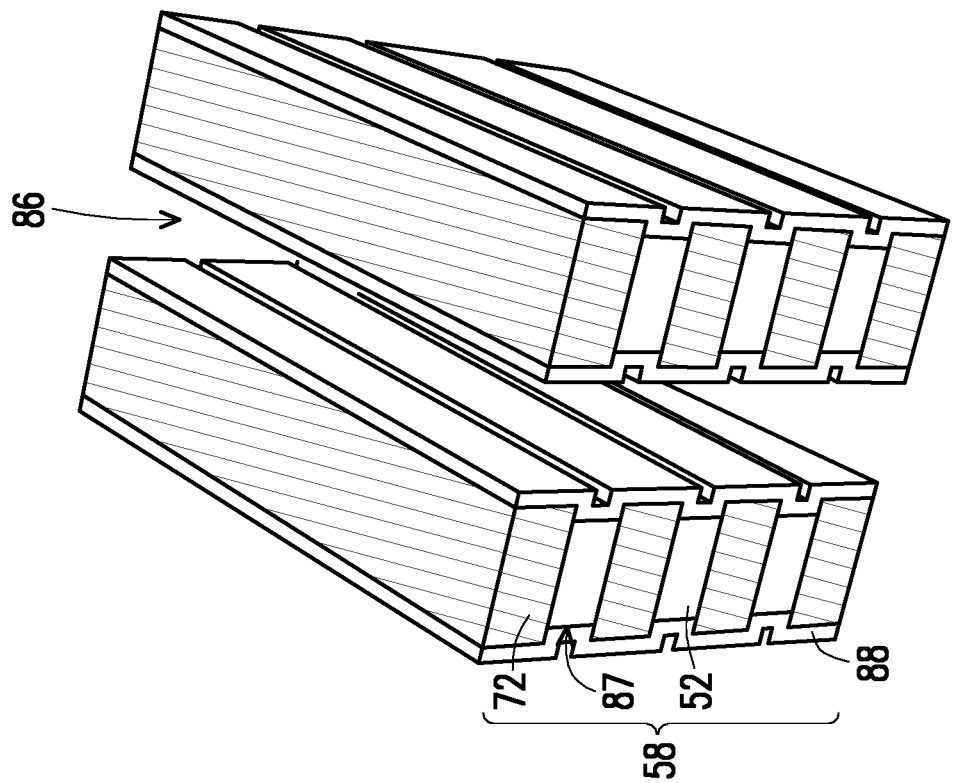
Figure 18B:
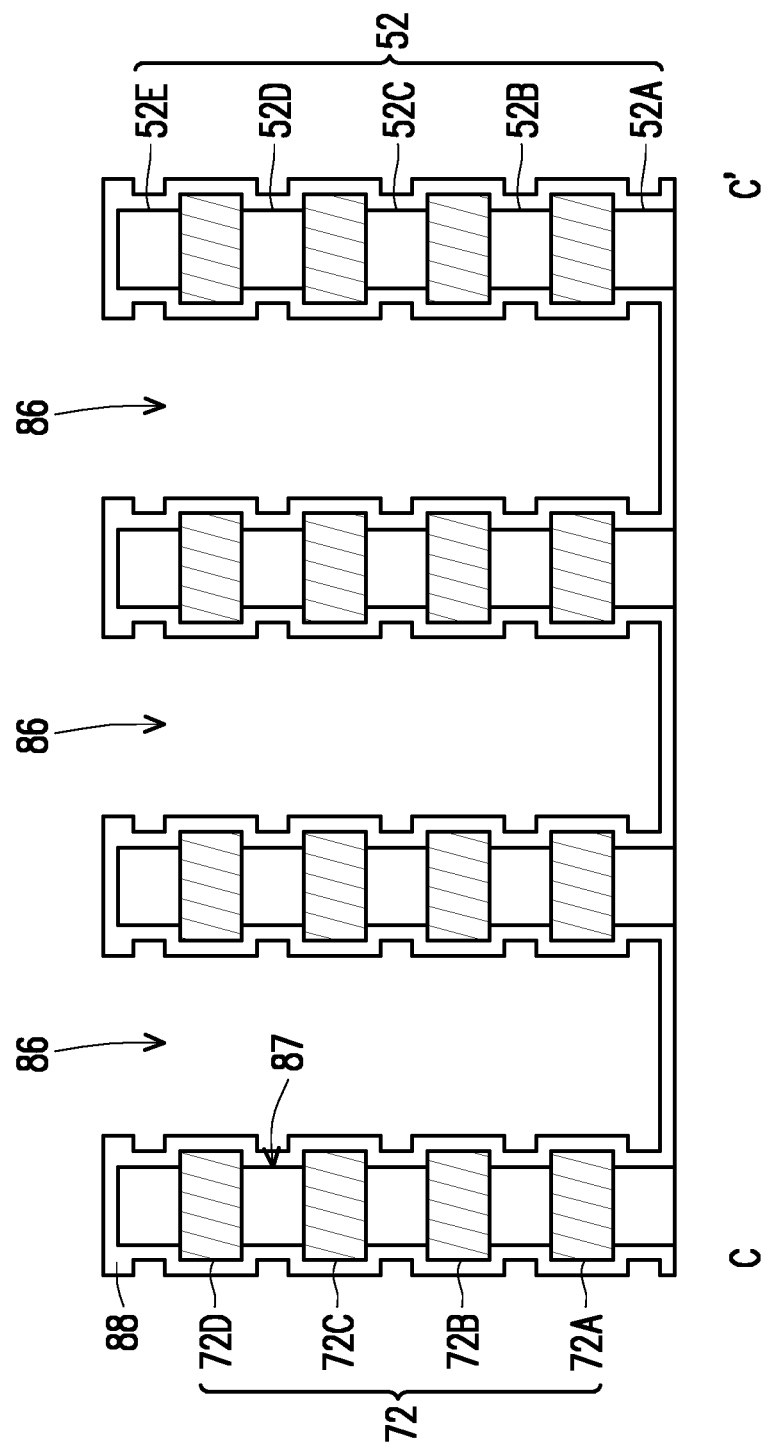
Figure 19A:
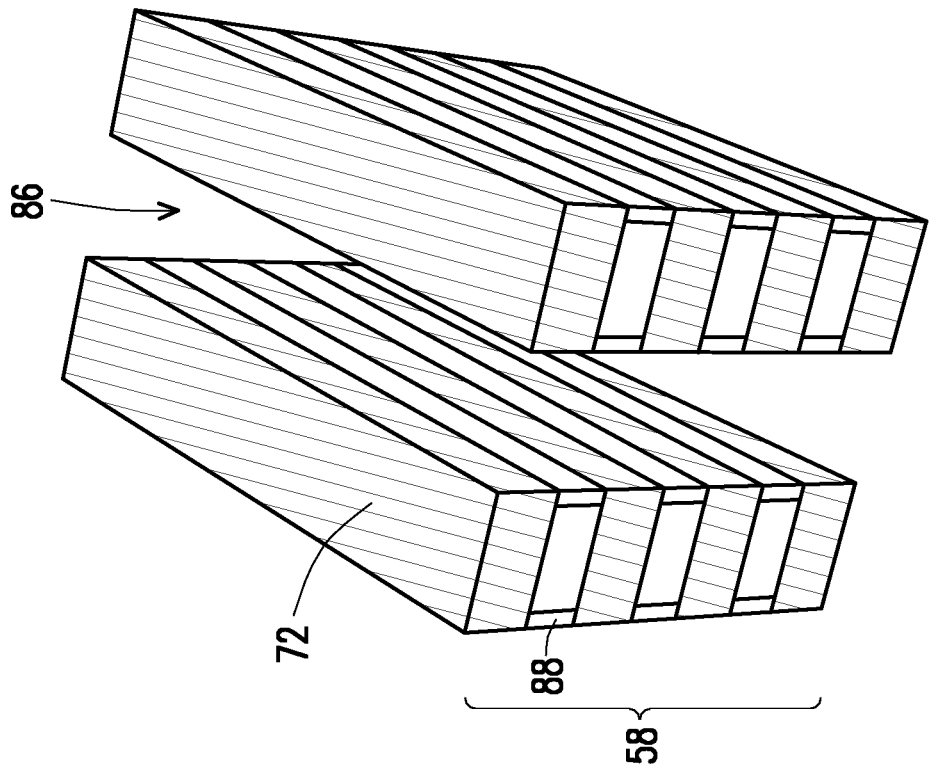
Figure 19B:
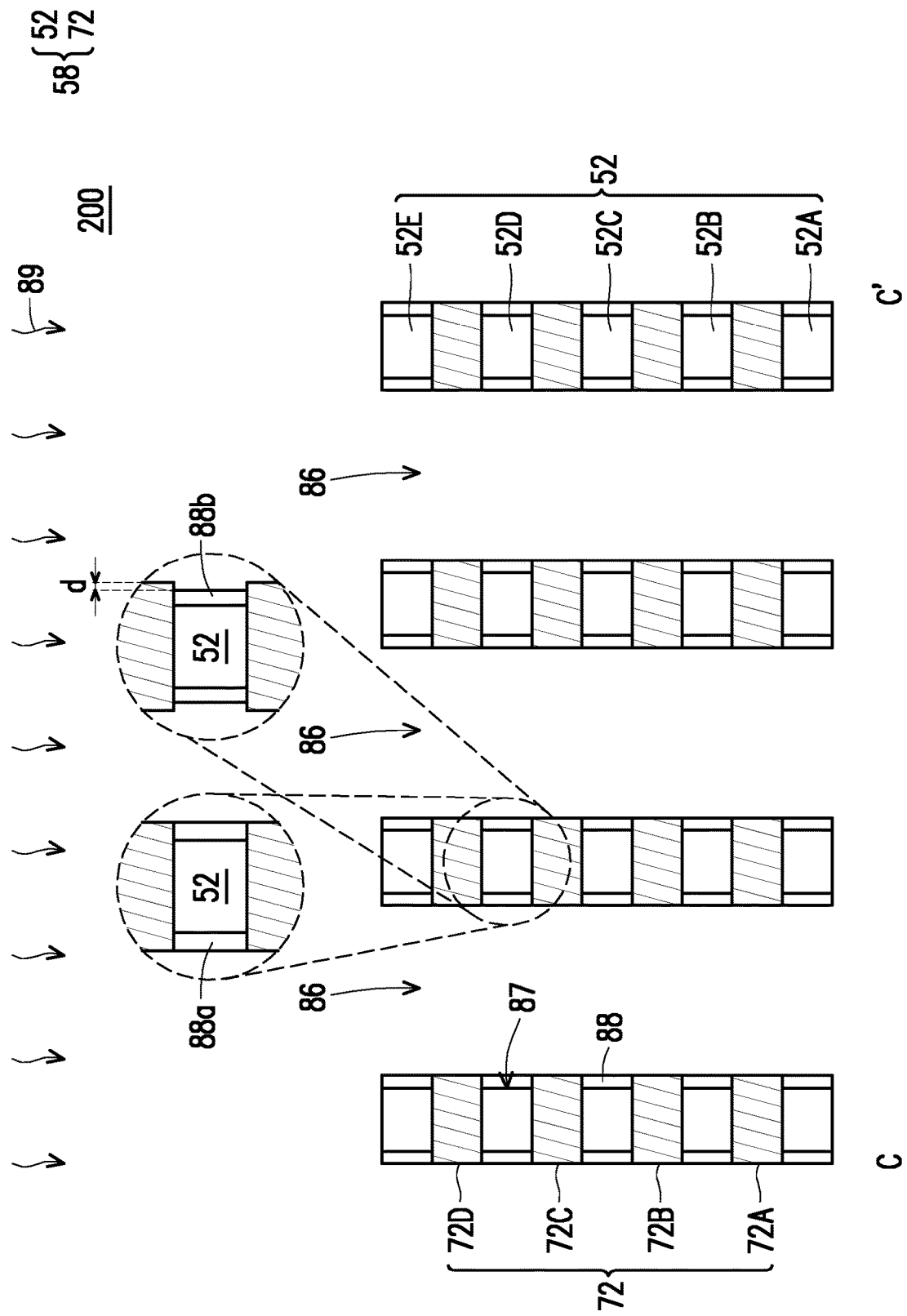

FIGS. 17A through 19B illustrate forming buffer layers 88 on sidewalls of the dielectric layers 52 of the multi-layer stack 58. FIGS. 17A, 18A and 19A are illustrated in a partial three-dimensional view. In FIGS. 17B, 18B and 19B, cross-sectional views are provided along line C-C' of FIG. 1A.

In FIGS. 17A and 17B, the dielectric layers 52 of the multi-layer stack 58 are recessed, so that a recess 87 is formed between the two adjacent conductive lines 72. The recesses 87 are connected to (e.g., in spatial communication with) the corresponding trench 86. Specifically, ends of the dielectric layers 52 are recessed, by about 1-5 nm with respect to ends of the conductive lines 72 exposed by the trench 86. In some embodiments, the dielectric layers 52 of the multi-layer stack 58 are trimmed by using an acceptable removing technique such as a lateral etching. The etching may include a dry etch (e.g., RIE, NBE, the like), a wet etch, the like, or a combination thereof. The etching may be anisotropic. Upon the recessing process, the multi-layer stack 58 has a curvy sidewall. Specifically, the ends of the conductive lines 72 are protruded from the ends of the remaining dielectric layers 52.

In FIG. 18A and FIG. 19B, a buffer layer 88 is formed within each of the recesses 87. In some embodiments, a buffer layer 88 is conformally and continuously formed on the top and the sidewall of the multi-layer stack 58. Specifically, the buffer layer 88 may be deposited conformally in the trenches 86 along sidewalls of the conductive lines 72 and the dielectric layers 52 and fills in the recesses 87, along top surfaces of the dielectric layer 52E, and along the bottom surfaces of the trenches 86. In some embodiments, the buffer layer 88 includes a high-k material such as a metal oxide. In some embodiments, the metal oxide includes $La_2O_3$, $Al_2O_3$, MgO or a combination thereof, or the like. Other material may be applicable. In some embodiments, other material includes HfZrO (HZO), HfAlO, HfLaO, HfCeO, HfO, HfGdO, HfSiO, barium titanium oxide (BaTiO$_3$), lead titanium oxide (PbTiO$_3$), lead zirconium oxide (PbZrO$_3$), lithium niobium oxide (LiNbO$_3$), sodium niobium oxide (NaNbO$_3$), potassium niobium oxide (KNbO$_3$), potassium tantalum oxide (KTaO$_3$), bismuth scandium oxide (BiScO$_3$), bismuth iron oxide (BiFeO$_3$), hafnium erbium oxide (Hf$_{1-x}$Er$_x$O), hafnium lanthanum oxide (Hf$_{1-x}$La$_x$O), hafnium yttrium oxide (Hf$_{1-x}$Y$_x$O), hafnium gadolinium oxide (Hf$_{1-x}$Gd$_x$O), hafnium aluminum oxide (Hf$_{1-x}$Al$_x$O), hafnium titanium oxide (Hf$_{1-x}$Ti$_x$O), hafnium tantalum oxide (Hf$_{1-x}$Ta$_x$O), or the like. In some embodiments, the method of forming the buffer layer 88 includes performing a suitable deposition technique, such as CVD, PECVD, metal oxide chemical vapor deposition (MOCVD), ALD, RPALD, PEALD, MBD or the like.

In some embodiments, the buffer layer 88 has a thickness of about 1-5 nm, such as 2 nm, 3 nm, 4 nm or 5 nm. Other thickness ranges (e.g., more than 5 nm or 1-10 nm) may be applicable. In some embodiments, the buffer layer 88 is formed in a fully amorphous state. In alternative embodiments, the buffer layer 88 is formed in a partially crystalline state; that is, the buffer layer 88 is formed in a mixed crystalline-amorphous state and having some degree of structural order. In yet alternative embodiments, the buffer layer 88 is formed in a fully crystalline state. In some embodiments, the buffer layer 88 is a single layer. In alternative embodiments, the buffer layer 88 is a multi-layer structure including an inner liner (e.g., Al$_2$O$_3$) in contact with the corresponding dielectric layer 52 and an outer liner (e.g., La$_2$O$_3$) outside of the inner liner.

In FIG. 19A and FIG. 19B, an etching back process is performed to the continuous buffer layer 88. An acceptable etch back process may be performed to remove excess materials from the sidewalls of the conductive lines 72 and the bottom surfaces of the trenches 86. The acceptable etch back process includes a dry etch (e.g., RIE, NBE, the like), a wet etch, the like, or a combination thereof. The etching may be anisotropic.

Upon the etching back process, the continuous buffer layer of FIG. 18B is divided into a plurality of separate buffer layers 88 in FIG. 19B. The separate buffer layers 88 are embedded in the recesses 87, respectively. In some embodiments, the separate buffer layers 88 are referred to as a discontinuous buffer layer, and portions of the buffer layer are embedded in the recesses 87, respectively. In some embodiments, as shown in the local enlarged view on the left-top of FIG. 19B, the sidewall of each buffer layer 88a is substantially level with the sidewalls of the adjacent conductive lines 72. In some embodiments, as shown in the local enlarged view on the right-top of FIG. 19B, the sidewall of each buffer layer 88b is slightly recessed from the sidewalls of the adjacent conductive lines 72 by a non-zero distance d. The non-zero distance d ranges from about 1-5 nm, for example.

Thereafter, an annealing process 89 is performed to the buffer layers 88. The temperature range of the annealing process 89 ranges from about 300° C. to about 450° C. (e.g., 350° C. to about 400° C.), so as to achieve a desired crystalline lattice structure for the buffer layers 88. In some embodiments, upon the annealing process 89, the buffer layers 88 are transformed from an amorphous state to a partially or fully crystalline sate. In alternative embodiments, upon the annealing buffer layers 88 are transformed from a partially crystalline state to a fully crystalline sate.

Figure 20A:
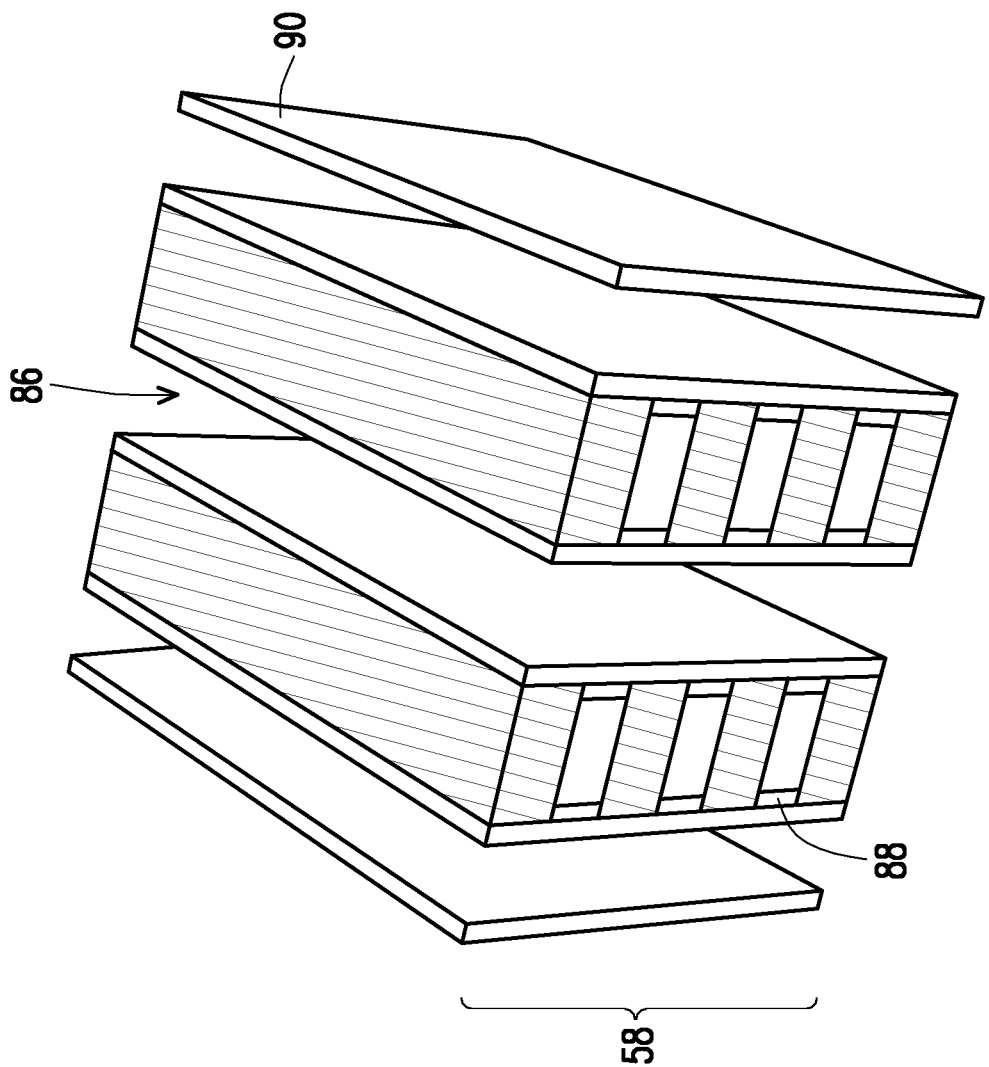

FIGS. 20A through 25B illustrate forming and patterning channel regions for the memory cells 202 (see FIG. 1A) in the trenches 86. FIGS. 20A, 21A and 25A are illustrated in a partial three-dimensional view. In FIGS. 20B, 21B, 22, 23, 24 and 25B cross-sectional views are provided along line C-C' of FIG. 1A.

In some embodiments, the buffer layer of FIG. 18B is further formed on the IMD 70 and along the sidewall of each strip-shaped staircase structure, and the etching back process of FIG. 19B is further performed to the buffer layer in the staircase region. Accordingly, each of the dielectric steps of the staircase structure includes a dielectric layer 52 and two buffer layers 88 beside the dielectric layer 52, as shown in FIG. 1A.

In FIGS. 20A through 23, a ferroelectric layer 90, a channel layer 92, and a dielectric material 98A are deposited in the trenches 86.

Figure 20B:
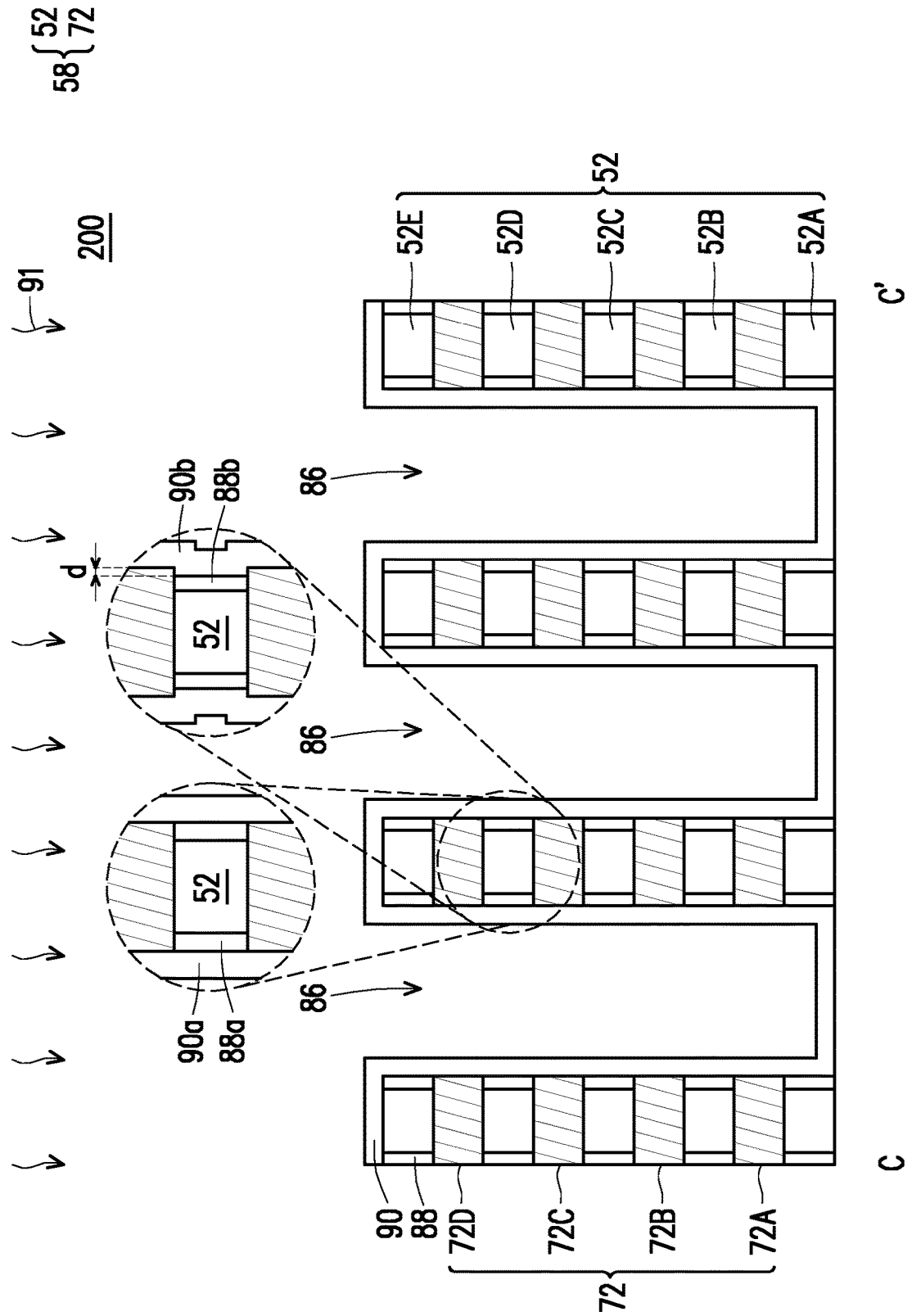

In FIGS. 20A and 20B, a ferroelectric layer 90 may be deposited conformally in the trenches 86 along sidewalls of the conductive lines 72 and the buffer layers 88 and along top surfaces of the dielectric layer 52E, and along the bottom surfaces of the trenches 86. In some embodiments, a ferroelectric layer 90 may be further deposited on the IMD 70 and along the sidewall of each step of the staircase structure in the staircase region. The ferroelectric layer 90 may include materials that are capable of switching between two different polarization directions by applying an appropriate voltage differential across the ferroelectric layer 90. For example, the ferroelectric layer 90 includes a high-k dielectric material, such as a hafnium (Hf) based dielectric materials or the like. In some embodiments, the ferroelectric layer 90 includes hafnium oxide, hafnium zirconium oxide, silicon-doped hafnium oxide, or the like.

In some embodiments, the ferroelectric layer 90 is hafnium oxide (HfO$_2$) doped by Al, Si, Zr, La, Gd, or Y, in an embodiment. In some embodiments, a ferroelectric material, such as HZO, HSO, HfSiO, HfLaO, HfZrO$_2$ (HZO), or ZrO$_2$, is used as the ferroelectric material. A suitable formation method, such as PVD, CVD, ALD, or the like, may be used to form the ferroelectric layer 90.

In some embodiments, the ferroelectric layer 90 has a thickness of about 1-20 nm, such as 5-10 nm. Other thickness ranges (e.g., more than 20 nm or 5-15 nm) may be applicable. The thickness ratio of ferroelectric layer 90 to the buffer layer 88 ranges from about 1:1 to 1:20, such as 1:5 to 1:10. In some embodiments, the ferroelectric layer 90 is formed in a fully amorphous state. In alternative embodiments, the ferroelectric layer 90 is formed in a partially crystalline state; that is, the ferroelectric layer 90 is formed in a mixed crystalline-amorphous state and having some degree of structural order. In yet alternative embodiments, the ferroelectric layer 90 is formed in a fully crystalline state. In some embodiments, the ferroelectric layer 90 is a single layer. In alternative embodiments, the ferroelectric layer 90 is a multi-layer structure.

In some embodiments, as shown in the local enlarged view on the left-top of FIG. 20B, the ferroelectric layer 90a is conformally formed on the sidewall of the multi-layer stack 58 and therefore has a substantially smooth sidewall profile. In some embodiments, the opposite surfaces of the ferroelectric layer 90a close to the buffer layer 88a and away from the buffer layer 88a are substantially straight, as shown in the local enlarged view on the left-top of FIG. 20B.

In some embodiments, as shown in the local enlarged view on the right-top of FIG. 20B, the ferroelectric layer 90b is conformally formed on the sidewall of the multi-layer stack 58 and therefore has an uneven and wavy sidewall profile. In some embodiments, the opposite surfaces of the ferroelectric layer 90b close to the buffer layer 88b and away from the buffer layer 88b are uneven and wavy, as shown in the local enlarged view on the right-top of FIG. 20B. In some embodiments, the surface of the ferroelectric layer 90b close to the buffer layer 88b is wavy while the surface of the ferroelectric layer 90b away from the buffer layer 88b is substantially straight.

Thereafter, an annealing process 91 is performed to the ferroelectric layer 90. The temperature range of the annealing process 91 ranges from about 300° C. to about 450° C. (e.g., 350° C. to about 400° C.), so as to achieve a desired crystalline lattice structure for the ferroelectric layer 90. In some embodiments, upon the annealing process 91, the ferroelectric layer 90 is transformed from an amorphous state to a partially or fully crystalline sate. In alternative embodiments, upon the annealing ferroelectric layer 90 is transformed from a partially crystalline state to a fully crystalline sate.

In some embodiments, each buffer layer 88 includes a material different from that of the ferroelectric layer 90. For example, each buffer layer 88 includes $La_2O_3$, $Al_2O_3$, MgO or a combination thereof, and the ferroelectric layer 90 includes HfZrO, HfAlO, HfLaO, HfCeO, HfO, HfGdO, HfSiO or a combination thereof, or the like. In alternative embodiments, the buffer layers 88 and the ferroelectric layer 90 include the same material such as HfZrO (HZO).

In some embodiments, a metal oxide buffer layer 88 is disposed between the ferroelectric layer 90 and each of the dielectric layers 52. Metal oxide partially replaces silicon oxide and mimics metal surface, so the ferroelectric layer 90 is grown more uniformly, and the device performance is accordingly improved.

Figure 21A:
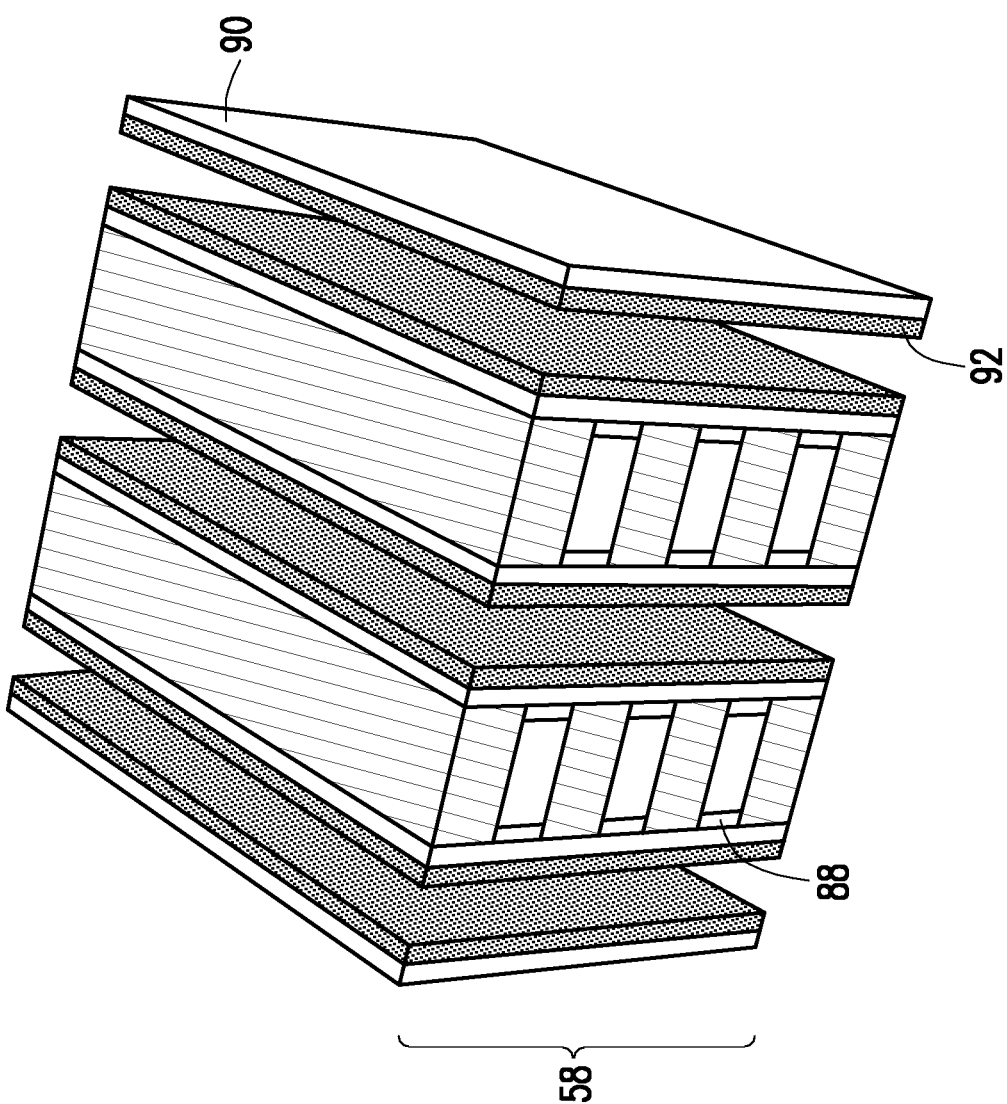
Figure 21B:
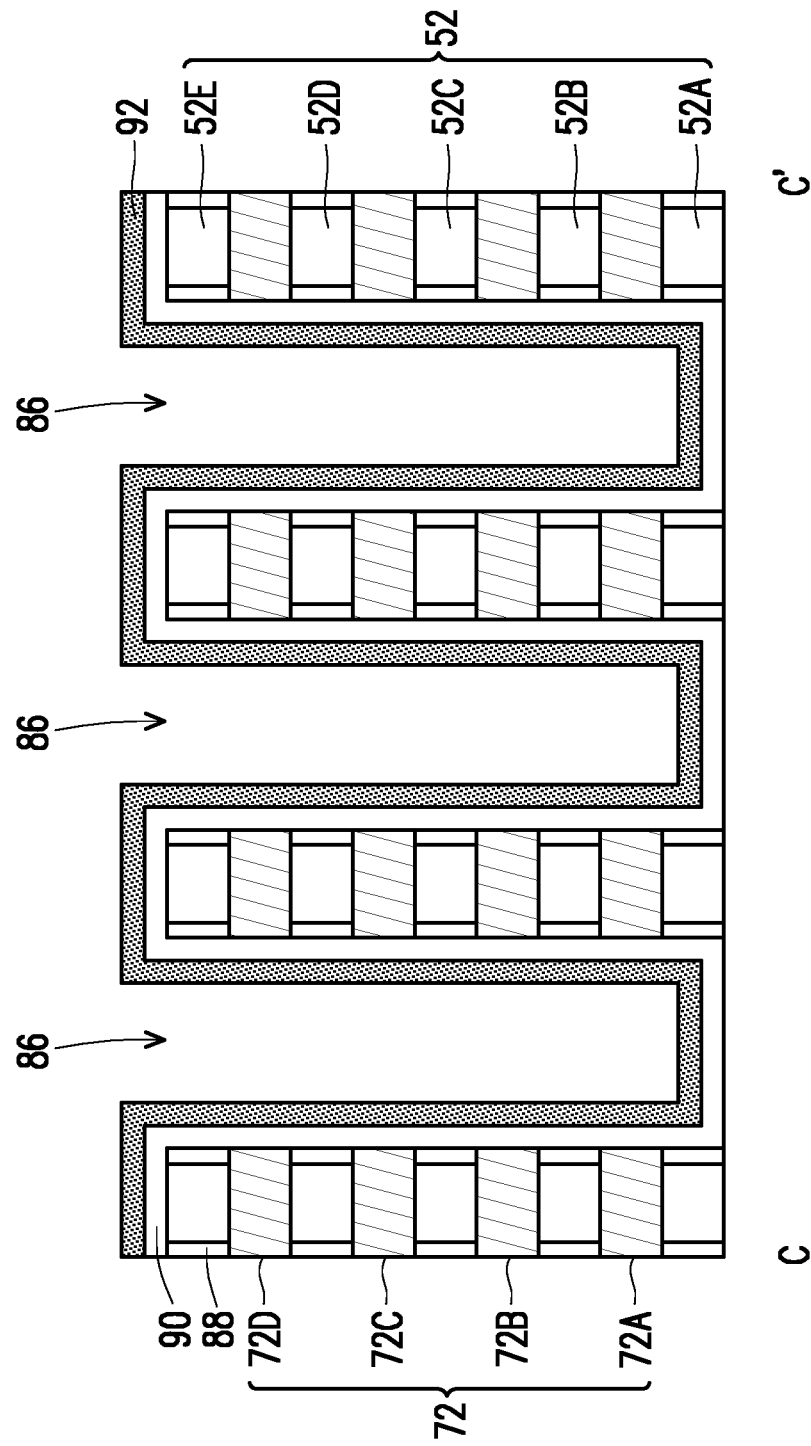

In FIGS. 21A and 21B, a channel layer 92 is conformally deposited in the trenches 86 over the ferroelectric layer 90. The channel layer 92 includes materials suitable for providing channel regions for the memory cells 202 (see FIG. 1A). For example, the channel layer 92 includes oxide semiconductor (OS) such as zinc oxide (ZnO), indium tungsten oxide (InWO), indium gallium zinc oxide (InGaZnO, IGZO), indium zinc oxide (InZnO), indium tin oxide (ITO), combinations thereof, or the like. In some embodiments, channel layer 92 includes polycrystalline silicon (poly-Si), amorphous silicon (a-Si), or the like. The channel layer 92 may be deposited by CVD, PVD, ALD, PECVD, or the like. The channel layer 92 may extend along sidewalls and bottom surfaces of the trenches 86 over the ferroelectric layer 90. In some embodiments, the channel layer 92 may be further deposited on the IMD 70 and along the sidewall of each step of the staircase structure in the staircase region. After the channel layer 92 is deposited, an annealing step (e.g., at a temperature range of about 300° C. to about 450° C.) in oxygen-related ambient may be performed to activate the charge carriers of the channel layer 92.

Figure 22:
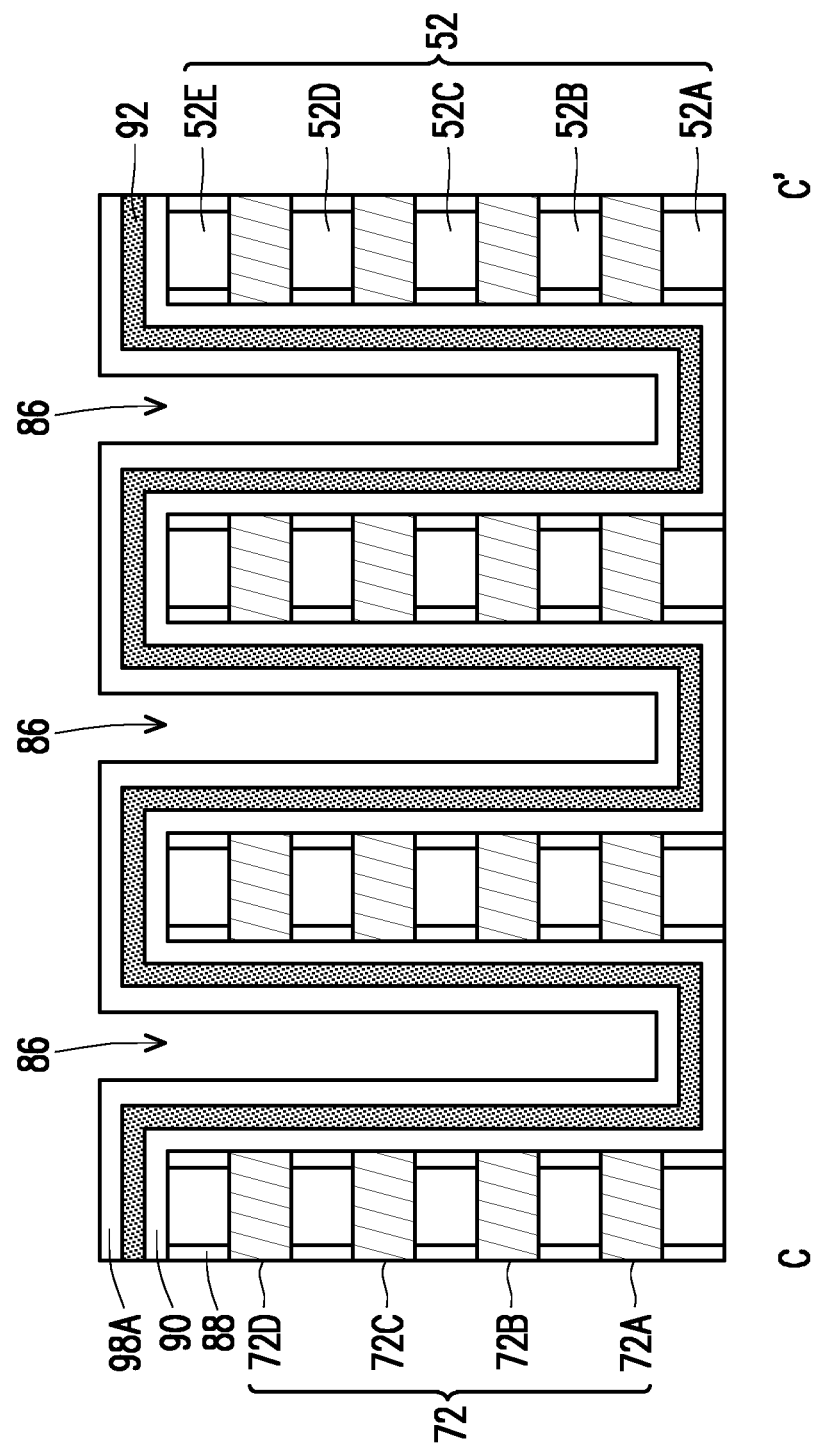

In FIG. 22, a dielectric material 98A is deposited in the trenches 86 over the channel layer 92. In some embodiments, the dielectric material 98A includes silicon oxide, silicon nitride, silicon oxynitride, or the like, which may be deposited by CVD, PVD, ALD, PECVD, or the like. The dielectric material 98A may extend along sidewalls and bottom surfaces of the trenches 86 over the channel layer 92. In some embodiments, the dielectric material 98A is optional and may be omitted as needed.

Figure 23:
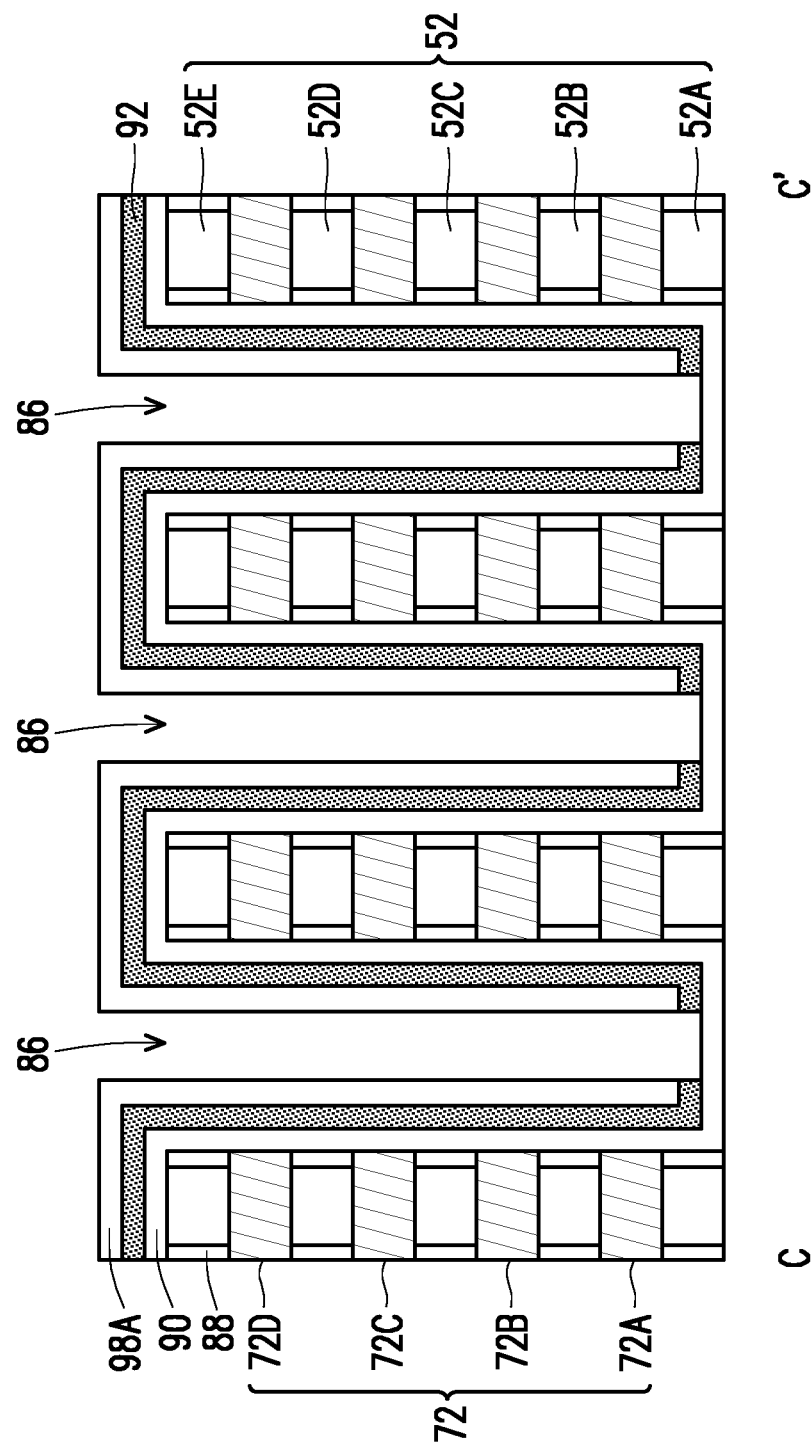

In FIG. 23, bottom portions of the dielectric material 98A and the channel layer 92 are removed in the trenches 86. The removal process includes an acceptable etching process, such as a dry etch (e.g., RIE, NBE, the like), a wet etch, the like, or a combination thereof. The etching may be anisotropic. In some embodiments, the top portions of the dielectric material 98A and the channel layer 92 are removed from the multi-layer stack 58. In some embodiments, removal process includes a combination of photolithography and etching.

Accordingly, the remaining dielectric material 98A and the channel layer 92 may expose portions of the ferroelectric layer 90 on bottom surfaces of the trenches 86. Thus, portions of the channel layer 92 on opposing sidewalls of the trenches 86 may be separated from each other, which improves isolation between the memory cells 202 of the memory array 200 (see FIG. 1A).

Figure 24:
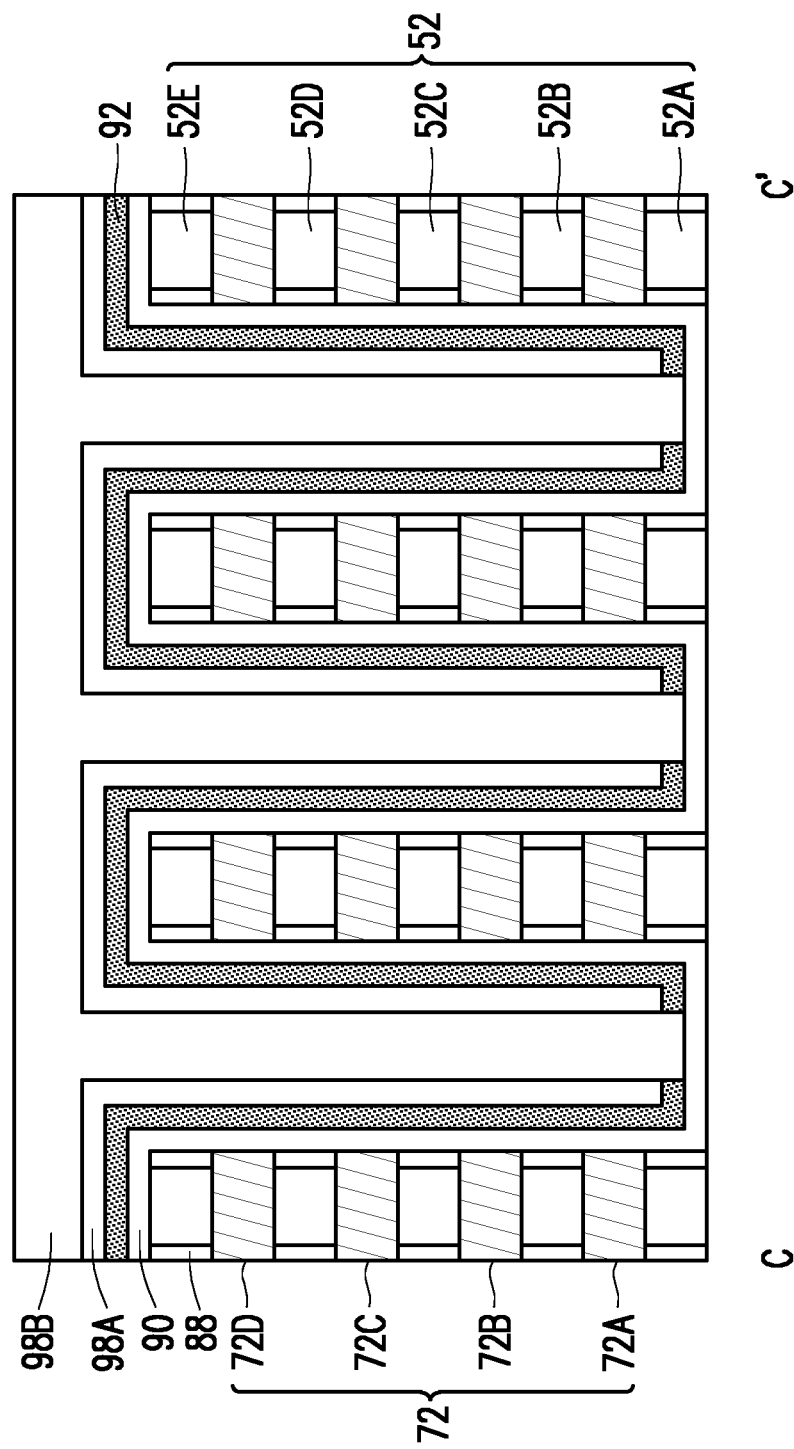

In FIG. 24, a dielectric material 98B is deposited to completely fill the trenches 86. The dielectric material 98B may be formed of one or more materials and by processes the same as or similar to those of the dielectric material 98A. In some embodiments, the dielectric material 98B and the dielectric material 98A include different materials.

Figure 25A:
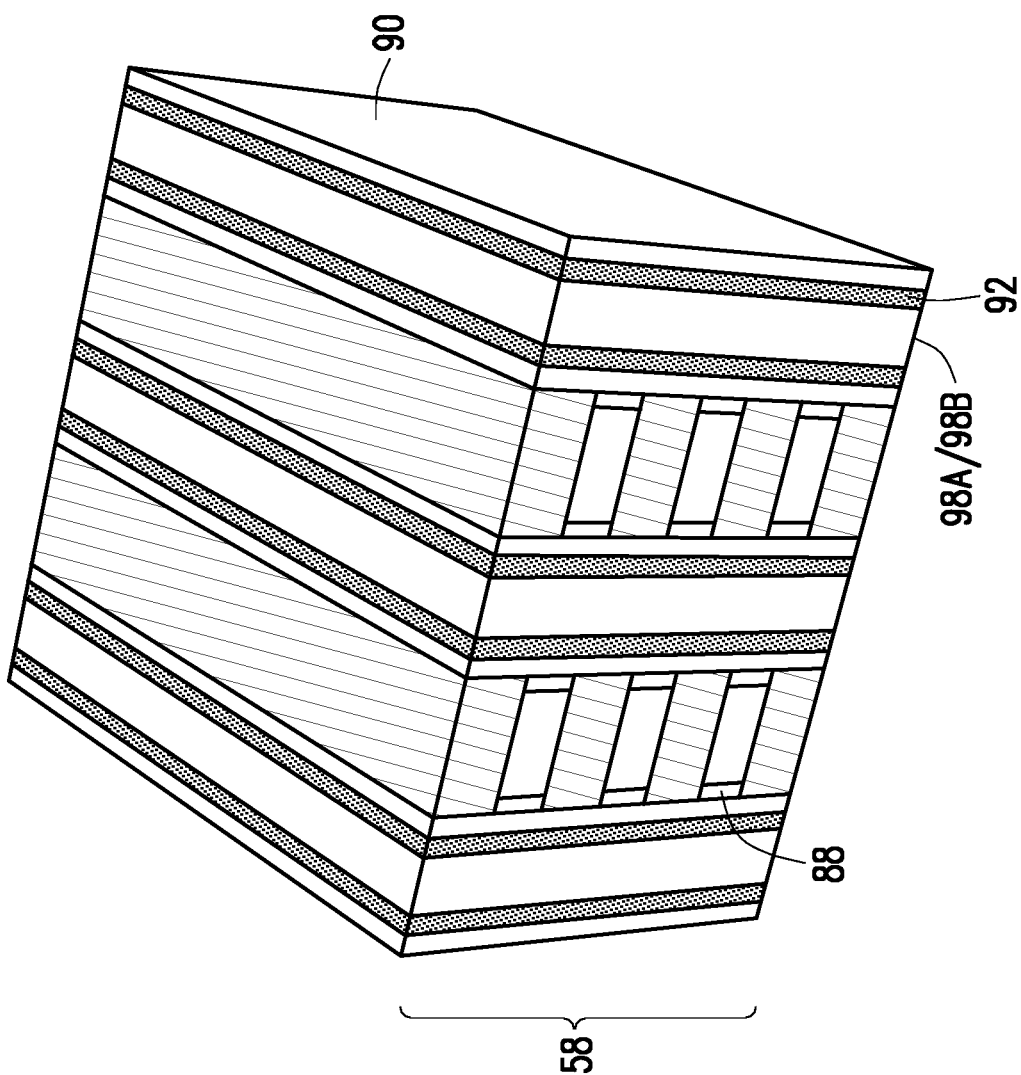
Figure 25B:
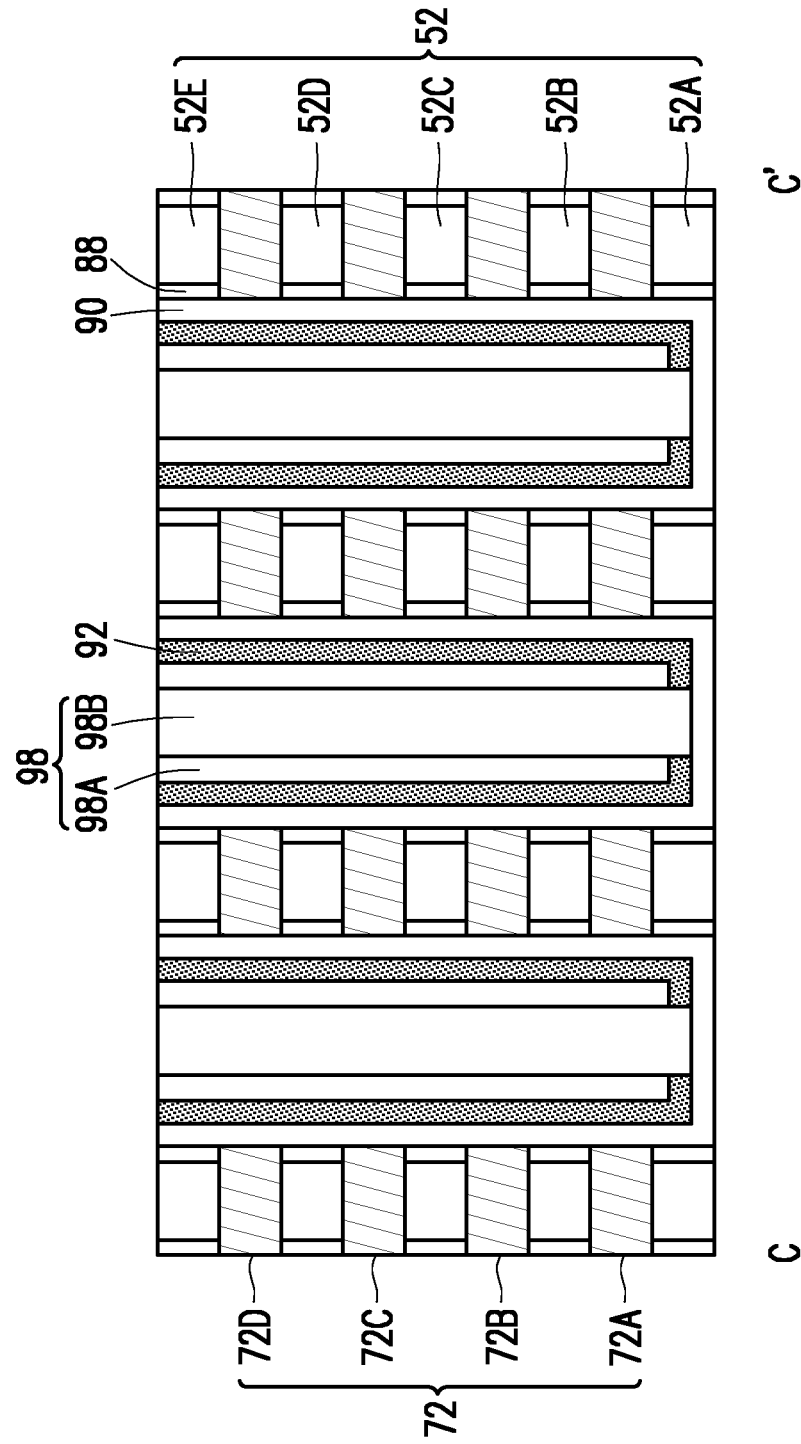

In FIGS. 25A and 25B, a removal process is applied to the dielectric materials 98A/98B, the channel layer 92, and the ferroelectric layer 90 to remove excess materials over the multi-layer stack 58. In some embodiments, a planarization process such as a CMP, an etch-back process, combinations thereof, or the like may be utilized. The planarization process exposes the multi-layer stack 58 such that top surfaces of the multi-layer stack 58 (e.g., the dielectric layer 52E), the ferroelectric layer 90, the channel layer 92, the dielectric materials 98A/98B, and the IMD 70 are level after the planarization process is complete.

Figure 27A:
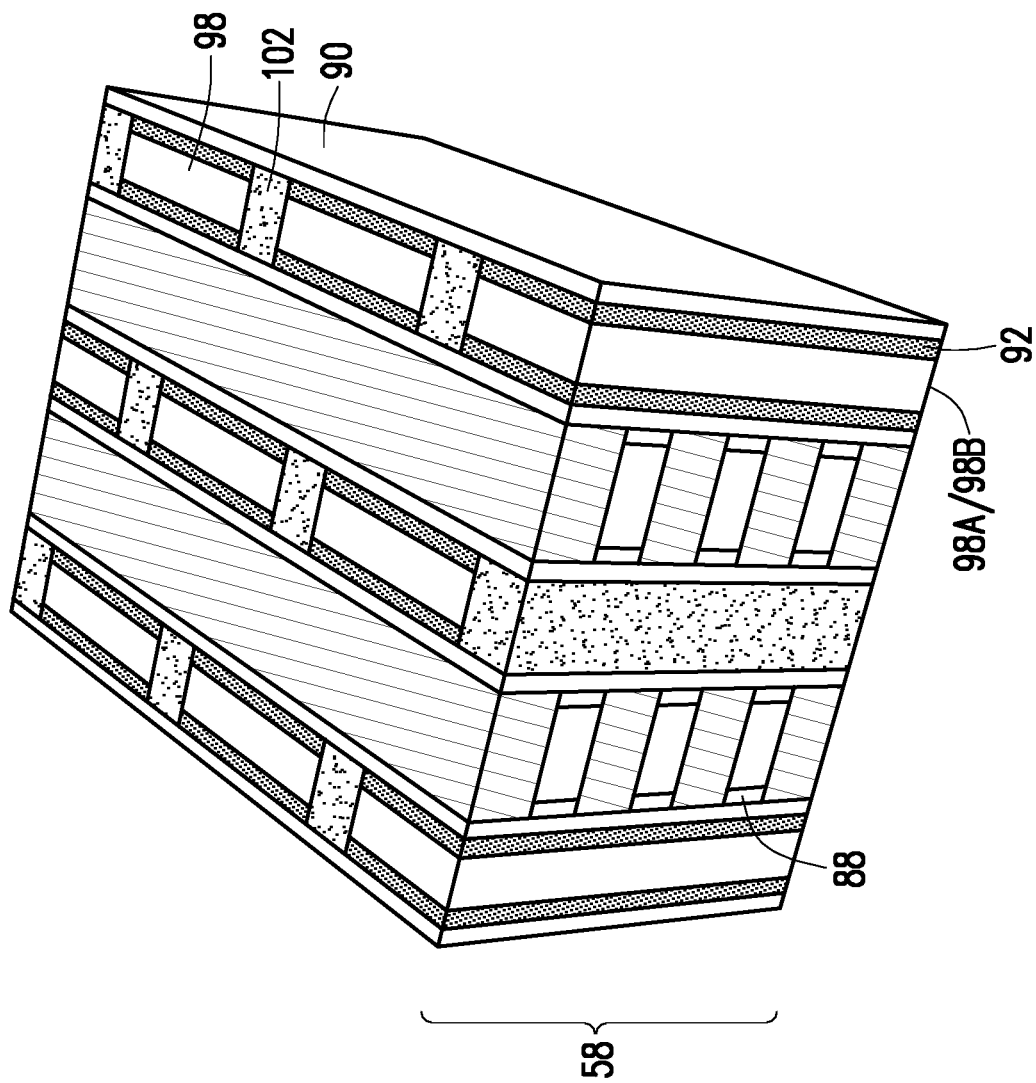
Figure 27B:
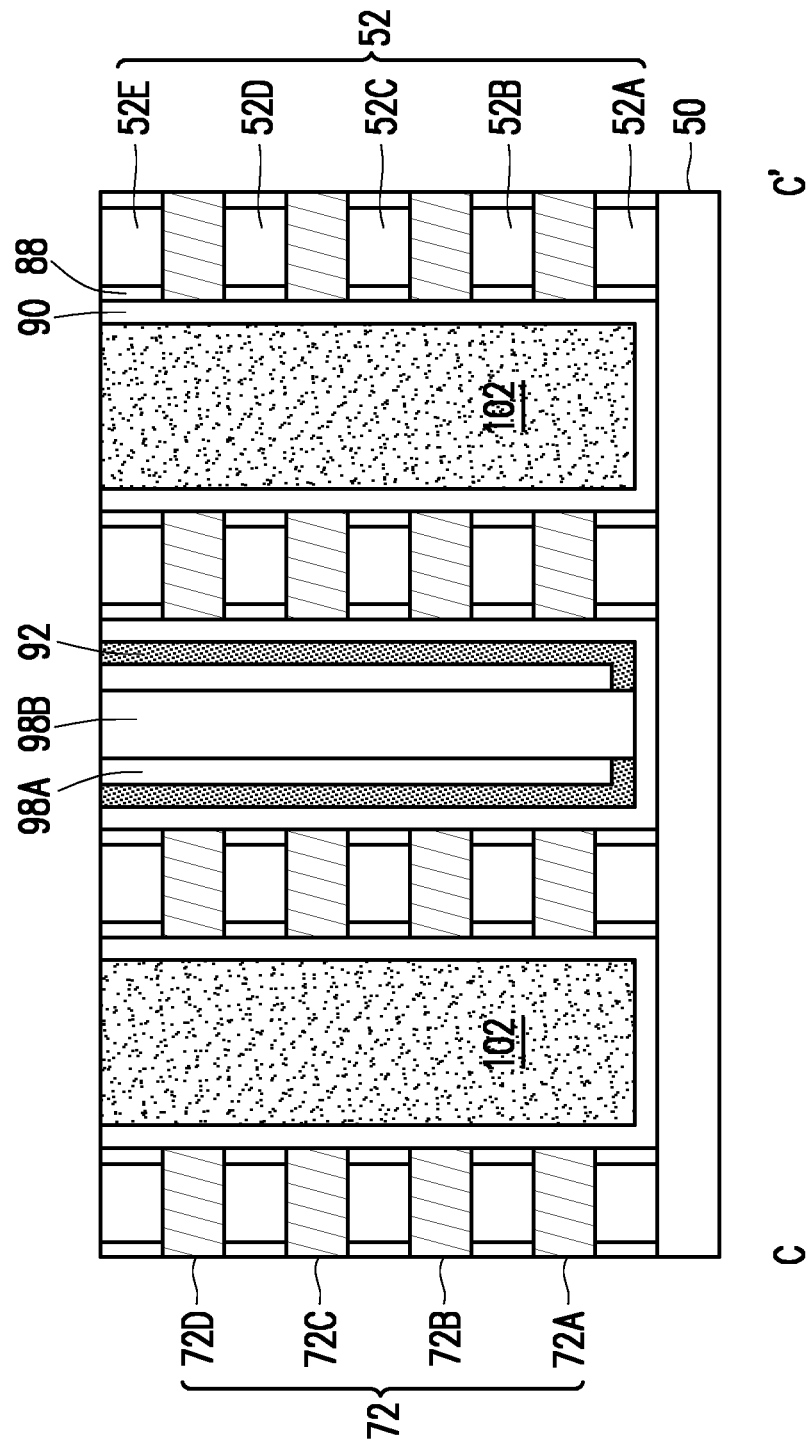
Figure 28A:
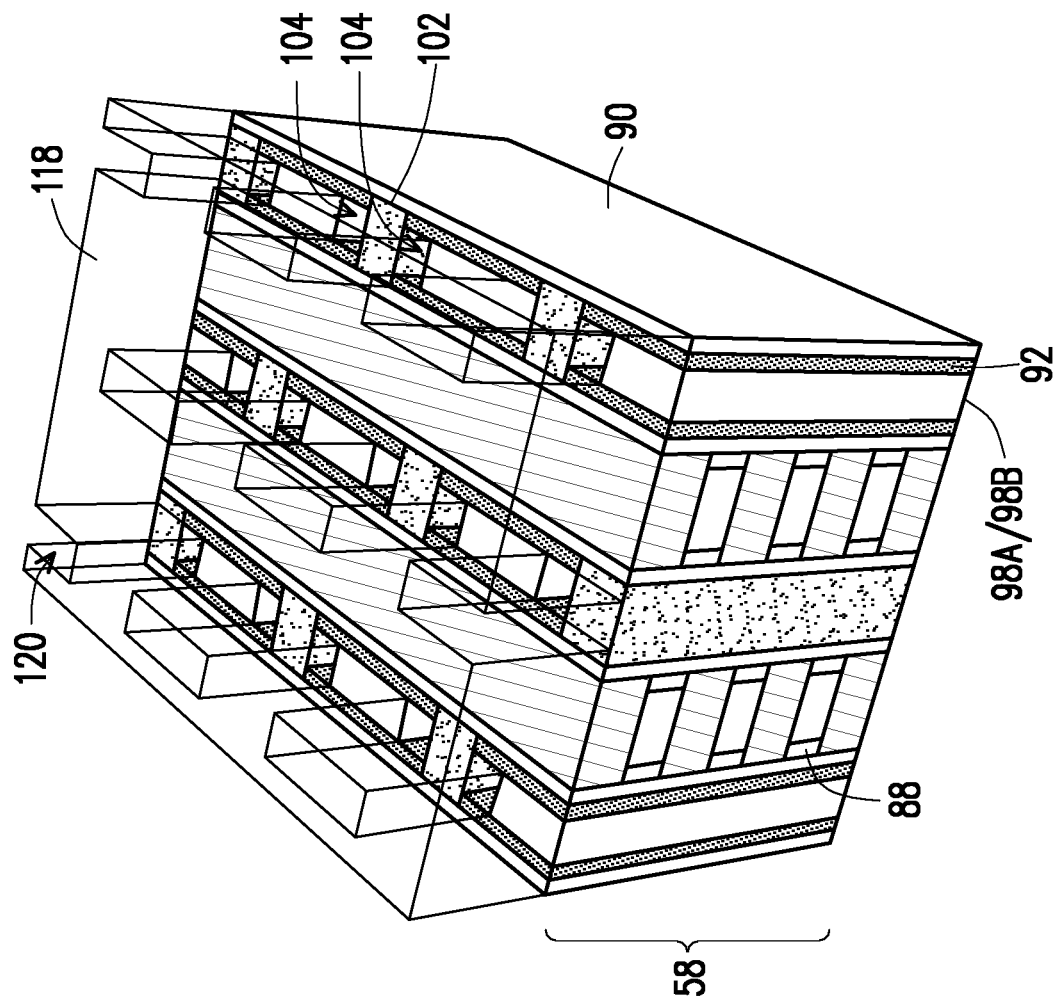
Figure 28B:
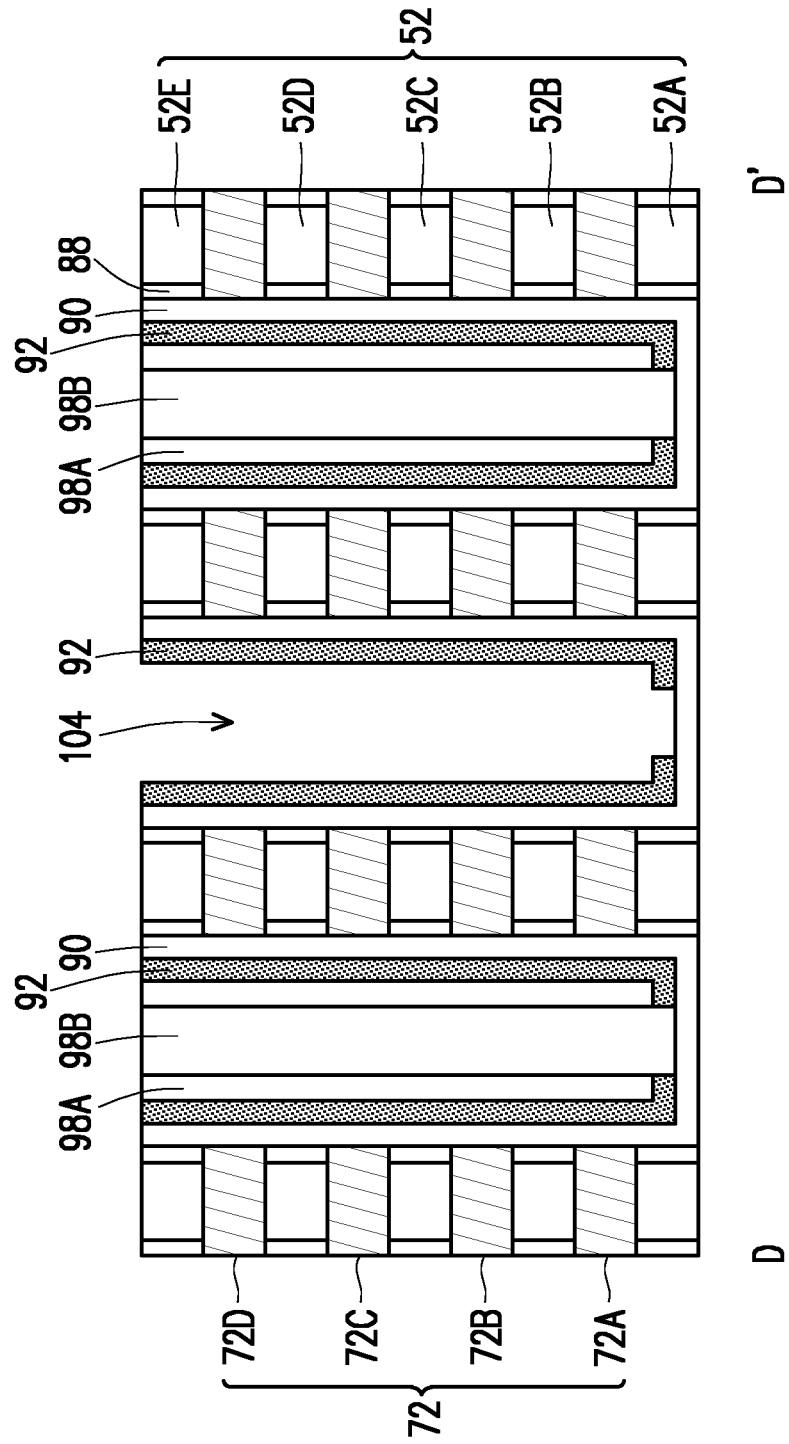
Figure 29A:
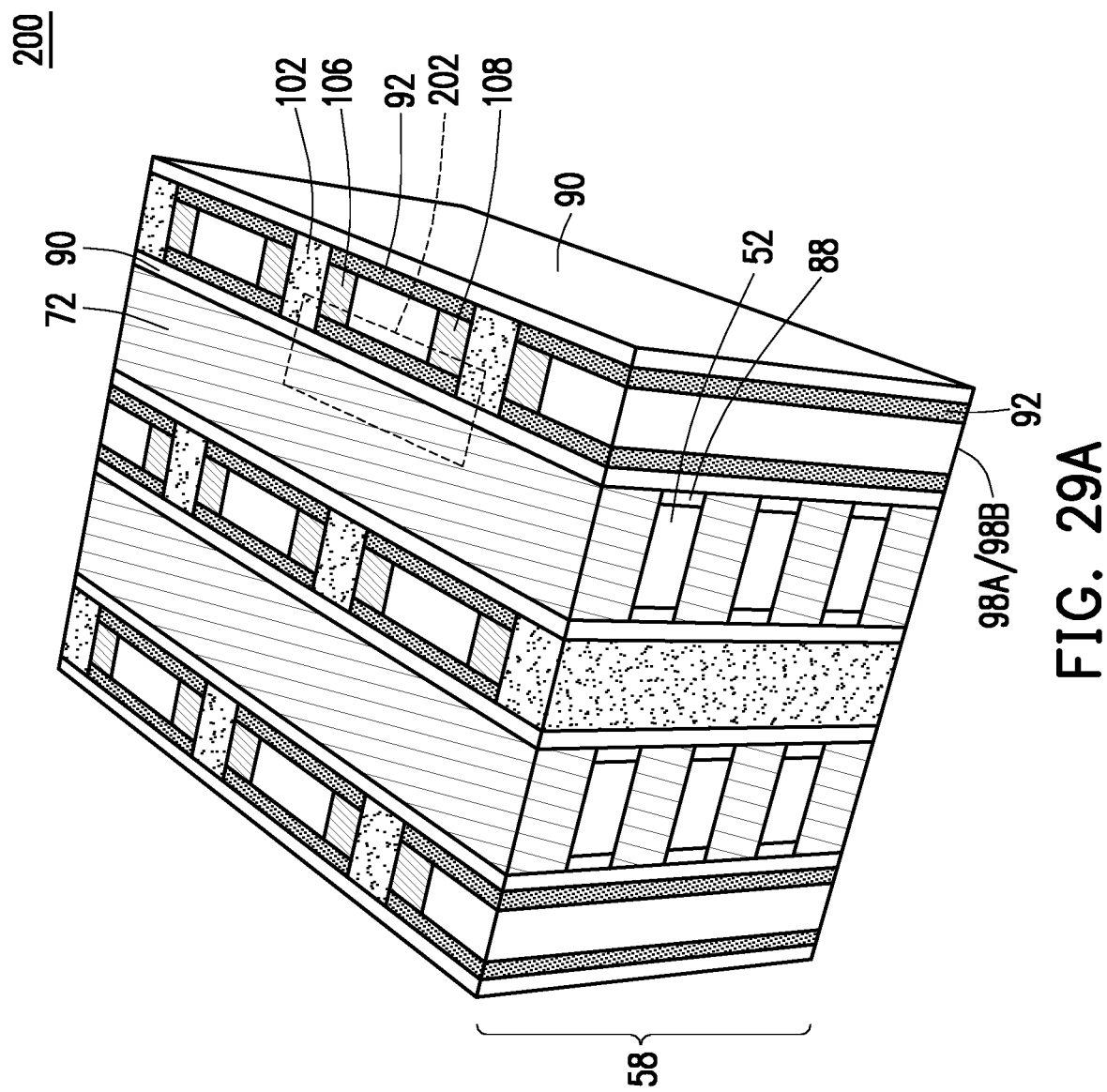
Figure 29B:
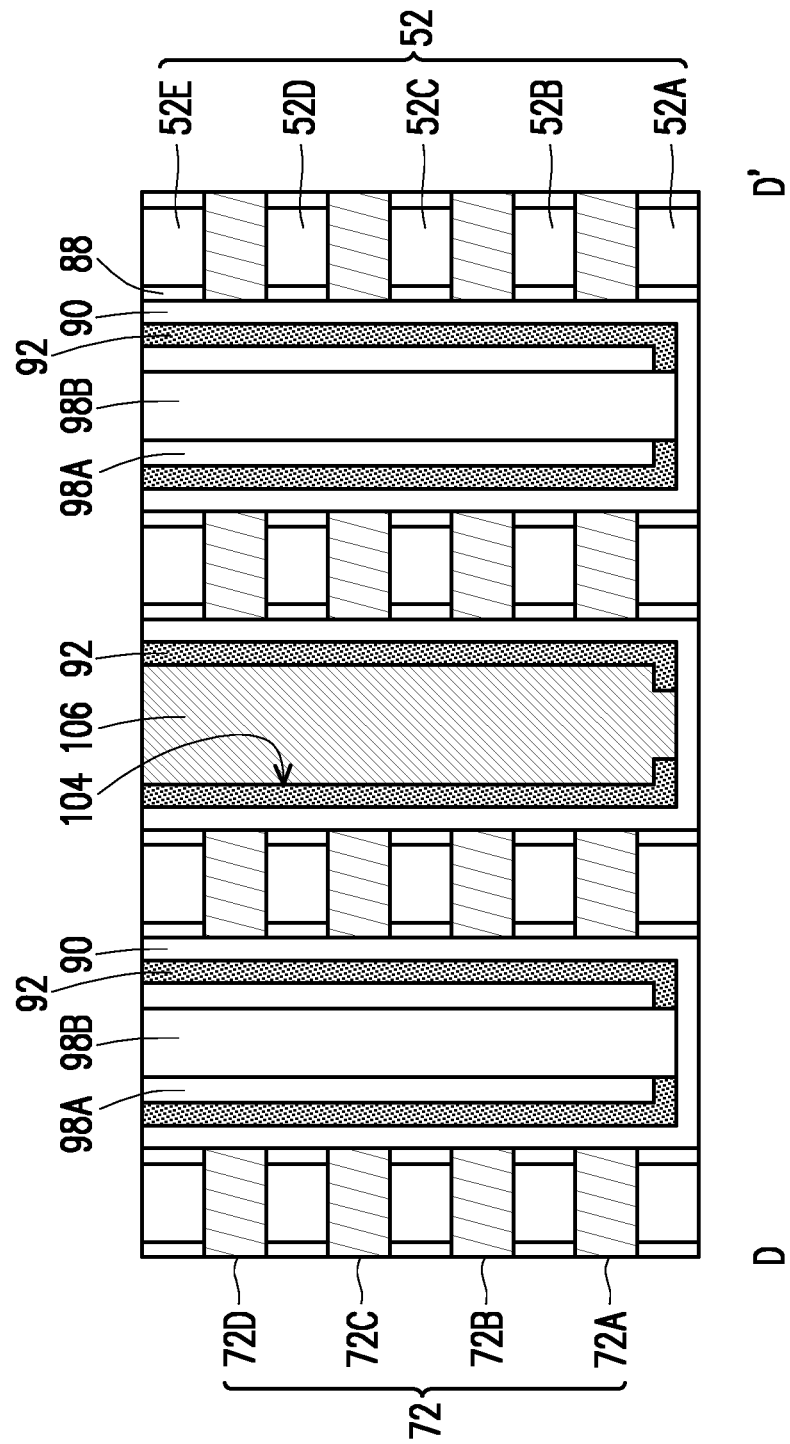

FIGS. 26A through 29B illustrate intermediate steps of manufacturing conductive pillars 106 and 108 (e.g., source/drain pillars) in the memory array 200. The conductive pillars 106 and 108 may extend along a direction perpendicular to the conductive lines 72 such that individual cells of the memory array 200 may be selected for read and write operations. FIGS. 26A, 27A, 28A and 29A are illustrated in a partial three-dimensional view. In FIGS. 26B and 27B, cross-sectional views are provided along line C-C' of FIG. 1A. In FIGS. 28B and 29B, cross-sectional views are provided along line D-D' of FIG. 1A.

Figure 26A:
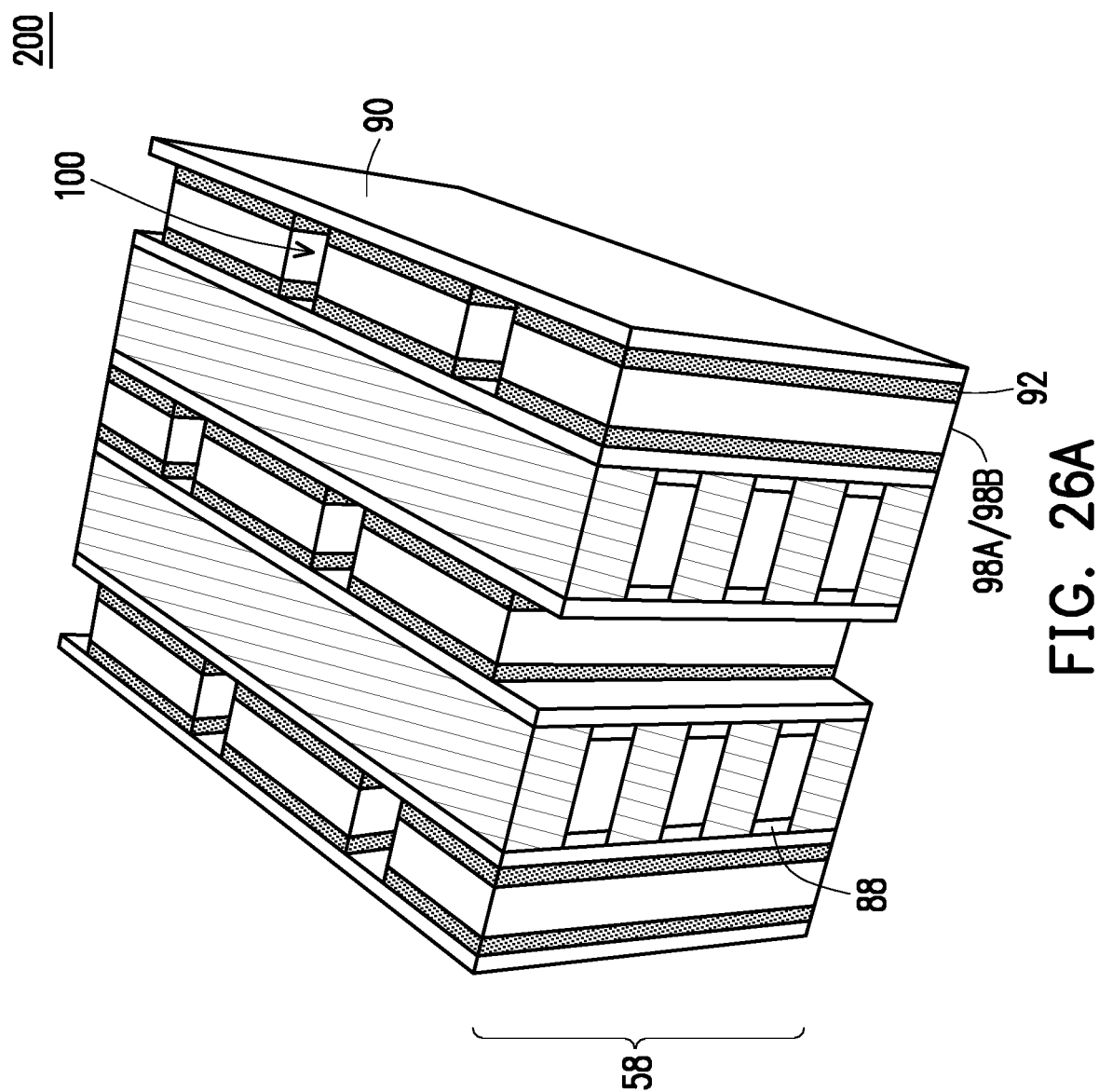
Figure 26B:
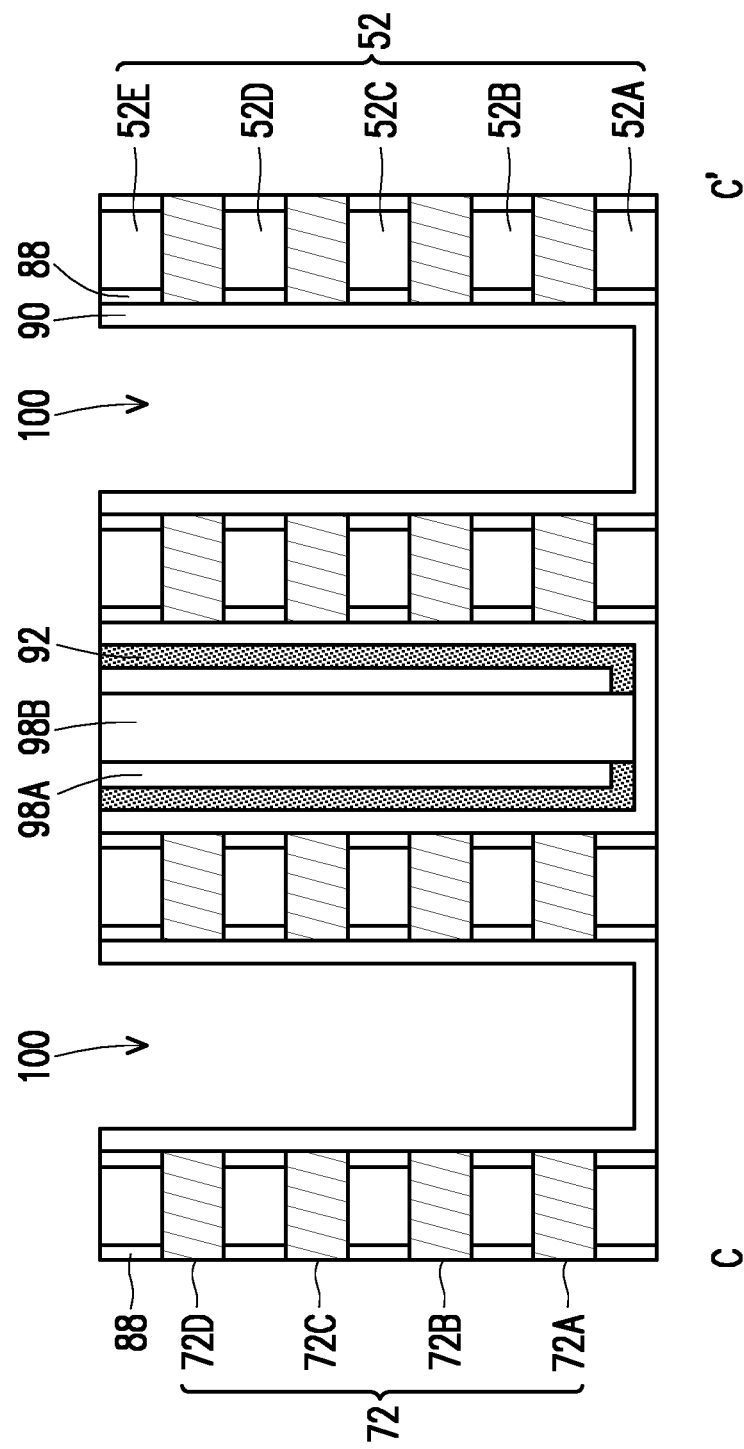

In FIGS. 26A and 26B, trenches 100 are patterned through the channel layer 92 and the dielectric materials 98A/98B. Patterning the trenches 100 may be performed through a combination of photolithography and etching, for example. The trenches 100 may be disposed between opposing sidewalls of the ferroelectric layer 90, and the trenches 100 may physically separate adjacent stacks of memory cells in the memory array 200 (see FIG. 1A).

In FIGS. 27A and 27B, isolation pillars 102 are formed in the trenches 100. In some embodiments, an isolation layer is deposited over the multi-stack 58 filling in the trenches 100. The isolation layer may include, for example, silicon oxide, silicon nitride, silicon oxynitride, or the like, which may be deposited by CVD, PVD, ALD, PECVD, or the like. The isolation layer may extend along sidewalls and bottom surfaces of the trenches 100 over the channel layer 92. After deposition, a planarization process (e.g., a CMP, etch back, or the like) may be performed to remove excess portions of the isolation layer. In the resulting structure, top surfaces of the multi-layer stack 58 (e.g., dielectric layer 52E), the buffer layers 88, the ferroelectric layer 90, the channel layer 92, and the isolation pillars 102 may be substantially level (e.g., within process variations). In some embodiments, materials of the dielectric materials 98A/98B and isolation pillars 102 may be selected so that they may be etched selectively relative each other. For example, in some embodiments, the dielectric materials 98A/98B include oxide and the isolation pillars 102 include nitride. In some embodiments, the dielectric materials 98A/98B include nitride and the isolation pillars 102 include oxide. Other materials are also possible.

In FIGS. 28A and 28B, trenches 104 are defined for the subsequently formed the conductive pillars 106 and 108. The trenches 104 are formed by patterning the dielectric materials 98A/98B with a combination of photolithography and etching, for example. In some embodiments, as shown in FIG. 28A, a photoresist 118 is formed over the multi-layer stack 58, the dielectric materials 98A/98B, the isolation pillars 102, the channel layer 92, and the ferroelectric layer 90. In some embodiments, the photoresist 118 is patterned by an acceptable photolithography technique to define openings 120. Each of the openings 120 may expose the corresponding isolation pillar 102 and two separate regions of the dielectric materials 98A/98B beside the isolation pillar 102. In this way, each of the openings 120 may define a pattern of a conductive pillar 106 and an adjacent conductive pillar 108 that are separated by the isolation pillars 102.

Subsequently, portions of the dielectric materials 98A/98B exposed by the openings 120 may be removed by an acceptable etching process, such as by a dry etch (e.g., RIE, NBE, the like), a wet etch, the like, or a combination thereof. The etching may be anisotropic. The etching process may use an etchant that etches the dielectric materials 98A/98B without significantly etching the isolation pillars 102. As a result, even though the openings 120 expose the isolation pillars 102, the isolation pillars 102 may not be significantly removed. Patterns of the trenches 104 may correspond to the conductive pillars 106 and 108 (see FIGS. 29A and 29B). After the trenches 104 are patterned, the photoresist 118 may be removed by ashing, for example.

In FIGS. 29A and 29B, the trenches 104 are filled with a conductive material to form the conductive pillars 106 and 108. The conductive material may include copper, titanium, titanium nitride, tantalum, tantalum nitride, tungsten, ruthenium, aluminum, combinations thereof, or the like, which may be formed using, for example, CVD, ALD, PVD, PECVD, or the like. After the conductive material is deposited, a planarization (e.g., a CMP, etch back, or the like) may be performed to remove excess portions of the conductive material, thereby forming the conductive pillars 106 and 108. In the resulting structure, top surfaces of the multi-layer stack 58 (e.g., the dielectric layer 52E), the buffer layers 88, the ferroelectric layer 90, the channel layer 92, the conductive pillars 106, and the conductive pillars 108 may be substantially level (e.g., within process variations). In some embodiments, the conductive pillars 106 correspond to and are electrically connected to the bit lines in the memory array, and the conductive pillars 108 correspond to correspond to and are electrically connected to the source lines in the memory array 200.

Thus, stacked memory cells 202 may be formed in the memory array 200, as shown in FIG. 29A. Each memory cell 202 includes a gate electrode (e.g., a portion of a corresponding conductive line 72), a gate dielectric (e.g., a portion of a corresponding ferroelectric layer 90), a channel region (e.g., a portion of a corresponding channel layer 92), and source/drain pillars (e.g., portions of corresponding conductive pillars 106 and 108). The isolation pillars 102 isolates adjacent memory cells 202 in a same column and at a same vertical level. The memory cells 202 may be disposed in an array of vertically stacked rows and columns.

Figure 30A:
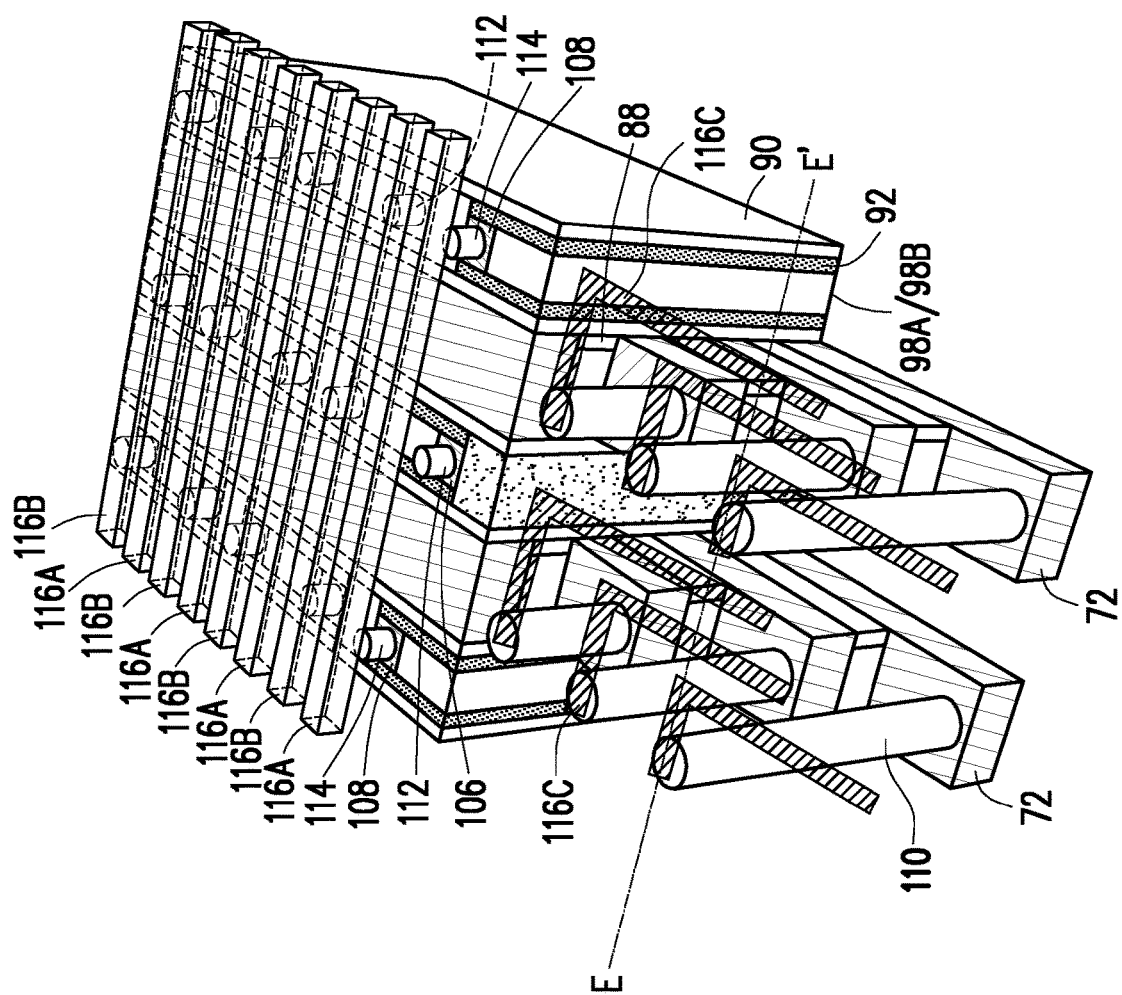
Figure 30B:
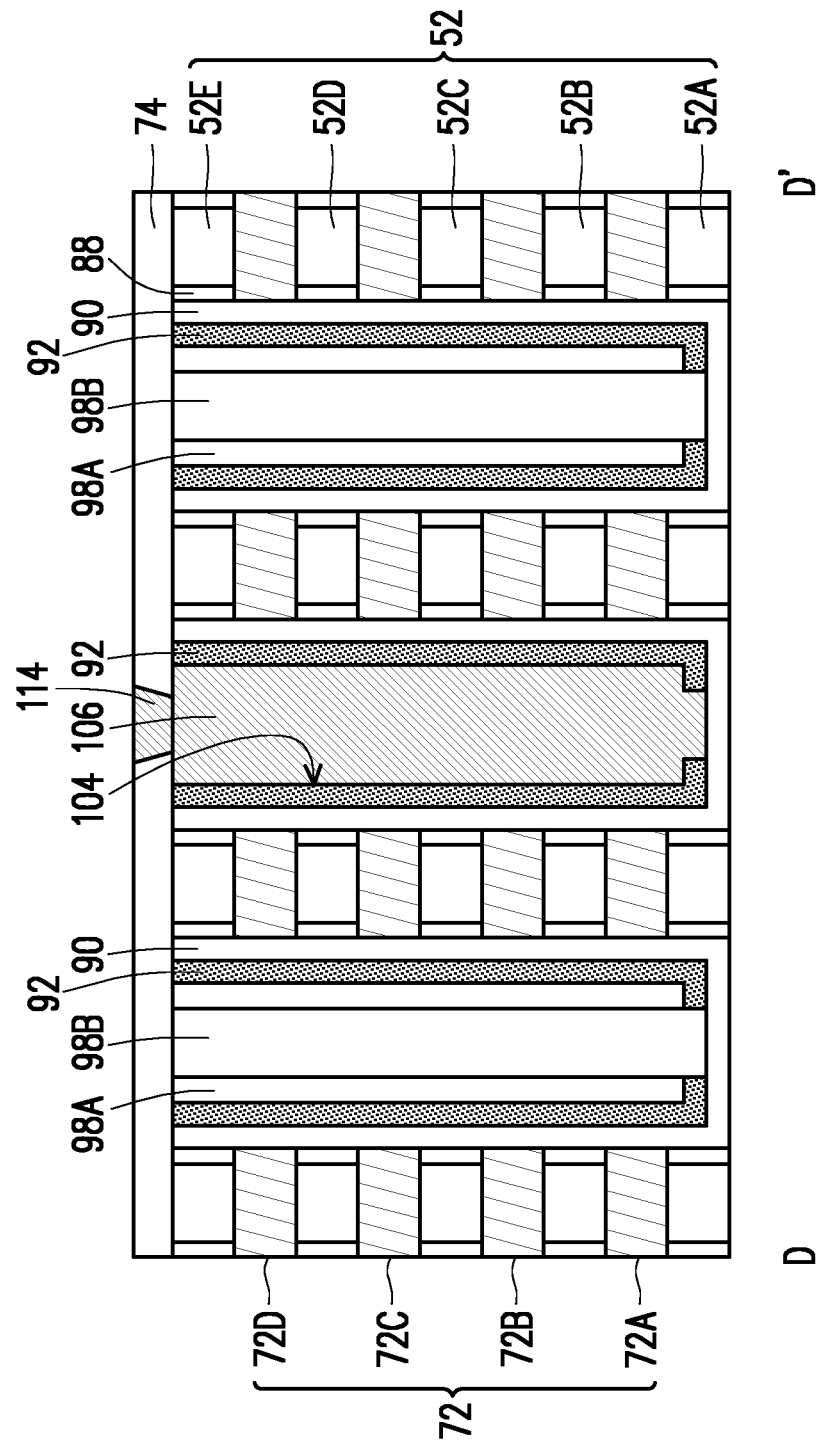
Figure 30C:
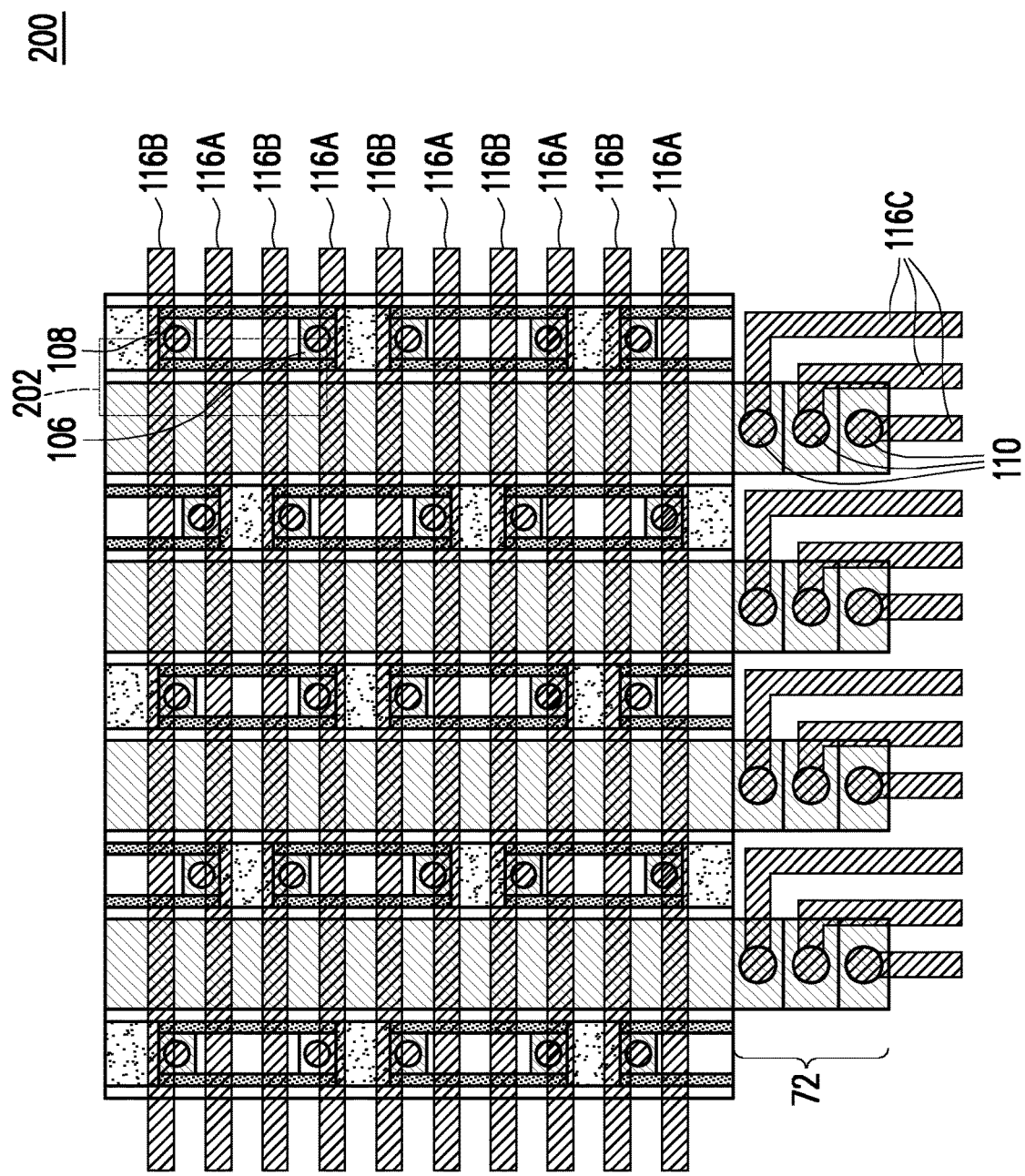
Figure 30D:
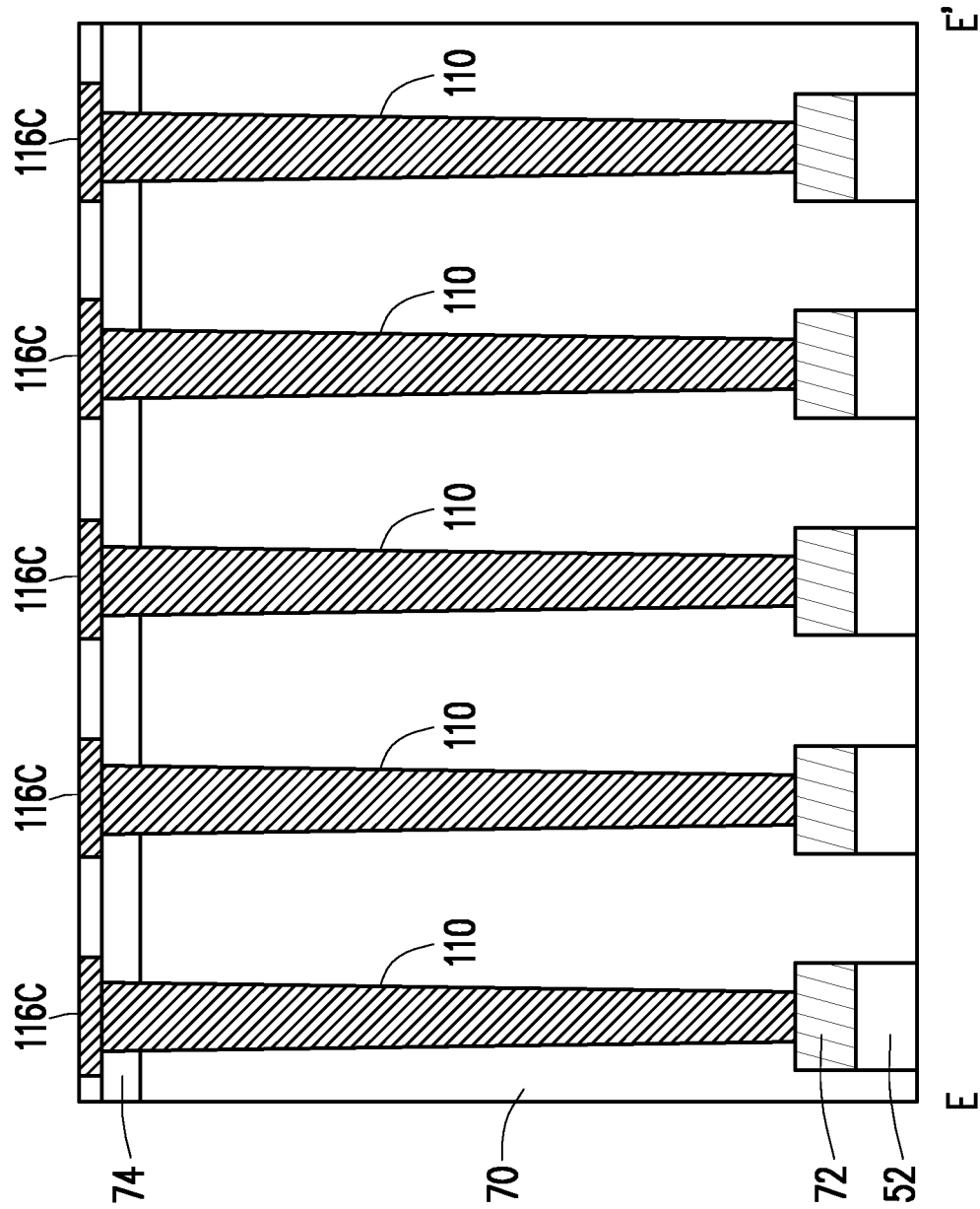
Figure 30E:
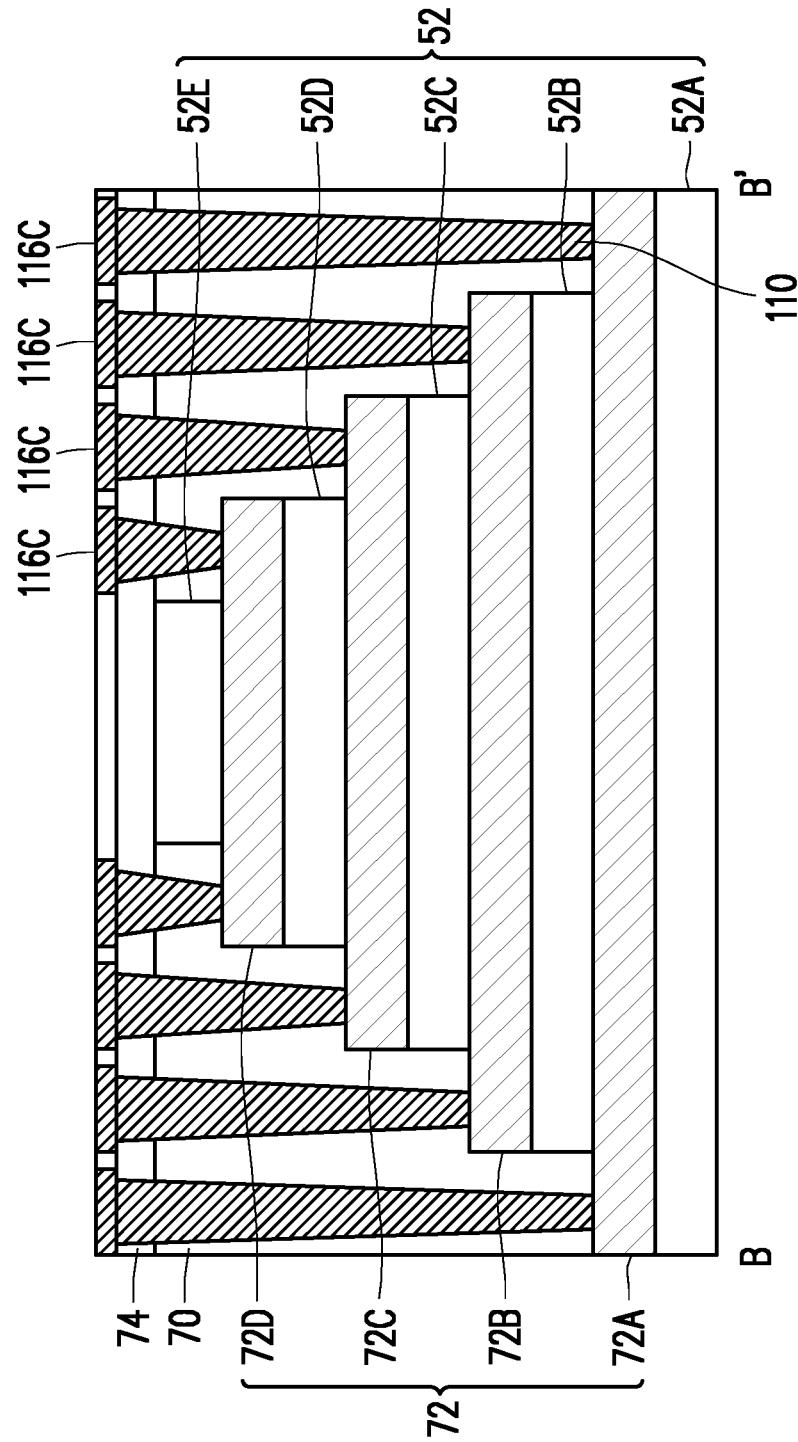

In FIGS. 30A, 30B, 30C, 30D and 30E, an IMD layer 74 is formed on top surfaces of the multi-layer stack 58 (e.g., the dielectric layer 52E), the buffer layers 88, the ferroelectric layer 90, the channel layer 92, the conductive pillars 106, and the conductive pillars 108 and the IMD 70. Conductive contacts 110, 112, and 114 are made on the conductive lines 72, the conductive pillars 106, and the conductive pillars 108, respectively. FIG. 30A illustrates a perspective view of the memory array 200; FIG. 30B illustrates a cross-sectional view of the device along line D-D' of FIG. 1A; FIG. 30C illustrates a top-down view of the memory array 200; and FIG. 30D illustrates a cross-sectional view along the line E-E' of FIG. 30A; and FIG. 30E illustrates a cross-sectional view of the device along line B-B' of FIG. 1A.

The IMD 74 may be formed of a dielectric material, and may be deposited by any suitable method, such as CVD, PECVD, flowable CVD (FCVD), or the like. The dielectric materials may include phospho-silicate glass (PSG), boro-silicate glass (BSG), boron-doped phospho-silicate glass (BPSG), undoped silicate glass (USG), or the like. In some embodiments, the IMD 74 may include an oxide (e.g., silicon oxide or the like), a nitride (e.g., silicon nitride or the like), a combination thereof or the like. Other dielectric materials formed by any acceptable process may be used. Thereafter, a removal process is applied to the IMD 74 to remove excess dielectric material over the multi-layer stack 58. In some embodiments, the removal process may be a planarization process, such as a chemical mechanical polish (CMP), an etch-back process, combinations thereof, or the like.

In some embodiments, the staircase shape of the conductive lines 72 may provide a surface on each of the conductive lines 72 for the conductive contacts 110 to land on. In some embodiments, forming the contacts 110 may include patterning openings in the IMD 74 and IMD 70 to expose portions of the conductive lines 72 using a combination of photolithography and etching, for example. A liner (not shown), such as a diffusion barrier layer, an adhesion layer, or the like, and a conductive material are formed in the openings. The liner may include titanium, titanium nitride, tantalum, tantalum nitride, or the like. The conductive material may include copper, a copper alloy, silver, gold, tungsten, cobalt, aluminum, nickel, or the like. A planarization process, such as a CMP, may be performed to remove excess material from the surface of the IMD 74. The remaining liner and conductive material form the contacts 110 in the openings.

As also illustrated by the perspective view of FIG. 30A, conductive contacts 112 and 114 may also be made on the conductive pillars 106 and the conductive pillars 108, respectively. The conductive contacts 112, 114 and 110 may be electrically connected to conductive lines 116A, 116B, and 116C, respectively, which connect the memory array to an underlying/overlying circuitry (e.g., control circuitry) and/or signal, power, and ground lines in the semiconductor die. For example, as shown in FIG. 30D, the conductive contacts 110 may extend through the IMD 74 and IMD 70 to electrically connect conductive lines 116C to the conductive lines 72 and the underlying active devices one the substrate. Other conductive contacts or vias may be formed through the IMD 74 to electrically connect the conductive lines 116A and 116B to the underlying active devices one the substrate. In alternate embodiments, routing and/or power lines to and from the memory array may be provided by an interconnect structure formed over the memory array 200 in addition to or in lieu of the interconnect structure 320. Accordingly, the memory array 200 may be completed.

Although the embodiments of FIGS. 1 through 29B illustrate a particular pattern for the conductive pillars 106 and 108, other configurations are also possible. For example, in these embodiments, the conductive pillars 106 and 108 have a staggered pattern. However, in other embodiments, the conductive pillars 106 and 108 in a same row of the array are all aligned with each other, as shown in the ferroelectric memory 200A of FIG. 32.

Figure 31:
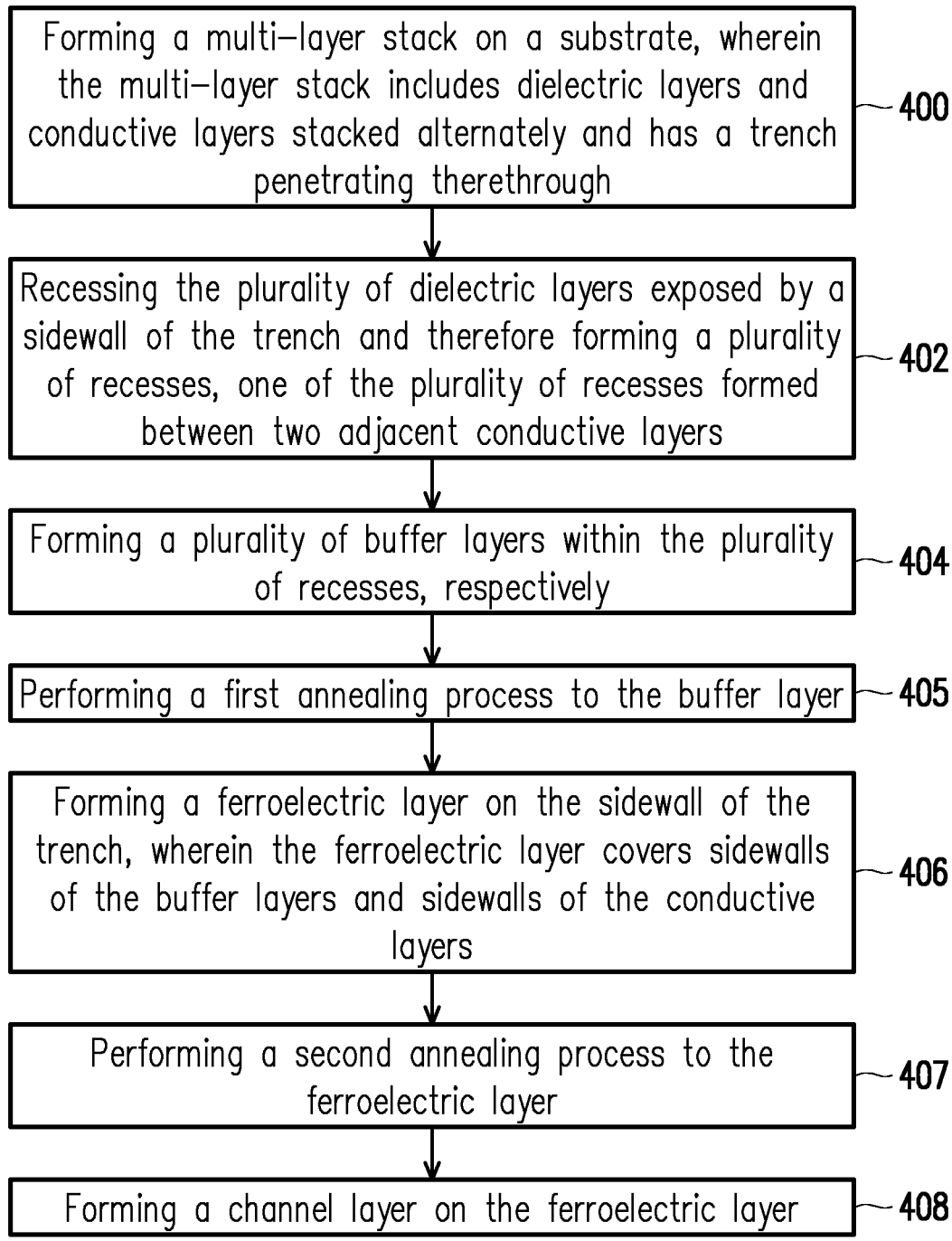
FIG. 31 illustrates a method of forming a ferroelectric memory device in accordance with some embodiments.

FIG. 31 illustrates a method of forming a ferroelectric memory device in accordance with some embodiments. Although the method is illustrated and/or described as a series of acts or events, it will be appreciated that the method is not limited to the illustrated ordering or acts. Thus, in some embodiments, the acts may be carried out in different orders than illustrated, and/or may be carried out concurrently. Further, in some embodiments, the illustrated acts or events may be subdivided into multiple acts or events, which may be carried out at separate times or concurrently with other acts or sub-acts. In some embodiments, some illustrated acts or events may be omitted, and other un-illustrated acts or events may be included.

At act 400, a multi-layer stack is formed on a substrate. The multi-layer stack includes a plurality of dielectric layers and a plurality of conductive layers stacked alternately and has a trench penetrating therethrough. FIG. 13 to FIG. 16B illustrate varying views corresponding to some embodiments of act 400.

At act 402, the plurality of dielectric layers exposed by a sidewall of the trench are recessed and a plurality of recesses are therefore formed, and one of the plurality of recesses is formed between two adjacent conductive layers. In some embodiments, recessing the dielectric layers includes performing an etching process, such as a lateral etching process. FIG. 13 to FIG. 17B illustrate varying views corresponding to some embodiments of act 402.

At act 404, a plurality of buffer layers are formed within the plurality of recesses, respectively. In some embodiments, the method of forming the buffer layer includes forming a buffer material conformally and continuously on a sidewall of the multi-layer stack, and the buffer material fills in the recesses. Thereafter, an etching back process is performed to the buffer material to remove portions of the buffer material on sidewalls of the conductive layers of the multi-layer stack. FIG. 19A to FIG. 19B illustrate varying views corresponding to some embodiments of act 404.

At act 405, a first annealing process is performed to the buffer layer. In some embodiments, the temperature range of the first annealing process ranges from about 300° C. to about 450° C., so as to achieve a desired crystalline lattice structure for the buffer layer. Such temperature range are appropriate for the BEOL process. FIG. 19B illustrates a cross-sectional view corresponding to some embodiments of act 405.

At act 406, a ferroelectric layer is formed on the sidewall of the trench, wherein the ferroelectric layer covers sidewalls of the buffer layers and sidewalls of the conductive layers. FIG. 20A to FIG. 20B illustrate varying views corresponding to some embodiments of act 406.

At act 407, a second annealing process is performed to the ferroelectric layer. In some embodiments, the temperature range of the second annealing process ranges from about 300° C. to about 450° C., so as to achieve a desired crystalline lattice structure for the buffer layer. Such temperature range are appropriate for the BEOL process. FIG. 20B illustrates a cross-sectional view corresponding to some embodiments of act 407. In some embodiments, the temperature range of the second annealing process is the same as the temperature range of the first annealing process. In other embodiments, the temperature range of the second annealing process is different from (e.g., higher than or lower than) the temperature range of the first annealing process.

At act 408, a channel layer is formed on the ferroelectric layer. FIG. 21A to FIG. 23 illustrate varying views corresponding to some embodiments of act 408.

Figure 33:
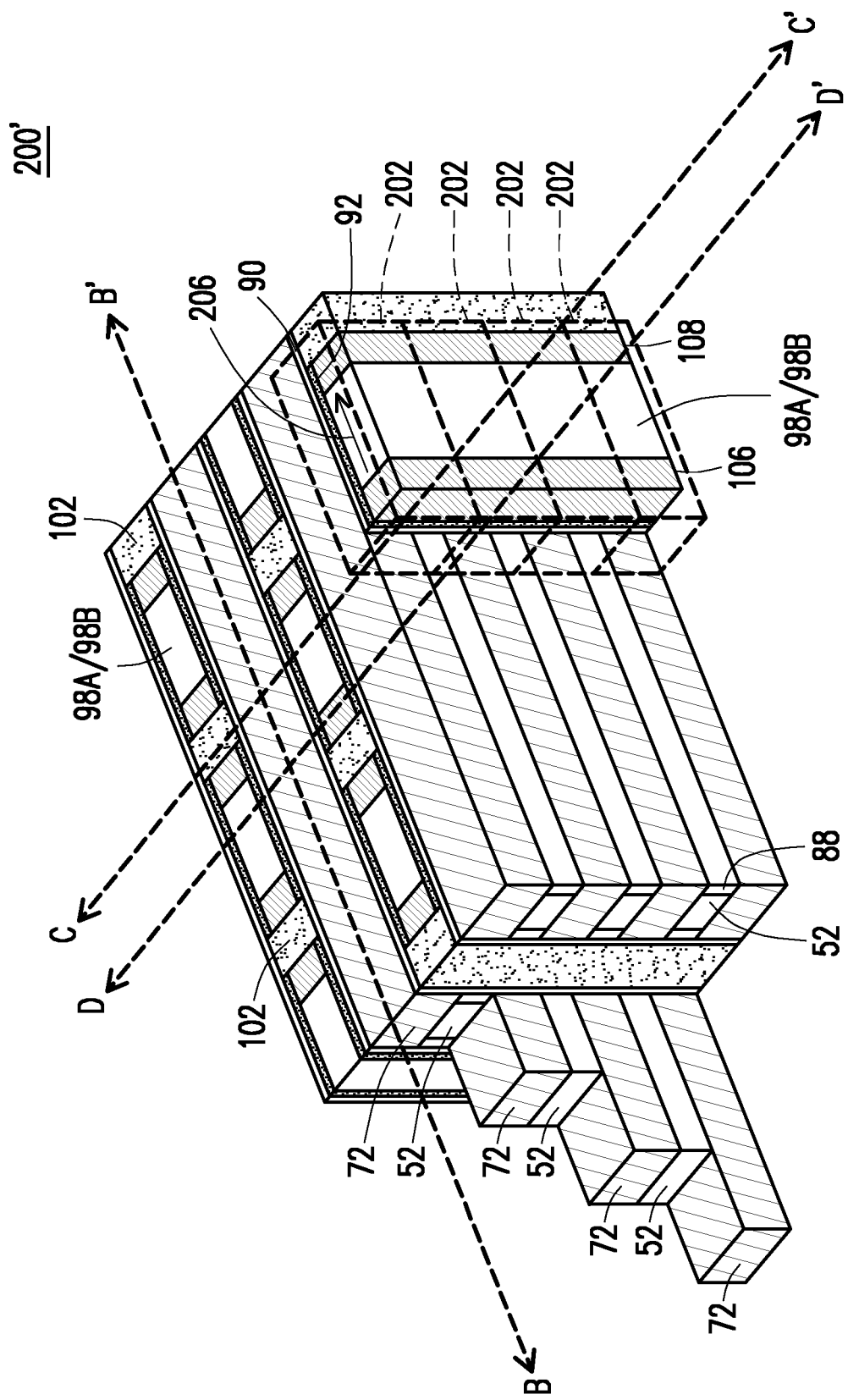
FIG. 33 illustrates a simplified perspective view of a ferroelectric memory device in accordance with some embodiments.

FIG. 33 illustrates a simplified perspective view of a ferroelectric memory device in accordance with some embodiments. The ferroelectric memory device 200' is similar to the ferroelectric memory device 200 of FIG. 1A, but the buffer layers 88 are removed from the staircase-shaped region. Specifically, when the memory cells 202 are defined during the processes of FIG. 16A to FIG. 29A, the staircase structure maintains a bulk staircase structure rather than strip-shaped multiple staircase structures described above. Specifically, two bulk staircase structures are disposed at two sides of the memory cell region. After the memory cells 202 are defined, the two bulk staircase structures are divided into multiple strip-shaped staircase structures at two sides of the memory cell region.

The structures of the ferroelectric memory devices of the disclosure are described below with reference to FIG. 1A to FIG. 33.

In some embodiments, a ferroelectric memory device 200/200A/200' includes a multi-layer stack 58, a channel layer 92, a ferroelectric layer 90 and buffer layers 88. The multi-layer stack 58 is disposed over a substrate 50 and includes a plurality of conductive layers (e.g., conductive lines 72) and a plurality of dielectric layers 52 stacked alternately. The channel layer 92 penetrates through the plurality of conductive layers (e.g., conductive lines 72) and the plurality of dielectric layers 52. The ferroelectric layer 90 is disposed between the channel layer 92 and each of the plurality of conductive layers (e.g., conductive lines 72) and the plurality of dielectric layers 52. The buffer layers 88 include a metal oxide and one buffer layer 88 is disposed between the ferroelectric layer 90 and each of the plurality of dielectric layers 52. Each of the buffer layers 88 may be a single layer or have a multi-layer structure.

In some embodiments, as shown in FIG. 20B, ends of the insulating layers 52 are recessed from ends of the conductive layers (e.g., conductive lines 72). In some embodiments, the sidewalls of the buffer layers 88 are substantially flush with the sidewalls of the conductive layers (e.g., conductive lines 72). In some embodiments, the sidewalls of the buffer layers 88 are concave or convex with respect to the sidewalls of the conductive layers (e.g., conductive lines 72).

In some embodiments, the buffer layers 88 include $La_2O_3$, $Al_2O_3$, MgO or a combination thereof. In some embodiments, the ferroelectric layer 90 includes HfZrO, HfAlO, HfLaO, HfCeO, HfO, HfGdO, HfSiO or a combination thereof. In some embodiments, the buffer layers 88 include a material the same as that of the ferroelectric layer 90. In alternative embodiments, the buffer layers 88 include a material different from that of the ferroelectric layer 90.

In some embodiments, the buffer layers 88 have a thickness of about 1-5 nm, such as 2-3 nm. In some embodiments, the ferroelectric layer 90 has a thickness of about 1-20, such as about 5-20 nm.

In some embodiments, a ferroelectric memory device 200/200A/200' includes a multi-layer stack 58, a plurality of isolation structures (e.g., dielectric materials 98A/98B), a channel layer 92 and a ferroelectric layer 90. The multi-layer stack 58 is disposed on a substrate 50 and including a plurality of gate electrode layers (e.g., conductive lines 72)

and a plurality of dielectric layers 52 stacked alternately. The isolation structures (e.g., dielectric materials 98A/98B) are disposed on the substrate 50 and penetrate through the multi-layer stack 58. The channel layer 92 is disposed between the multi-layer stack 58 and each of the isolation structures (e.g., dielectric materials 98A/98B). The ferroelectric layer 90 is disposed between the channel layer 92 and the multi-layer stack 58, wherein the ferroelectric layer 90 is in contact with each of the gate electrode layers (e.g., conductive lines 72) but separated from each of the dielectric layers 52.

In some embodiments, the ferroelectric memory device 200/200A/200' further includes a buffer layer 88 between the ferroelectric layer 90 and each of the dielectric layers 52. In some embodiments, the buffer layer 88 includes a first metal oxide material, the ferroelectric layer 90 includes a second metal oxide material, and the channel layer 92 includes an oxide semiconductor material.

In some embodiments, the ferroelectric memory device 200/200A/200' further includes a plurality of conductive pillars 106 and 108 disposed on the substrate 50 and penetrating through the multi-layer stack 58. In some embodiments, each of the plurality of isolation structures (e.g., dielectric materials 98A/98B) has two conductive pillars 106 and 108 disposed at two ends thereof.

Figure 32:
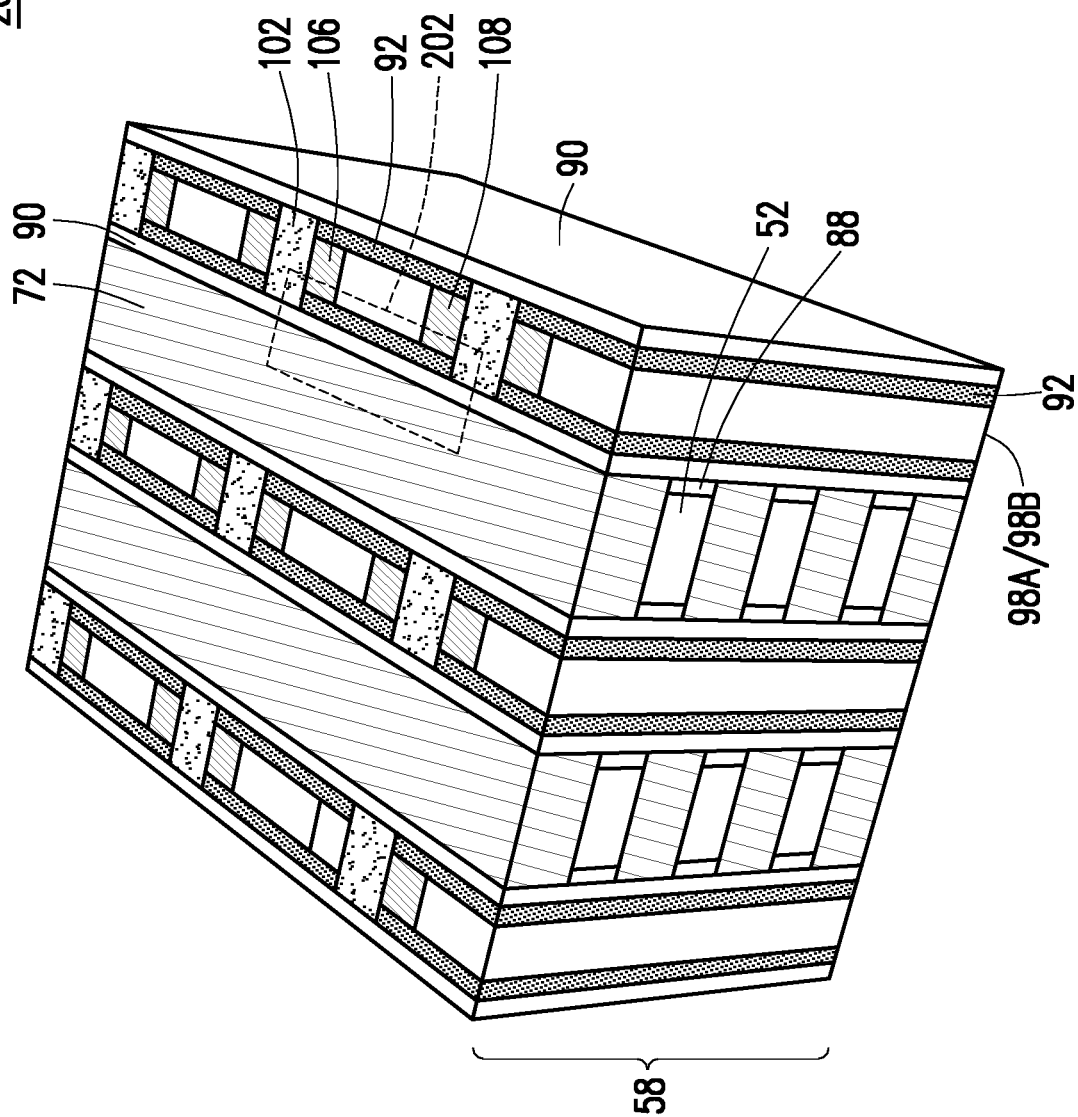
FIG. 32 illustrates a simplified perspective view of a ferroelectric memory device in accordance with some embodiments.

In some embodiments, the isolation structures (e.g., dielectric materials 98A/98B) are in a staggered arrangement. Specifically, the isolation structures of adjacent columns are arranged in a staggered manner, as shown in FIG. 29A. However, the disclosure is not limited thereto. In some embodiments, the isolation structures (e.g., dielectric materials 98A/98B) of adjacent columns are arranged in a regular array and aligned to each other, as shown in FIG. 32. Each of the isolation structures (e.g., dielectric materials 98A/98B) is disposed between two memory devices.

In some embodiments of the disclosure, a metal oxide buffer layer is disposed between the ferroelectric layer and each of the dielectric layers. Metal oxide partially replaces silicon oxide and mimics metal surface. The contacting surfaces of the metal oxide buffer layers and the metal layers to the ferroelectric layer provide similar properties and crystalline degrees, so the ferroelectric layer can be grown more uniformly, and the device performance is accordingly improved.

In the above embodiments, the ferroelectric memory device is formed by a "staircase first process" in which the staircase structure is formed before the memory cells are formed. However, the disclosure is not limited thereto. In other embodiments, the ferroelectric memory device may be formed by a "staircase last process" in which the staircase structure is formed after the memory cells are formed.

In the above embodiments, the gate electrodes (e.g., word lines) are formed by depositing sacrificial dielectric layers followed by replacing sacrificial dielectric layers with conductive layers. However, the disclosure is not limited thereto. In other embodiments, the gate electrodes (e.g., word lines) may be formed in the first stage without the replacement step as needed.

Many variations of the above examples are contemplated by the present disclosure. It is understood that different embodiments may have different advantages, and that no particular advantage is necessarily required of all embodiments.

In accordance with some embodiments of the present disclosure, a device includes a multi-layer stack, a channel layer, a ferroelectric layer and buffer layers. The multi-layer stack is disposed on a substrate and includes a plurality of conductive layers and a plurality of dielectric layers stacked alternately. The channel layer penetrates through the plurality of conductive layers and the plurality of dielectric layers. The ferroelectric layer is disposed between the channel layer and each of the plurality of conductive layers and the plurality of dielectric layers. The buffer layers include a metal oxide, and one of the buffer layers is disposed between the ferroelectric layer and each of the plurality of dielectric layers.

In accordance with alternative embodiments of the present disclosure, a device includes a multi-layer stack, a plurality of isolation structures, a channel layer and a ferroelectric layer. The multi-layer stack is disposed on a substrate and including a plurality of gate electrode layers and a plurality of dielectric layers stacked alternately. The isolation structures are disposed on the substrate and penetrate through the multi-layer stack. The channel layer, disposed between the multi-layer stack and each of the isolation structures. The ferroelectric layer, disposed between the channel layer and the multi-layer stack, wherein the ferroelectric layer is in contact with each of the gate electrode layers but separated from each of the dielectric layers of the multi-layer stack.

In accordance with yet alternative embodiments of the present disclosure, a method of forming a device includes following operations. A multi-layer stack is formed on a substrate. The multi-layer stack includes a plurality of dielectric layers and a plurality of conductive layers stacked alternately and has a trench penetrating therethrough. The dielectric layers exposed by a sidewall of the trench are recessed, so that a recess is formed between the two adjacent conductive layers. A buffer layer is formed within each of the recesses. A ferroelectric layer is formed on the sidewall of the trench, wherein the ferroelectric layer covers sidewalls of the buffer layers and sidewalls of the conductive layers. A channel layer is formed on the ferroelectric layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming a device, comprising:
    forming a multi-layer stack on a substrate, wherein the multi-layer stack comprises dielectric layers and conductive layers stacked alternately and has a trench penetrating therethrough;
    recessing the dielectric layers exposed by a sidewall of the trench and therefore forming recesses, one of the recesses formed between two adjacent conductive layers;
    forming buffer layers within the recesses, respectively, wherein the buffer layers are in physical contact with the dielectric layers, respectively;
    forming a ferroelectric layer on the sidewall of the trench, wherein the ferroelectric layer covers sidewalls of the buffer layers and sidewalls of the conductive layers; and
    forming a channel layer on the ferroelectric layer.

2. The method of claim 1, further comprising, after forming the buffer layers and before forming the ferroelectric layer, performing an annealing process to the buffer layers.

3. The method of claim 2, wherein a temperature range of the annealing process ranges from about 300° C. to about 450° C.

4. The method of claim 1, wherein recessing the dielectric layers comprises performing an etching process.

5. The method of claim 1, wherein forming the buffer layers comprises:
forming a buffer material conformally and continuously on a sidewall of the multi-layer stack, wherein the buffer material fills in the recesses; and
performing an etching back process to the buffer material.

6. The method of claim 5, wherein after the etching back process, a sidewall of each buffer layer is flushed with a sidewall of the adjacent conductive layer.

7. The method of claim 5, wherein after the etching back process, a sidewall of each buffer layer is recessed from a sidewall of the adjacent conductive layer by a non-zero distance.

8. The method of claim 1, wherein the buffer layers comprise metal oxide.

9. A method of forming a device, comprising:
providing a multi-layer stack on a substrate, wherein the multi-layer stack comprises dielectric layers and conductive layers stacked alternately;
trimming the dielectric layers until sidewalls of the conductive layers are protruded from sidewalls of the trimmed dielectric layers;
forming buffer layers on the sidewalls of the trimmed dielectric layers, wherein the buffer layers are in physical contact with the dielectric layers, respectively;
forming a ferroelectric layer on sidewalls of the buffer layers and the sidewalls of the conductive layers; and
forming a channel layer on the ferroelectric layer.

10. The method of claim 9, wherein trimming the dielectric layers comprises performing a lateral etching process.

11. The method of claim 9, wherein forming the buffer layers comprises:
forming a continuous buffer material on the sidewalls of the trimmed dielectric layers and the sidewalls of the conductive layers; and
performing an etching process to the continuous buffer material, so as to divide the continuous buffer material into the buffer layers respectively on the sidewalls of the trimmed dielectric layers.

12. The method of claim 11, wherein the continuous buffer material is in an amorphous state.

13. The method of claim 12, further comprising performing an annealing process to transform the continuous buffer material into a crystalline state.

14. The method of claim 11, wherein the continuous buffer material is in a crystalline state.

15. The method of claim 9, wherein a bottom of the ferroelectric layer is flushed with a bottom of the lowermost buffer layer.

16. The method of claim 9, wherein the ferroelectric layer has substantially smooth sidewall profile.

17. The method of claim 9, wherein the ferroelectric layer has an uneven and wavy sidewall profile.

18. A method of forming a device, comprising:
providing a substrate having a cell region and a staircase region;
forming a first multi-layer stack on the substrate in the cell region and forming a second multi-layer stack on the substrate in the staircase region, wherein each of the first multi-layer stack and the second multi-layer stack comprises dielectric layers and conductive layers stacked alternately;
trimming the dielectric layers of the first multi-layer stack in the cell region without trimming the dielectric layers of the second multi-layer stack in the staircase region;
forming buffer layers on the sidewalls of the trimmed dielectric layers of the first multi-layer stack in the cell region;
forming a ferroelectric layer on sidewalls of the buffer layers and the sidewalls of the conductive layers in the cell region; and
forming a channel layer on the ferroelectric layer in the cell region.

19. The method of claim 18, further comprising patterning the second multi-layer stack in the staircase region, such that ends of the conductive layers and ends of the insulating layers of the second multi-layer stack are arranged in a staircase configuration.

20. The method of claim 18, wherein each of the buffer layers and the ferroelectric layer comprises metal oxide.

* * * * *